(12) United States Patent
Tanaka et al.

(10) Patent No.: US 10,879,327 B2
(45) Date of Patent: Dec. 29, 2020

(54) ORGANIC EL DISPLAY PANEL AND METHOD OF MANUFACTURING THE SAME, ORGANIC EL DISPLAY DEVICE AND ELECTRONIC APPARATUS

(71) Applicant: JOLED INC., Tokyo (JP)

(72) Inventors: Yasuhiro Tanaka, Tokyo (JP); Noriteru Maeda, Tokyo (JP); Kenichi Nendai, Tokyo (JP); Masayuki Kubota, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/506,352

(22) Filed: Jul. 9, 2019

(65) Prior Publication Data
US 2020/0013839 A1    Jan. 9, 2020

(30) Foreign Application Priority Data

Jul. 9, 2018    (JP) .................................. 2018-130220
Mar. 1, 2019    (JP) .................................. 2019-037763

(51) Int. Cl.
   *H01L 27/32*      (2006.01)
   *H01L 51/56*      (2006.01)

(52) U.S. Cl.
   CPC ...... *H01L 27/3248* (2013.01); *H01L 27/3276* (2013.01); *H01L 51/56* (2013.01)

(58) Field of Classification Search
CPC .. H01L 27/3248; H01L 27/3276; H01L 51/56
See application file for complete search history.

(56) References Cited

U.S. PATENT DOCUMENTS

| | | | |
|---|---|---|---|
| 6,868,075 B1 | 3/2005 | Narvinger et al. | |
| 8,203,158 B2* | 6/2012 | Yoshida | H01L 27/3211 257/89 |
| 2007/0042200 A1* | 2/2007 | Wityak | C03C 17/366 428/450 |
| 2008/0012472 A1 | 1/2008 | Uchida | |

(Continued)

FOREIGN PATENT DOCUMENTS

| | | |
|---|---|---|
| JP | 2007-207545 A | 8/2007 |
| JP | 2008-243773 A | 10/2008 |

(Continued)

*Primary Examiner* — Peniel M Gumedzoe
(74) *Attorney, Agent, or Firm* — Chip Law Group

(57) ABSTRACT

An organic EL display panel includes a substrate, an interlayer insulation layer formed over the substrate, and an organic EL light emitting section formed over the interlayer insulation layer. The organic EL light emitting section includes a plurality of pixel electrodes arranged in a matrix pattern, a plurality of partition walls each of which is disposed between the pixel electrodes adjacent to each other in a row direction and extends in a column direction, an organic layer including a light emitting layer formed in a region partitioned by the partition walls, and a counter electrode formed on an upper side of the organic layer, and includes a first light emitting section for a first color and a second light emitting section for a second color. The first and second light emitting sections are different in thickness of the organic layer and in digging amount of the interlayer insulation layer in the region partitioned by the partition walls.

7 Claims, 36 Drawing Sheets

(56) References Cited

U.S. PATENT DOCUMENTS

| | | | |
|---|---|---|---|
| 2008/0238295 | A1 | 10/2008 | Takei et al. |
| 2009/0026446 | A1* | 1/2009 | Lee .................... H01L 51/5209 |
| | | | 257/40 |
| 2011/0108880 | A1 | 5/2011 | Yanagihara |
| 2012/0001186 | A1 | 1/2012 | Kondoh et al. |
| 2013/0105781 | A1 | 5/2013 | Matsushima |
| 2016/0133676 | A1* | 5/2016 | Kim .................... H01L 27/3216 |
| | | | 257/40 |
| 2018/0061905 | A1* | 3/2018 | Choi .................... H01L 27/3246 |
| 2018/0254303 | A1 | 9/2018 | Mishima |

FOREIGN PATENT DOCUMENTS

| | | |
|---|---|---|
| JP | 2010-062111 A | 3/2010 |
| JP | 2011-010322 A | 1/2011 |
| JP | 2011-076804 A | 4/2011 |
| JP | 2011-103222 A | 5/2011 |
| JP | 2012-104430 A | 5/2012 |
| JP | 2013-206629 A | 10/2013 |
| JP | 2016-122614 | 7/2016 |
| JP | 2018-081736 | 5/2018 |
| JP | 2018-092168 | 6/2018 |
| JP | 2018-107143 | 7/2018 |
| JP | 2018-147599 A | 9/2018 |
| WO | 2012/004823 A1 | 1/2012 |
| WO | 2012/025954 A1 | 3/2012 |

\* cited by examiner

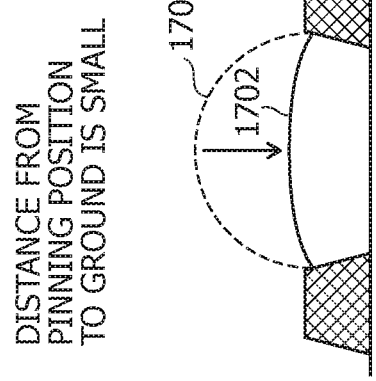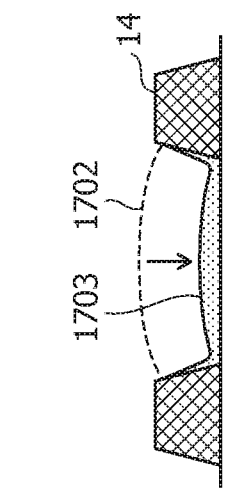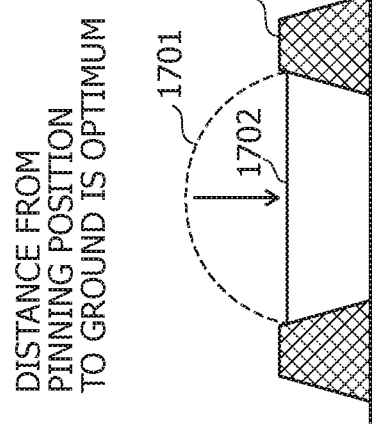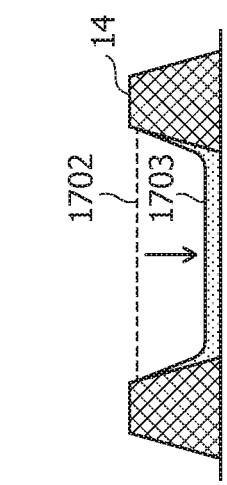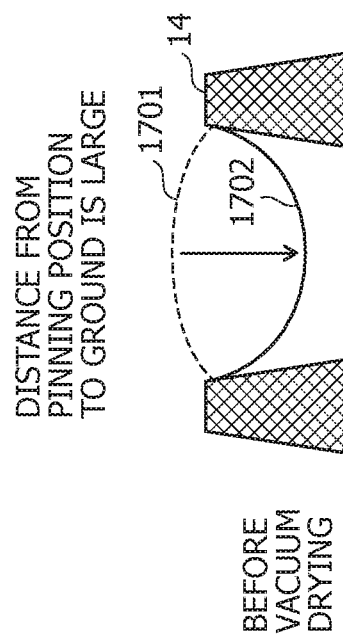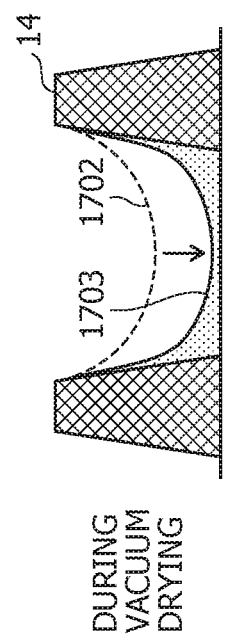

FIG. 13

AMOUNT OF INK REQUIRED WHEN SPECIFIC GRAVITY IS 1 [μm] ※LIQUID HEIGHT

| FILM THICKNESS [μm]<br>INK CONCENTRATION | 0.12 (R) | 0.08 (G) | 0.04 (B) | HEIGHT OF PARTITION WALL REQUIRED | △ MAX-MIN |
|---|---|---|---|---|---|
| 0.5% | 24.0 | 16.0 | 8.0 | 5.0 | 16.0 |
| 0.8% | 15.0 | 10.0 | 5.0 | 2.0 | 10.0 |
| 1.0% | 12.0 | 8.0 | 4.0 | 1.0 | 8.0 |
| 1.6% | 7.5 | 5.0 | 2.5 | - | 5.0 |
| 2.4% | 5.0 | 3.3 | 1.7 | - | 3.3 |
| 3.2% | 3.8 | 2.5 | 1.3 | - | 2.5 |
| 4.8% | 2.5 | 1.7 | 0.8 | - | 1.7 |
| 7.0% | 1.7 | 1.1 | 0.6 | - | 1.1 |
| 10.0% | 1.2 | 0.8 | 0.4 | - | 0.8 |

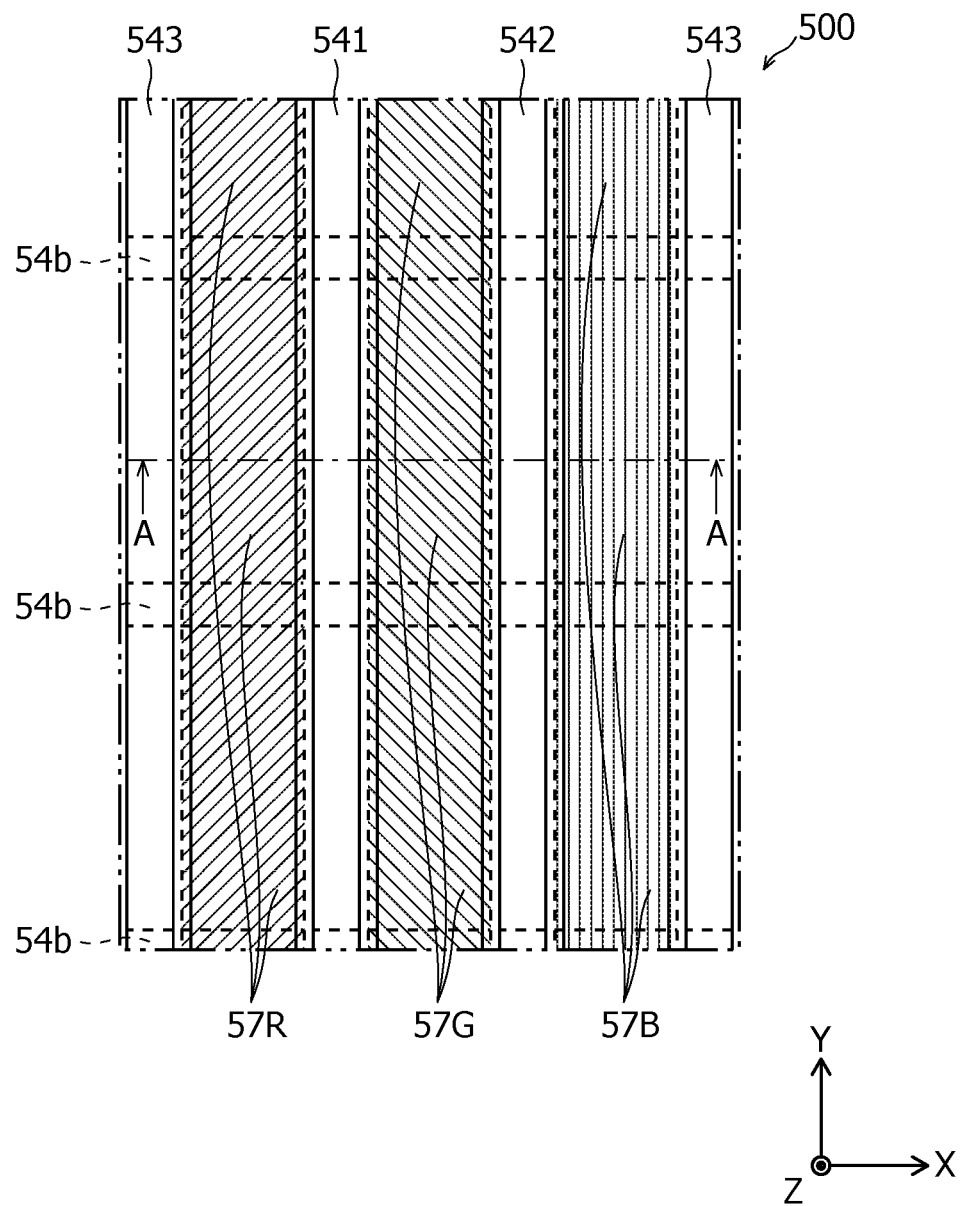

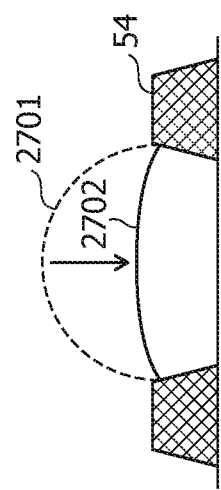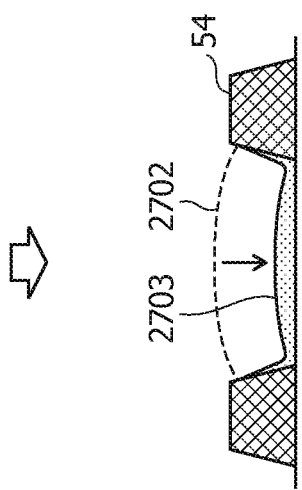
FIG. 30A    FIG. 30B    FIG. 30C
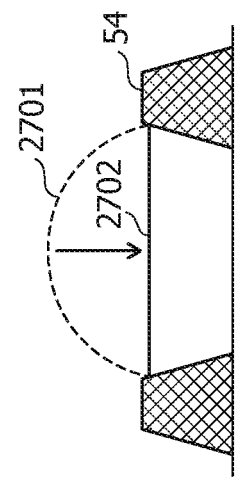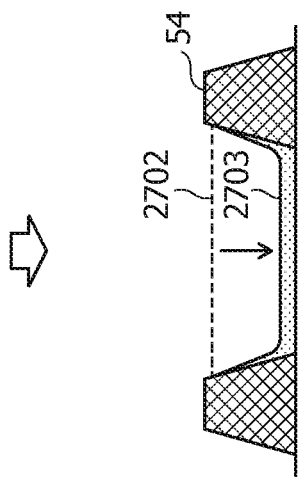
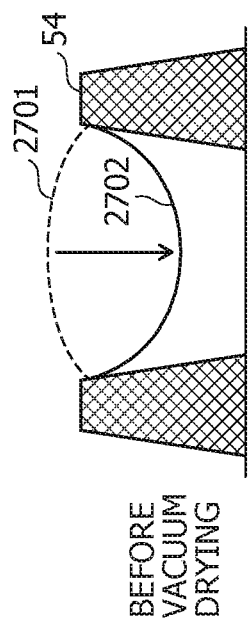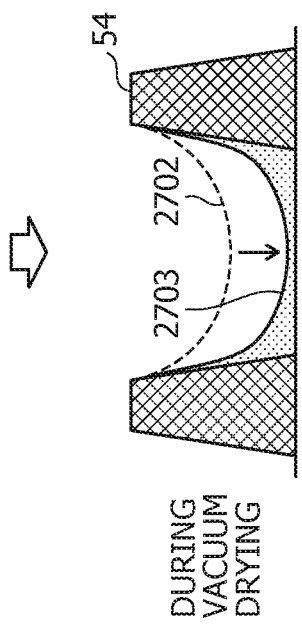

ORGANIC EL DISPLAY PANEL AND METHOD OF MANUFACTURING THE SAME, ORGANIC EL DISPLAY DEVICE AND ELECTRONIC APPARATUS

CROSS REFERENCE TO RELATED APPLICATIONS

This application claims priority to Japanese Patent Application No. 2019-037763 filed Mar. 1, 2019, and Japanese Patent Application No. 2018-130220 filed Jul. 9, 2018, the contents of which are hereby incorporated by reference in their entirety.

BACKGROUND

The present disclosure relates to a light emitting display panel having light emitting elements arranged and a method of manufacturing the same, particularly to an organic electroluminescent display panel (hereinafter referred to as "organic EL display panel") having organic electroluminescent elements (hereinafter referred to as "organic EL elements") arranged in a matrix pattern and a method of manufacturing the same, and an organic EL display device and an electronic apparatus in which the organic EL display panel is used as an image display section.

In recent years, as a light emission type display, an organic EL display panel in which a plurality of organic EL elements are arranged over a substrate along row and column directions has been put to practical use as a display for an electronic apparatus. Each of the organic EL elements is a current driving type light emitting element having a basic structure in which a light emitting layer including an organic light emitting material is disposed between a pair of electrodes consisting of an anode and a cathode. At the time of driving, a voltage is impressed between the pair of electrodes, whereby holes injected from the anode into the light emitting layer and electrons injected from the cathode into the light emitting layer are put to recombination, attended by generation of light.

This organic EL display panel is high in visibility, owing to self-light-emission of each organic EL element, and is excellent in shock resistance since it is a perfectly solid element.

In the organic EL display panel, in general, the light emitting layers are partitioned on an EL element basis by partition walls (banks) formed using an insulating material, and the light emitting layers are partitioned by the partition walls. In addition, organic layers such as a hole injection layer and a hole transport layer are interposed, as required, between the anode and the light emitting layer. Besides, an electron injection layer, an electron transport layer and the like are interposed, as required, between the cathode and the light emitting layer.

In an organic EL display panel for full-color display, such organic EL elements form sub-pixels for RGB colors, and the adjacent RGB sub-pixels are combined with one another to form a pixel.

In forming the light emitting layer and the charge injection layers for each organic EL element, a wet process is often used in which partition walls for partitioning the adjacent organic EL elements from one another are formed over a substrate, and droplets of solutions containing organic materials for forming the organic layers, light emitting layers or the like and a solvent (the solutions hereinafter referred to simply as "inks") are ejected from nozzles and applied to each of element forming regions partitioned by the partition walls (see, for example, PCT Patent Publication No. WO2012/004823).

According to this wet process, even in the case of a large-sized panel, the organic layers and light emitting layers can be formed comparatively easily, and material utilization efficiency is high, which is advantageous on a cost basis.

Meanwhile, the film thickness of an organic layer suitable for enhancing the light emission efficiency of each organic EL element depends on the wavelength of the light emission color.

Specifically, for red light and green light and blue light, the optimum optical path length (resonance condition) in the organic EL element is different, depending on the differences in wavelength of the color lights. Therefore, a fine adjustment of film thicknesses of the organic layers in accordance with the wavelengths of the light emission colors in the color sub-pixels is desirable for enhancing the light emission efficiency.

However, if organic layers differing in film thickness are formed by adjusting the dropping amounts of inks in the practical wet process, it would be difficult to make even or equivalent the film shapes of the organic layers between the different light emission colors of sub-pixels, due to the influences of the liquid repellency of the partition walls and the surface tension of the inks and the like, and display image quality might be rather worsened.

SUMMARY

An organic EL display panel according to one mode of the present disclosure is an organic EL display panel including a substrate, an interlayer insulation layer formed over the substrate, and an organic EL light emitting section formed over the interlayer insulation layer. The organic EL light emitting section includes a plurality of pixel electrodes arranged in a matrix pattern over the interlayer insulation layer, a plurality of partition walls each of which is disposed between the pixel electrodes adjacent to each other in a row direction and extends in a column direction, an organic layer including a light emitting layer formed in a region partitioned by the partition walls, and a counter electrode formed on an upper side of the organic layer. The organic EL light emitting section includes a first light emitting section having a light emitting layer that emits light in a first color and a second light emitting section having a light emitting layer that emits light in a second color different from the first color. The first light emitting section and the second light emitting section are different in thickness of the organic layer, and the first light emitting section and the second light emitting section are different in digging amount of the interlayer insulation layer in the region partitioned by the partition walls.

In addition, an organic EL display device according to another mode of the present disclosure includes the above-mentioned organic EL display panel, and a driving section that drives the organic EL display panel to display an image.

Besides, an electronic apparatus according to a further mode of the present disclosure includes the above-mentioned organic EL display device as an image display section.

Further, a method of manufacturing an organic EL display panel according to yet another mode of the present disclosure is a method of manufacturing an organic EL display panel, including preparing a substrate, forming an interlayer insulation layer over the substrate, and forming an organic EL light emitting section over the interlayer insulation layer.

The organic EL light emitting section includes a plurality of pixel electrodes arranged in a matrix pattern over the interlayer insulation layer, a plurality of partition walls each of which is disposed between the pixel electrodes adjacent to each other in a row direction and extends in a column direction, an organic layer including a light emitting layer formed in a region partitioned by the partition walls, and a counter electrode formed on an upper side of the organic layer, and includes a first light emitting section having a light emitting layer that emits light in a first color and a second light emitting section having a light emitting layer that emits light in a second color different from the first color. The first light emitting section and the second light emitting section are different in thickness of the organic layer, and, in the forming the interlayer insulation layer, dug portions differing in depth are formed in the interlayer insulation layer in those regions of the first light emitting section and the second light emitting section which are partitioned by the partition walls.

BRIEF DESCRIPTION OF THE DRAWINGS

These and other objects, advantages, and features of the technology pertaining to the present disclosure will become apparent from the following description thereof taken in conjunction with the accompanying drawings, which illustrate at least one embodiment of the technology pertaining to the present disclosure.

FIGS. 11A, 11B and 11C are diagrams schematically depicting the correlation between the distance from a pinning position to a ground and the film shape of a light emitting layer formed finally;

FIG. 13 is a table depicting the relation between ink concentration and the height of partition walls required in the case of forming light emitting layers for colors in the ink concentration;

FIG. 21 is a plan view schematically depicting the configuration of the organic EL display panel according to the first mode of Embodiment 2;

FIGS. 23A, 23B and 23C are partial sectional views schematically illustrating part of a manufacturing process of the organic EL display panel according to the first mode of Embodiment 2, in which FIG. 23A is a partial sectional view depicting a state in which an interlayer insulation material layer is formed over a TFT layer, FIG. 23B is a partial sectional view depicting a state in which the interlayer insulation material layer is subjected to exposure using a photomask, and FIG. 23C is a partial sectional view depicting a state in which an interlayer insulation layer is formed;

FIGS. 24A, 24B, 24C and 24D are partial sectional views schematically illustrating part of the manufacturing process of the organic EL display panel according to the first mode of Embodiment 2, in which FIG. 24A is a partial sectional view depicting a state in which a pixel electrode material layer is formed over an interlayer insulation layer, FIG. 24B is a partial sectional view depicting a state in which pixel electrodes are formed through patterning of the pixel electrode material layer, FIG. 24C is a partial sectional view depicting a state in which a partition wall material layer is formed over the pixel electrodes and the interlayer insulation layer, and FIG. 24D is a partial sectional view depicting a state in which the partition wall material layer is subjected to exposure using a photomask;

FIGS. 25A, 25B and 25C are partial sectional views schematically illustrating part of the manufacturing process of the organic display panel according to the first mode of Embodiment 2, in which FIG. 25A is a partial sectional view depicting a state in which partition walls are formed, FIG. 25B is a partial sectional view depicting a state in which a hole injection layer is formed in openings in the partition walls, and FIG. 25C is a partial sectional view depicting a state in which a hole transport layer is formed in the openings in the partition walls;

FIGS. 26A, 26B and 26C are partial sectional views schematically illustrating part of the manufacturing process of the organic EL display panel according to the first mode of Embodiment 2, in which FIG. 26A is a partial sectional view depicting a state in which light emitting layers are formed in openings in the partition walls, FIG. 26B is a partial sectional view depicting a state in which an electron transport layer is formed over the partition walls and over the light emitting layers, and FIG. 26C is a partial sectional view depicting a state in which an electron injection layer is formed over the electron transport layer;

FIGS. 27A and 27B are partial sectional views schematically illustrating part of the manufacturing process of the organic EL display panel according to the first mode of Embodiment 2, in which FIG. 27A is a partial sectional view depicting a state in which a counter electrode is formed over the electron injection layer, and FIG. 27B is a partial sectional view depicting a state in which a sealing layer is formed over the counter electrode;

FIGS. 30A, 30B and 30C are diagrams schematically depicting the correlation between the distance from a pinning position to a ground and film shape of a light emitting layer formed finally;

FIGS. 32A, 32B, 32C and 32D are partial sectional views schematically illustrating part of a manufacturing process of the organic EL display panel according to the second mode of Embodiment 2, in which FIG. 32A is a partial sectional view depicting a state in which a TFT layer is formed over a substrate, FIG. 32B is a partial sectional view depicting a state in which an interlayer insulation layer is formed over the TFT layer, FIG. 32C is a partial sectional view depicting a state in which a pixel electrode material layer is formed over the interlayer insulation layer, and FIG. 32D is a partial sectional view depicting a state in which pixel electrodes are formed through patterning of the pixel electrode material layer;

FIGS. 33A, 33B and 33C are partial sectional views schematically illustrating part of the manufacturing process of the organic EL display panel according to the second mode of Embodiment 2, in which FIG. 33A is a partial sectional view depicting a state in which a raising material layer is formed over the pixel electrodes and the interlayer insulation layer, FIG. 33B is a partial sectional view depicting a state in which the raising material layer is subjected to exposure using a photomask, and FIG. 33C is a partial sectional view depicting a state in which a raising layer is formed;

FIGS. 34A, 34B and 34C are partial sectional views schematically illustrating part of the manufacturing process of the organic EL display panel according to the second mode of Embodiment 2, in which FIG. 34A is a partial sectional view depicting a state in which a partition wall material layer is formed over the pixel electrodes, the raising layer and the interlayer insulation layer, FIG. 34B is a partial sectional view depicting a state in which the partition wall material layer is subjected to exposure using a photomask, and FIG. 34C is a partial sectional view depicting a state in which partition walls are formed;

DETAILED DESCRIPTION OF THE PREFERRED EMBODIMENTS

Embodiment 1

How Embodiment 1 of the Present Disclosure has been Reached

In related-art, organic light emitting layers of organic EL display panels have often been formed by a dry process such as vacuum deposition. Attendant on the progress of coating technology (application technology), particularly printing devices, however, a technology for forming the organic light emitting layers by a wet process has been spreading in recent years.

The wet process is a process in which inks each containing an organic light emitting material dissolved in an organic solvent are printed on required parts by a printing device or the like and are dried to form the organic light emitting layers. Thus, the wet process can suppress equipment cost even in the case for manufacturing a large-sized organic EL display panel, and is advantageous on a cost basis, such as being high in stock utilization.

However, in the wet process, in order to make different the film thicknesses of organic light emitting layers of organic EL elements for different light emission colors for the purpose of building up an optical resonant structure, it may be necessary to control the dropping amount of each ink for each light emission color.

As a result, there arises a problem that the profile of a surface of the organic light emitting layer after drying (hereinafter referred to as "film shape") is difficult to make even between the layers of different film thicknesses for different light emission colors.

Figure 18A:
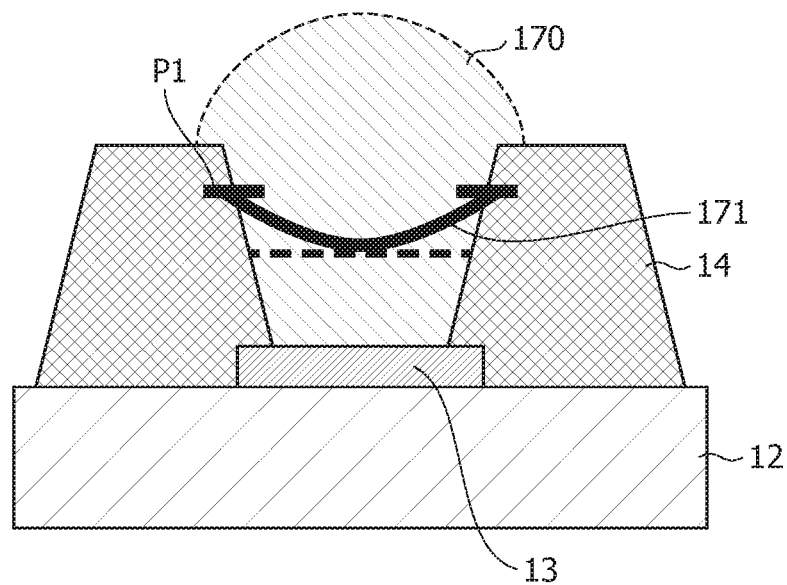
FIGS. 18A and 18B are schematic views for explaining that the film shape of a light emitting layer formed differs according to the difference in the dropping amount of an ink.
Figure 18B:
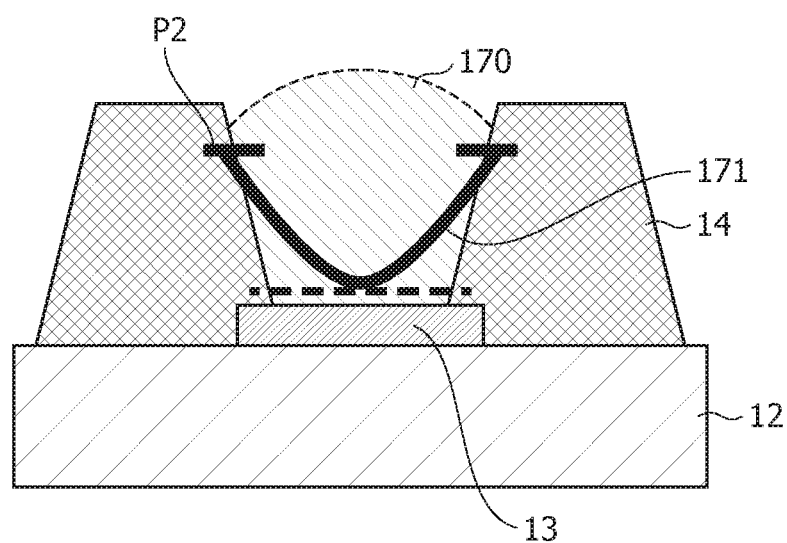

FIGS. 18A and 18B are sectional views schematically illustrating a forming process of a film shape, in which FIG. 18A depicts the case where the film thickness of the light emitting layer is large, whereas FIG. 18B depicts the case where the film thickness of the light emitting layer is small.

As illustrated in FIG. 18A, a pixel electrode 13 is formed over an interlayer insulation layer 12, and a pair of partition walls 14 of a predetermined height are erected on both sides, with the pixel electrode 13 interposed therebetween.

The partition walls 14 are formed using an organic material having a certain degree of liquid repellency, and, when an ink is dropped to a space (hereinafter referred to as "opening") between the pair of partition walls 14, an ink pool 170 swelling to the upper side is formed due to the surface tension of the ink and the liquid repellency of the partition walls 14. When drying occurs through evaporation of an organic solvent present in the ink pool 170, the film shape 171 of the light emitting layer becomes a concave shape that contacts inner walls of the partition walls 14 at pinning positions P1 and is hollowed to the lower side in the center of the opening.

On the other hand, in the case where the film thickness of the light emitting layer is small, as depicted in FIG. 18B, an ink in an amount smaller than that in the case of FIG. 18A is dropped into the opening to form an ink pool 170, and, when the ink is dried, the film shape is a concave shape steeper than that in the case of FIG. 18A, with a large head between pinning positions P2 and the center of the opening as indicated by a thick line 171.

Such a phenomenon is generated since the distance, in a direction perpendicular to the main surface of the interlayer insulation layer 12, of the pinning positions P1 and P2 from top portions of the partition walls 14 is little changed between the two cases.

It is considered that no or little difference in regard of the pinning positions is attributable, for example, to the fact that the contact angle between the ink and the partition wall 14 is kept in a predetermined range due to the relation between the liquid repellency of the compositional material of the partition wall 14 and the surface tension of the ink, and, because of the tendency toward faster evaporation of the organic solvent in the vicinity of the partition walls 14 as compared to the organic solvent in the central area, the position of the ink film in contact with the partition wall 14 (pinning position) is fixed earlier.

As a configuration for coping with this problem, there may be considered (1) a configuration in which the height of the partition wall 14 is made different between the side where the film thickness is larger and the side where the film thickness is smaller (the height of the partition wall 14 is set smaller on the side where the film thickness is smaller), and (2) a configuration in which inner wall surfaces of the partition walls 14 are surface treated to make the degree of liquid repellency (wettability) different between the side where the film thickness is larger and the side where the film thickness is smaller. However, in the configuration of (1), it is inevitable on a design basis to enlarge the width of the partition walls 14 for the purpose of providing steps at top portions of the partition walls 14, and, accordingly, the area of the space interposed between the partition walls 14 (the opening) is reduced, and the light emission efficiency may be lowered. In addition, the configuration of (2) also has a problem that, since the partition walls 14 have become finer due to the recent trend toward higher definition, it is technically difficult to apply different surface treatments to side surfaces of the partition walls 14 on the basis of sub-pixels for different light emission colors; even if it is technically possible, it is not practical on a cost basis, and it largely spoils the merit of adopting the wet process.

In view of this, the present inventors made extensive and intensive researches of a method for making even the film shapes of light emitting layers by, conversely, utilizing the fact that the pinning positions of a light emitting layer are not varied on the basis of light emission color, instead of making even the film shapes of light emitting layers different in film thickness by changing the pinning positions on the basis of light emission color. As a result of their researches, one mode of the present disclosure has been reached.

Figure 19A:
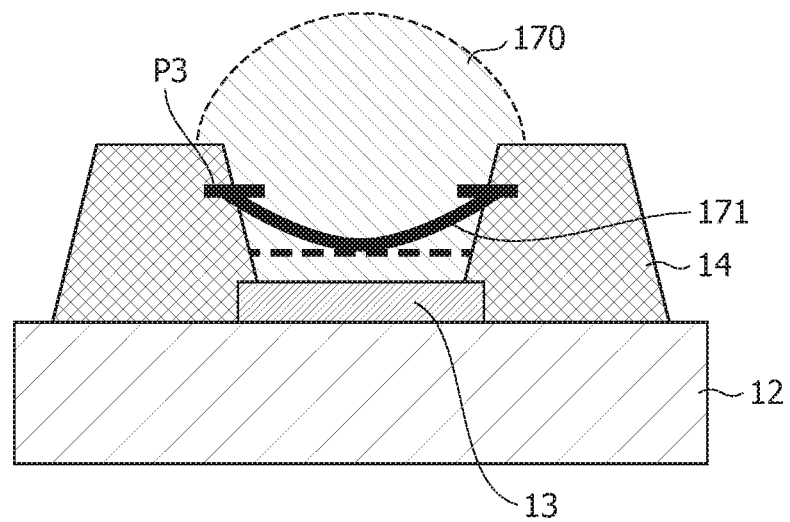
FIGS. 19A and 19B are schematic views for explaining that even when there is a difference in the dropping amount of an ink, the film shape of the light emitting layer can be made equivalent by Embodiment 1 as one mode of the present disclosure.
Figure 19B:
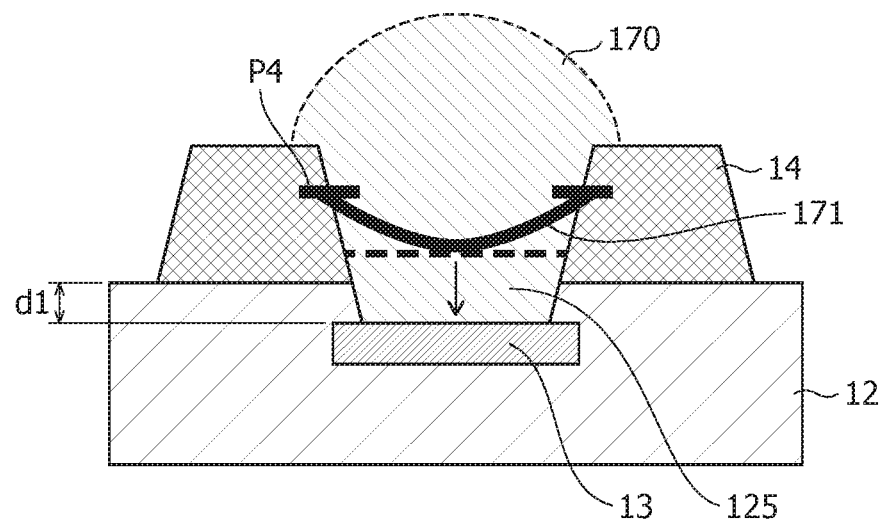

FIGS. 19A and 19B are schematic views for explaining a basic principle of one mode of the present disclosure; in this example, the height of partition walls 14 is set lower than that in the case of FIGS. 18A and 18B.

Although the distance of pinning positions P3 from top portions of the partition walls 14 is the same as that of the above-mentioned pinning positions P1 and P2, the volume of the opening below the pinning positions P3 is smaller. Therefore, the depression of a central portion upon drying is small, even in the case where the dropping amount of the ink is small as depicted in FIG. 19A, and the concave shape of the film shape 171 is very gently sloping as compared to the case of FIG. 18B.

In the case where the film thickness of the light emitting layer is large, while the height of the partition walls 14 is kept the same, the interlayer insulation layer 12 is provided with a dug portion 125 having a depth dl as illustrated in FIG. 19B, whereby the volume of the opening below the pinning positions P4 is set greater by an amount corresponding to the increased amount of the ink.

As a result, even in the case where the dropping amount of the ink is larger than that in the case of FIG. 19A, the depression of the central portion upon drying is compatible to that in the case of FIG. 19A, and the film shapes in the cases of FIG. 19A and FIG. 19B are substantially the same, so that the film shapes corresponding to different light emission colors can be made even or equivalent.

Thus, it has been found out that the film shapes for light emission colors accompanied by different film thicknesses can be made even or equivalent, by an extremely simple configuration in which dug portions according to the difference in the dropping amount of an ink are provided beneath light emitting regions of the openings in the partition walls such that the amount of the ink present above the pinning positions estimated will be the same for sub-pixels for different light emission colors and that the surface shapes (see FIGS. 19A and 19B) of ink pools 170 immediately after dropping will be substantially the same.

Outline of Embodiment 1 of the Present Disclosure

An organic EL display panel according to one mode of the present disclosure is an organic EL display panel including a substrate, an interlayer insulation layer formed over the substrate, and an organic EL light emitting section formed over the interlayer insulation layer. The organic EL light emitting section includes a plurality of pixel electrodes arranged in a matrix pattern over the interlayer insulation layer, a plurality of partition walls each of which is disposed between the pixel electrodes adjacent to each other in a row direction and extends in a column direction, an organic layer including a light emitting layer formed in a region partitioned by the partition walls, and a counter electrode formed on an upper side of the organic layer. The organic EL light emitting section includes a first light emitting section having a light emitting layer that emits light in a first color and a second light emitting section having a light emitting layer that emits light in a second color different from the first color. The first light emitting section and the second light emitting section are different in thickness of the organic layer, and the first light emitting section and the second light emitting section are different in digging amount of the interlayer insulation layer in the region partitioned by the partition walls.

Note that here the expression "the first light emitting section and the second light emitting section are different in digging amount of the interlayer insulation layer in the region partitioned by the partition walls" includes the case in which the digging amount of the interlayer insulation layer in the region partitioned by the partition walls in the light emitting section for one light emission color is "0."

According to such a mode, even where the organic layers for different light emission colors are different in film thickness, the film shapes of the organic layers can be made even or equivalent.

In addition, an organic EL display panel according to another mode of the present disclosure has a configuration in which that one of the first light emitting section and the second light emitting section in the above-mentioned mode which is longer in the wavelength of light emission color is greater than the other light emitting section in the digging amount of the interlayer insulation layer.

As a result, the film shapes of the organic layers for different light emission colors can be made even or equivalent while securing the film thicknesses of the organic layers according to the wavelengths of light emission colors.

In addition, an organic EL display panel according to another mode of the present disclosure has a configuration in which the height of the partition walls and the digging amount of the interlayer insulation layer in the above-mentioned mode are set in such a manner that the difference between the height of a pinning position where an upper surface of the organic layer and the partition wall make contact with each other in the first light emitting section and the second light emitting section and the height of a central position of the upper surface of the organic layer is not more than a predetermined value.

Here, the difference between the height of the pinning position where the upper surface of the organic layer and the partition wall make contact with each other and the height of the central position of the upper surface of the organic layer is not more than 700 nm.

In addition, it is desirable that a bottom surface of a dug portion of the interlayer insulation layer is flat.

According to such a mode, the film shapes of the organic layers for different light emission colors can be made even or equivalent in a state in which a flat portion is abundant and a numerical aperture is high.

Besides, an organic EL display panel according to another mode of the present disclosure has a configuration in which the pixel electrodes in the above-mentioned mode each include a light reflective metal thin film.

According to such a mode, it is possible to build up a suitable optical resonant structure respectively in the first and second light emitting sections for different light emission colors and thereby to enhance light emission efficiency.

In addition, an organic EL display device according to another mode of the present disclosure includes the organic EL display panel according to any one of the above-mentioned modes, and a driving section that drives the organic EL display panel to display an image.

Besides, an electronic apparatus according to another mode of the present disclosure includes the above-mentioned organic EL display device as an image display section.

According to such a mode, it is possible to display a high-quality image with a stable light emission efficiency of light emission colors.

In addition, a method of manufacturing an organic EL display panel according to another mode of the present disclosure is a method of manufacturing an organic EL display panel, including a first step of preparing a substrate, a second step of forming an interlayer insulation layer over the substrate, and a third step of forming an organic EL light emitting section over the interlayer insulation layer. The organic EL light emitting section includes a plurality of pixel electrodes arranged in a matrix pattern over the interlayer insulation layer, a plurality of partition walls each of which is disposed between the pixel electrodes adjacent to each other in a row direction and extends in a column direction, an organic layer including a light emitting layer formed in a region partitioned by the partition walls, and a counter electrode formed on an upper side of the organic layer, and includes a first light emitting section having a light emitting layer that emits light in a first color and a second light emitting section having a light emitting layer that emits light in a second color different from the first color. The first light emitting section and the second light emitting section are different in thickness of the organic layer, and, in the second step, dug portions differing in depth are formed in the interlayer insulation layer in those regions of the first light emitting section and the second light emitting section which are partitioned by the partition walls.

According to such a mode, it is possible to manufacture an organic EL display panel which can display a high-quality image with excellent light emission efficiency as aforementioned.

In addition, a method of manufacturing an organic EL display panel according to another mode of the present disclosure has a configuration in which in the above-mentioned mode, the interlayer insulation layer includes a photosensitive resin material, and, in the second step, dug portions differing in depth are formed in the interlayer insulation layer by one-time photolithography while utilizing a halftone mask.

As a result, the dug portions differing in depth can be formed easily in the interlayer insulation layer without considerably increasing the number of working steps.

Note that the term "over" in each of the above-mentioned modes of the disclosure does not refer to the upward direction (the vertically upper side) of an absolute space recognition, but is defined by a relative positional relation, based on the order of stacking in a stacked structure of the organic EL display panel. Specifically, in an organic EL display panel, a direction that is perpendicular to a main surface of a substrate and that is the side for going from the substrate toward a stacked body is referred to as an upper direction. In addition, for example, an expression "over the substrate" refers to not only a region for direct contact with the substrate but also a region on the upper side of the substrate with a stacked body interposed therebetween. Besides, for example, an expression "on an upper side of the substrate" refers to not only an upper region spaced from the substrate but also a region on the substrate.

Details of Embodiment 1

An organic EL display panel according to one mode of the present disclosure will be described below, referring to the drawings. Note that the drawings include schematic ones, in which the contraction scales of members, aspect ratios and the like may be different from the actual ones.

1. General Configuration of Organic EL Display Device 1

Figure 1:
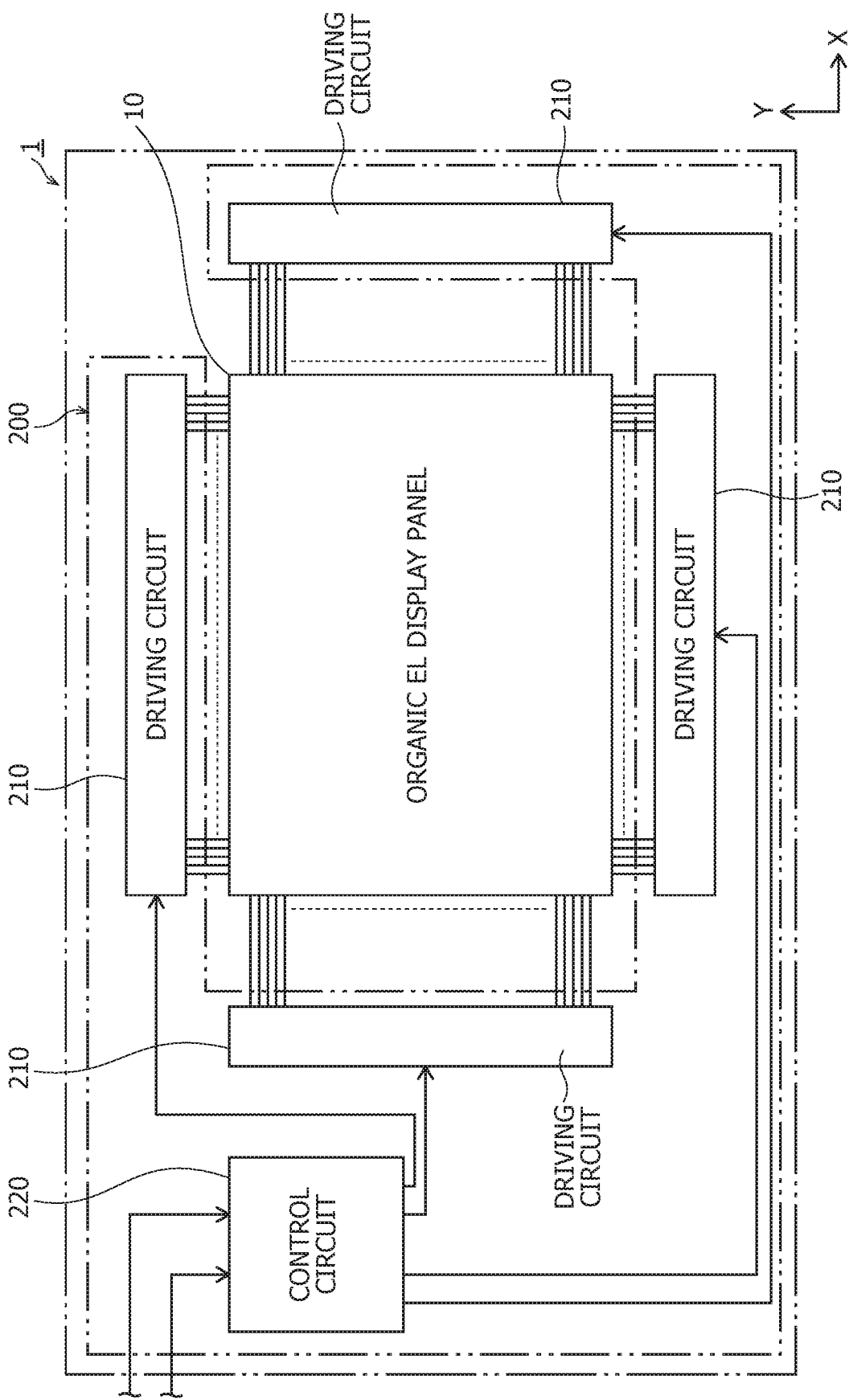
FIG. 1 is a block diagram depicting the general configuration of an organic EL display device according to Embodiment 1 as one mode of the present disclosure.

FIG. 1 is a block diagram depicting the general configuration of an organic EL display device 1. The organic EL display device 1 is a display device for use in, for example, television sets, personal computers, portable terminals, displays for business (electronic signboards, large-sized screens for commercial facilities) or the like.

The organic EL display device 1 includes an organic EL display panel 10, and a driving control section 200 electrically connected thereto.

The organic EL display panel 10, in the present embodiment, is a top emission type display panel in which an upper surface is a rectangular image display surface. The organic EL display panel 10 has a plurality of organic EL elements (not illustrated) arranged along the image display surface, and images are displayed by combining light emission of the organic EL elements. Note that the organic EL display panel 10 adopts an active matrix system, as an example.

The driving control section 200 includes driving circuits 210 connected to the organic EL display panel 10, and a control circuit 220 connected to an external device such as a computer or a reception device such as an antenna. The driving circuit 210 includes a power source circuit that supplies electric power to each of the organic EL elements, a signal circuit that applies voltage signals for controlling the electric power supplied to each of the organic EL elements, a scanning circuit that switches the part to which the voltage signal is to be applied at a predetermined interval, and the like.

The control circuit 220 controls operations of the driving circuits 210, according to data including image information inputted from the external device or the reception device.

Note that while four driving circuits 210 are disposed in the periphery of the organic EL display panel 10 as an example in FIG. 1, the configuration of the driving control section 200 is not limited to this configuration, and the number and positions of the driving circuits 210 may be changed as required. In addition, in the following, for explanation, the direction along the long sides of an upper surface of the organic EL display panel 10 is referred to as X direction, and the direction along the short sides of the upper surface of the organic EL display panel 10 is referred to as Y direction, as depicted in FIG. 1.

2. Configuration of Organic EL Display Panel 10
(A) Plan-View Configuration

Figure 2:
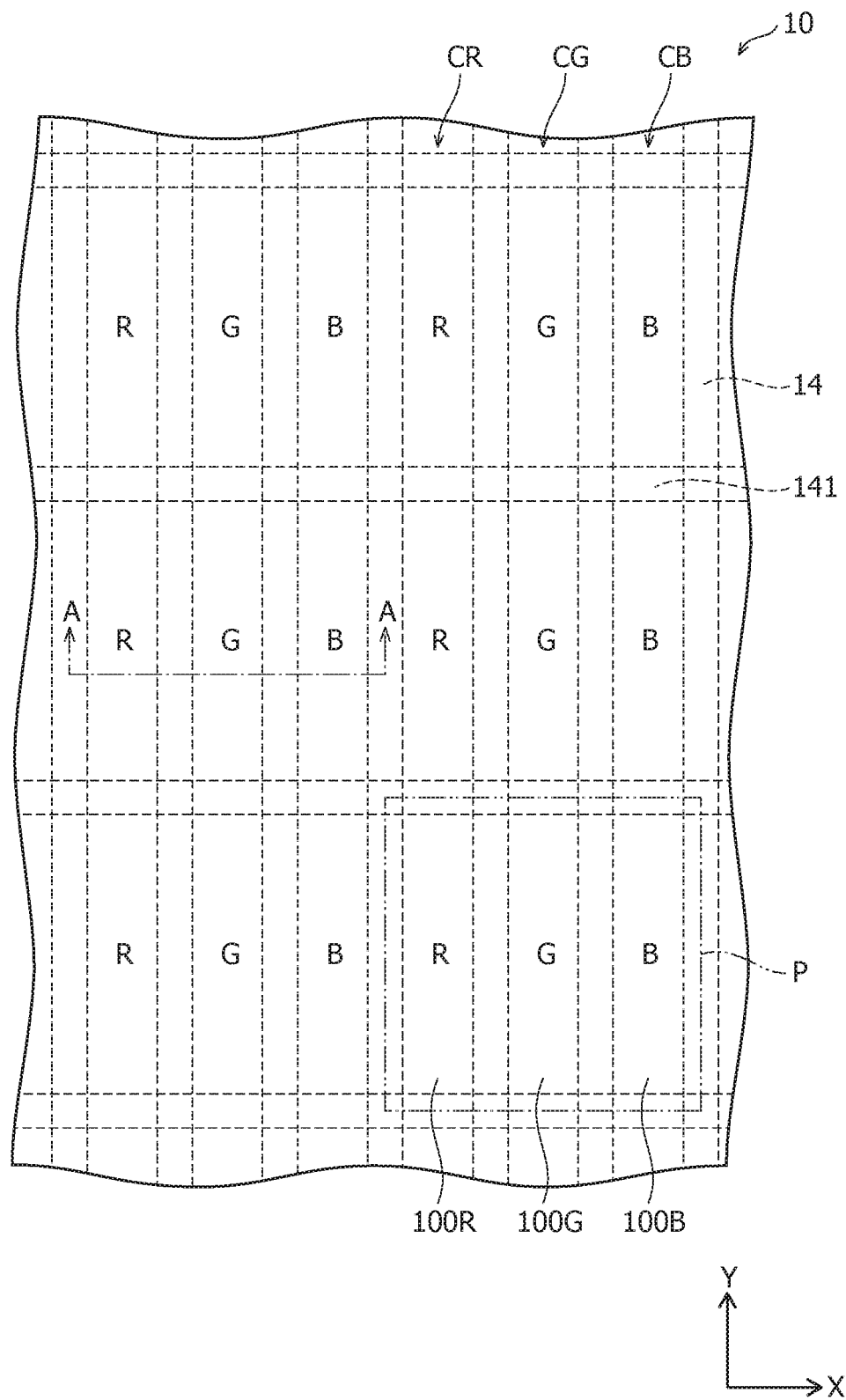
FIG. 2 is a schematic plan view depicting, in an enlarged form, part of an image display surface of an organic EL display panel according to Embodiment 1.

FIG. 2 is a schematic plan view depicting, in an enlarged form, part of the image display surface of the organic EL display panel 10. In the organic EL display panel 10, sub-pixels 100R, 100G, and 100B that emit light in R (red), G (green), and B (blue) (hereinafter referred also to simply as R, G, and B) are arranged in a matrix pattern, as an example. The sub-pixels 100R, 100G, and 100B are alternately aligned in the X direction (row direction), and one set of a sub-pixel 100R, a sub-pixel 100G, and a sub-pixel 100B aligned in the X direction constitutes one pixel P. In the pixel P, light emission luminances of the sub-pixels 100R, 100G, and 100B subjected to gradation control are combined with one another, whereby full-color expression can be realized.

Besides, in the Y direction (column direction), only one group of the sub-pixels 100R, the sub-pixels 100G, and the sub-pixels 100B are aligned, whereby sub-pixel columns CR, sub-pixel columns CG, and sub-pixel columns CB are configured, respectively. As a result, in the organic EL display panel 10 as a whole, the pixels P are aligned in the matrix pattern along the X direction and the Y direction, and the color light emissions of the pixels P thus arranged in the matrix pattern are combined with one another, whereby an image is displayed on the image display surface.

In the sub-pixels 100R, 100G, and 100B, organic EL elements 2 (see FIG. 3) that emit light in R, G, and B colors, respectively, are arranged.

In addition, in the organic EL display panel 10 according to the present embodiment, a so-called line bank system is adopted. Specifically, a plurality of partition walls (banks) 14 that partition the sub-pixel columns CR, CG, and CB on a column basis are disposed at intervals in the X direction, and, in each of the sub-pixel columns CR, CG, and CB, the sub-pixels 100R, 100G, and 100B share an organic light emitting layer.

It is to be noted, however, that in each of the sub-pixel columns CR, CG, and CB, a plurality of pixel restriction layers 141 that insulate the sub-pixels 100R, 100G, and 100B from one another are disposed at intervals in the Y direction, and each of the sub-pixels 100R, 100G, and 100B can independently emit light.

Note that the height of the pixel restriction layers 141 is lower than the height of the surfaces of the light emitting layers. In FIG. 2, the partition walls 14 and the pixel restriction layers 141 are expressed in dotted lines, since the pixel restriction layers 141 and the partition walls 14 are not exposed to the surface of the image display surface but are disposed in the inside of the image display surface.

Figure 3:
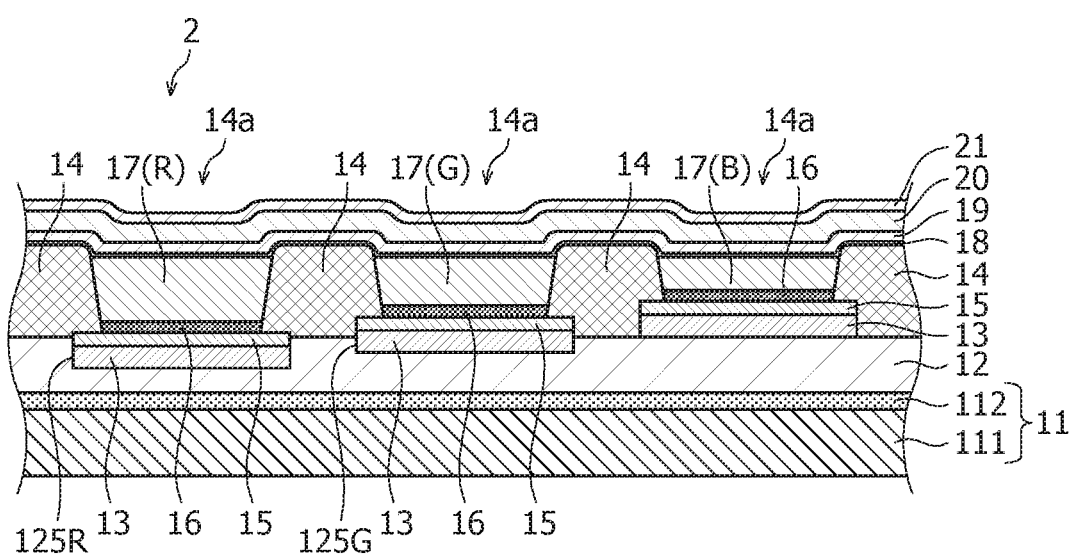
FIG. 3 is a schematic sectional view taken along line A-A of FIG. 2.

(B) Sectional Configuration of Organic EL Element
FIG. 3 is a schematic sectional view taken along line A-A of FIG. 2.

In the organic EL display panel 10, one pixel includes three sub-pixels that emit light in R, G, and B, respectively. Each of the sub-pixels includes an organic EL element that emits light in the corresponding color.

Since the organic EL elements for respective colors basically have substantially the same configuration, they will be described as the organic EL element 2 when not discriminated from one another.

As illustrated in FIG. 3, the organic EL element 2 includes a substrate 11, an interlayer insulation layer 12, pixel electrodes 13, partition walls 14, hole injection layers 15, hole transport layers 16, light emitting layers 17, an electron transport layer 18, an electron injection layer 19, a counter electrode 20, and a sealing layer 21.

The substrate 11, the interlayer insulation layer 12, the electron transport layer 18, the electron injection layer 19, the counter electrode 20, and the sealing layer 21 are not formed on a pixel basis, but are formed in common for the plurality of organic EL elements 2 provided in the organic EL display panel 10.

(1) Substrate
The substrate 11 includes a base material 111 which is an insulating material, and a thin film transistor (TFT) layer 112. The TFT layer 112 is formed with driving circuits on a sub-pixel basis. As the base material 111, there can be adopted, for example, a glass substrate, a quartz substrate, a silicon substrate, a metallic substrate of molybdenum sulfide, copper, zinc, aluminum, stainless steel, magnesium, iron, nickel, gold, silver or the like, a semiconductor substrate of gallium arsenide or the like, a plastic substrate, and the like.

As the plastic material, either of a thermoplastic resin and a thermosetting resin may be used. Applicable examples of the plastic material include polyethylene, polypropylene, polyamides, polyimides (PI), polycarbonate, acrylic resins, polyethylene terephthalate (PET), polybutylene terephthalate, polyacetal, as well as various thermoplastic elastomers based on fluororesin, styrene, polyolefin, polyvinyl chloride, polyurethane, fluororubber, chlorinated polyethylene or the like, epoxy resins, unsaturated polyesters, silicone resins, polyurethane, and the like, and copolymers, blends, polymer alloys and the like containing these as a main constituent, and laminates of one or more of these materials.

(2) Interlayer Insulation Layer
The interlayer insulation layer 12 is formed over the substrate 11. The interlayer insulation layer 12 is formed using a resin material, and is for flattening steps present in an upper surface of the TFT layer 112. Examples of the resin material include positive-type or negative-type photosensitive materials. In addition, examples of such photosensitive materials include acrylic resins, polyimide resins, siloxane resins, and phenolic resins. In addition, though not illustrated in the sectional view of FIG. 3, the interlayer insulation layer 12 is formed with contact holes on a sub-pixel basis.

Besides, the upper surface of the interlayer insulation layer 12 is formed with dug portions 125R and 125G at portions corresponding to R and G light emitting regions. The dug portion 125R is greater than the dug portion 125G in digging amount (depth), and bottom portions of both of the dug portions are flat portions parallel to the main surface of the substrate 11.

With the dug portions 125R and 125G thus provided, film shapes can be made even or equivalent, while providing differences desirable on an optical design basis for forming the aforementioned optical resonant structure, in the film thicknesses of the light emitting layers 17(R), 17(G), and 17(B) in the sub-pixels for respective light emission colors. The optical resonant structure itself is a known configuration, and it is not particularly described in detail.

Note that in the present embodiment, a negative-type photosensitive resin is used as the interlayer insulation layer 12, and the dug portions 125R and 125G are formed by a photolithography method using a halftone mask. The details of this will be described later.

(3) Pixel Electrode

The pixel electrode 13 includes a metallic layer formed using a light reflective metallic material, and is formed over the interlayer insulation layer 12. The pixel electrodes 13 are provided on a sub-pixel basis, and are each electrically connected to the TFT layer 112 through a contact hole (not illustrated).

In the present embodiment, the pixel electrode 13 functions as an anode.

Specific examples of the light reflective metallic material include Ag (silver), Al (aluminum), aluminum alloys, Mo (molybdenum), APC (an alloy of silver, palladium, and copper), ARA (an alloy of silver, rubidium, and gold), MoCr (an alloy of molybdenum and chromium), MoW (an alloy of molybdenum and tungsten), and NiCr (an alloy of nickel and chromium).

While the pixel electrode 13 may be configured by a metallic layer alone, it may have a stacked structure in which a layer formed using a metallic oxide such as ITO (indium tin oxide) or IZO (indium zinc oxide) is stacked on the metallic layer.

(4) Partition Wall and Pixel Restriction Layer

The partition walls 14 are for partitioning the plurality of pixel electrodes 13 arranged on a sub-pixel basis on an upper side of the substrate 11, on a column basis in the X direction (see FIG. 2), and are in a line bank shape extending in the Y direction between the sub-pixel columns CR, CG, and CB which are aligned in the X direction.

For the partition wall 14, an electrically insulating material is used. Specific examples usable as the electrically insulating material include insulating organic materials (e.g., acrylic resins, polyimide resins, novolak resins, phenolic resins, and the like).

The partition walls 14 function as structures for preventing color inks, applied in the case of forming the light emitting layers 17 by a coating (application) method, from overflowing and mixing with one another.

Note that in the case of using a resin material, it is preferable, from the viewpoint of processability, that the resin material is photosensitive. The photosensitive property may be either of positive type and negative type.

It is preferable for the partition walls 14 to have resistance to organic solvents and heat. In addition, for restraining outflow of inks, it is preferable for the surfaces of the partition walls 14 to have a predetermined degree of liquid repellency.

In areas where the pixel electrodes 13 are not formed, a bottom surface of the partition wall 14 is in contact with the upper surface of the interlayer insulation layer 12.

The pixel restriction layers 141 are formed using an electrically insulating material, cover end portions of the pixel electrodes 13 adjacent to each other in the Y direction (FIG. 2) in each of the sub-pixel columns, and partition the pixel electrodes 13 adjacent to each other in the Y direction from each other.

The film thickness of the pixel restriction layers 141 is set to be slightly greater than the film thickness of the pixel electrodes 13 but smaller than the thickness up to the upper surface of the light emitting layers 17. As a result, the light emitting layers 17 in the sub-pixel columns CR, CG, and CB are not partitioned by the pixel restriction layers 141, and flow of inks at the time of forming the light emitting layers 17 is not obstructed. Therefore, it is easy to make even or equivalent the thicknesses of the light emitting layers 17 in the sub-pixel columns.

With the above-mentioned structure, the pixel restriction layers 141 plays roles of, for example, restraining stepping of the organic light emitting layers 16 in the sub-pixel columns CR, CG, and CB and enhancing electrical insulation between the pixel electrodes 13 and the counter electrode 20, while enhancing electrical insulation between the pixel electrodes 13 adjacent to each other in the Y direction.

Specific examples of the electrically insulating material used for the pixel restriction layers 141 include the resin materials and inorganic materials mentioned above as examples of the material for the partition walls 14. In addition, for permitting inks to wet and spread easily at the time of forming the organic light emitting layers 16 as upper layers, it is preferable that the surfaces of the pixel restriction layers 141 have affinity for the inks.

(5) Hole Injection Layer

The hole injection layers 15 are provided over the pixel electrodes 13 for the purpose of accelerating injection of holes from the pixel electrodes 13 into the light emitting layers 17. The hole injection layer 15 is a layer composed, for example, of an oxide of Ag (silver), Mo (molybdenum), Cr (chromium), V (vanadium), W (tungsten), Ni (nickel), Ir (iridium) or the like or a conductive polymer material such as PEDOT/PSS (a mixture of polythiophene and polystyrenesulfonic acid).

Of the above-mentioned, the hole injection layer 15 formed using a metal oxide has a function of stably generating holes or assisting generation of holes to thereby inject the holes into the light emitting layer 17, and has a great work function.

In the present embodiment, the hole injection layers 15 are formed using tungsten oxide. Where the hole injection layer 15 is formed using an oxide of a transition metal, it can take a plurality of levels, since the transition metal has a plurality of oxidation numbers, and, as a result, hole injection is facilitated, which contributes to a reduction in driving voltage.

(6) Hole Transport Layer

The hole transport layer 16 has a function of transporting the holes, injected from the hole injection layer 15, to the light emitting layer 17. The hole transport layers 16 are formed by a wet process while using, for example, a polymer compound which is polyfluorene or a derivative thereof or a polyarylamine or a derivative thereof and which has no hydrophilic group.

(7) Light Emitting Layer

The light emitting layers 17 are formed in the openings 14a, and have functions of emitting light in colors of R, G, and B through recombination between holes and electrons. Note that particularly in the case where description should be made by specifying the light emission color, the light emitting layers 17 will be referred to as light emitting layers 17(R), 17(G), and 17(B).

As materials for the light emitting layers 17, known materials can be utilized. Specific examples of the material to be preferably used here include fluorescent substances such as oxinoid compounds, perylene compounds, coumarin compounds, azacoumarin compounds, oxazole compounds, oxadiazole compounds, perinone compounds, pyrrolopyrrole compounds, naphthalene compounds, anthracene compounds, fluorene compounds, fluoranthene compounds, tetracene compounds, pyrene compounds, coronene compounds, quinolone compounds and azaquinolone compounds, pyrazoline derivatives and pyrazolone derivatives, rhodamine compounds, chrysene compounds, phenanthrene compounds, cyclopentadiene compounds, stilbene compounds, diphenylquinone compounds, styryl compounds, butadiene compounds, dicyanomethylenepyran compounds, dicyanomethylenethiopyran compounds, fluorescein compounds, pyrylium compounds, thiapyrylium compounds, selenapyrylium compounds, telluropyrylium compounds, aromatic aldadiene compounds, oligophenylene compounds, thioxanthene compounds, cyanine compounds, acridine compounds, metal complexes of 8-hydroxyquinoline compounds, metal complexes of 2-bipyridine compounds, complexes of Schiff base and Group III metals, oxine metal complexes, and rare earth complexes.

(8) Electron Transport Layer

The electron transport layer 18 has a function of transporting electrons from the counter electrode 20 to the light emitting layer 17. The electron transport layer 18 is formed using an organic material high in electron transporting property, and contains no alkali metal and no alkaline earth metal.

Examples of the organic material to be used for the electron transport layer 18 include 7-electron low molecular weight organic materials such as oxadiazole derivatives (OXD), triazole derivatives (TAZ), and phenanthroline derivatives (BCP, Bphen).

(9) Electron Injection Layer

The electron injection layer 19 has a function of injecting the electrons supplied from the counter electrode 20 to the light emitting layer 17 side. The electron injection layer 19 is formed using, for example, a material in which an organic material high in electron transporting property is doped with a dopant metal selected from among alkali metals or alkaline earth metals.

The metals relevant to the alkali metals include lithium (Li), sodium (Na), potassium (K), rubidium (Rb), cesium (Cs), and francium (Fr), while the metals relevant to the alkaline earth metals include calcium (Ca), strontium (Sr), barium (Ba) and radium (Ra).

In the present embodiment, doping with barium (Ba) is adopted.

In addition, examples of the organic material to be used for the electron injection layer 19 include 7-electron low molecular weight organic materials such as oxadiazole derivatives (OXD), triazole derivatives (TAZ), and phenanthroline derivatives (BCP, Bphen).

(10) Counter Electrode

The counter electrode 20 is formed using a light-transmitting conductive material, and is formed over the electron injection layer 19. The counter electrode 20 functions as a cathode.

As the material for the counter electrode 20, there can be used, for example, ITO, IZO and the like. In order to obtain an optical resonant structure more effectively, however, it is desirable to use such metal as silver, silver alloys, aluminum, and aluminum alloys as the material for the counter electrode 20. In this case, since the counter electrode 20 should have a light transmitting property, it is formed as a thin film with a film thickness of not more than approximately 20 nm.

(11) Sealing Layer

The sealing layer 21 is provided for preventing the organic layers such as the hole transport layers 16, the light emitting layers 17, the electron transport layer 18, and the electron injection layer 19 from being deteriorated through exposure to moisture or exposure to air.

The sealing layer 21 is formed using, for example, a light transmitting material such as silicon nitride (SiN) and silicon oxynitride (SiON).

(12) Others

Though not depicted in FIG. 3, a polarizing plate for anti-glare purpose or an upper substrate may be laminated over the sealing layer 21, with an adhesive therebetween. Lamination of such a member ensures further protection of the hole transport layers 16, the light emitting layers 17, the electron transport layer 18 and the electron injection layer 19 from moisture, air and the like.

3. Method of Manufacturing Organic EL Display Panel 10

A method of manufacturing the organic EL display panel 10 will be described below, referring to the drawings.

FIGS. 4A, 4B, 4C, 4D, 4E and 4F, FIGS. 5A, 5B, 5C and 5D, and FIGS. 6A, 6B, 6C and 6D are schematic sectional views illustrating the states in steps in manufacture of the organic EL display panel 10. In addition, FIG. 7 is a flow chart depicting the manufacturing process of the organic EL display panel 10.

(1) Substrate Preparation Step

Figure 4A:
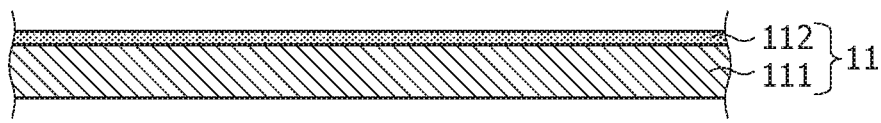
FIGS. 4A, 4B, 4C, 4D, 4E and 4F are partial sectional views schematically illustrating a manufacturing process of an organic EL element according to Embodiment 1.
Figure 7:
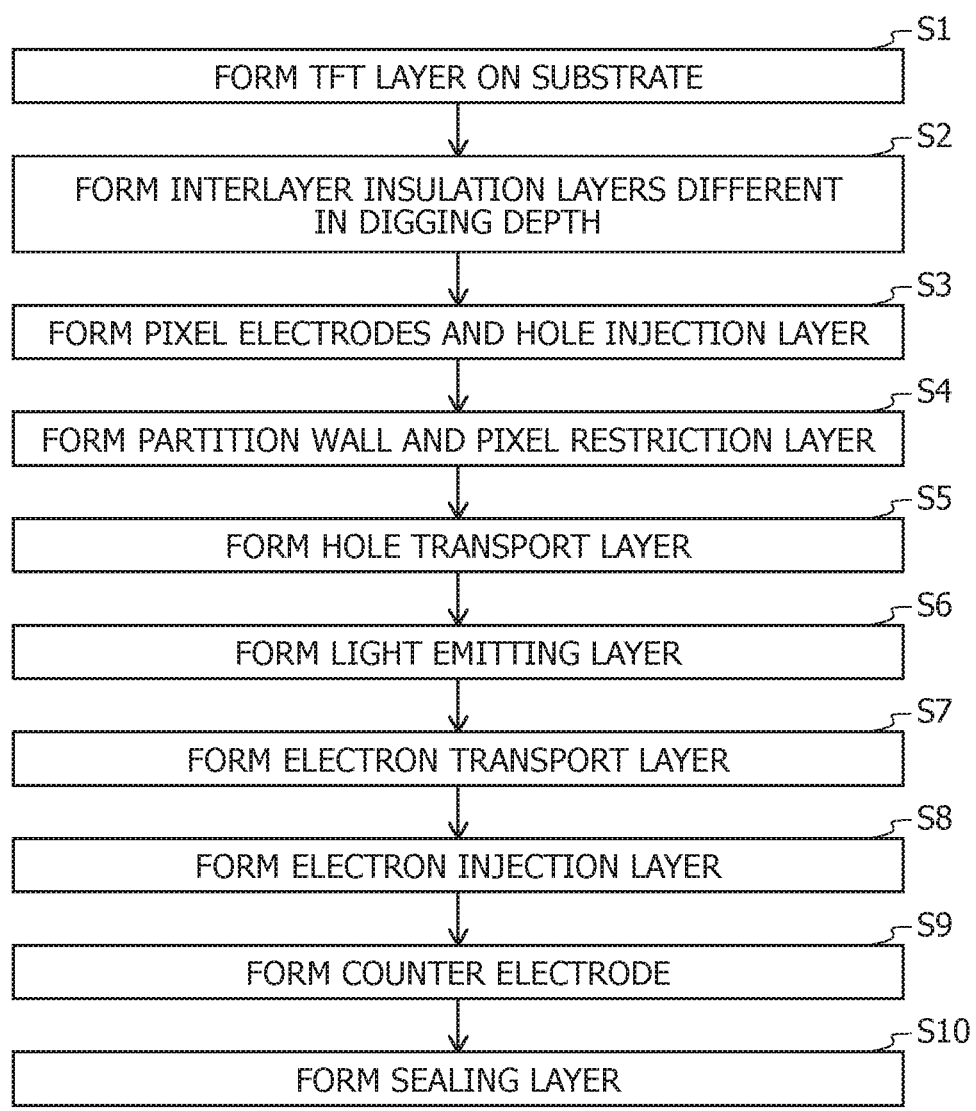
FIG. 7 is a flow chart depicting the manufacturing process of the organic EL element according to Embodiment 1 as one mode of the present disclosure.

First, as depicted in FIG. 4A, the TFT layer 112 is formed over the base material 111, to prepare the substrate 11 (step S1 in FIG. 7). The TFT layer 112 can be formed by a known TFT manufacturing method.

(2) Interlayer Insulation Layer Forming Step

Figure 4B:
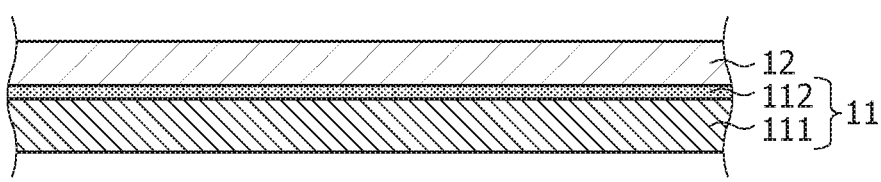
Figure 4C:
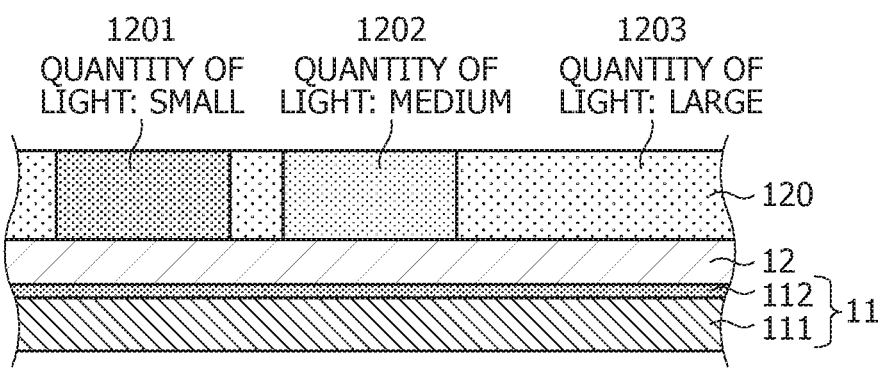

Next, as illustrated in FIG. 4B, the interlayer insulation layer 12 having the dug portions 125R and 125G is formed over the substrate 11 (step S2 in FIG. 7).

Specifically, a negative-type photosensitive resin material having a certain degree of fluidity is applied along an upper surface of the substrate 11 in such a manner as to bury projections and recesses formed over the substrate 11 due to the TFT layer 112 by, for example, a die coating method. As a result, an upper surface of the interlayer insulation layer 12 assumes a shape flattened along the upper surface of the base material 111.

Next, dug portions are formed in those regions of the interlayer insulation layer 12 in which the light emitting layers 17 of sub-pixels for respective light emission colors are to be formed.

Note that the film thickness of the light emitting layer for emitting light in blue (B) which is the shortest in wavelength is the smallest, and, hence, it is unnecessary to form a dug portion in the relevant region (in the present embodiment, the digging amount is defined as "0").

Therefore, a photomask 120 is disposed over an upper surface of the interlayer insulation layer 12, and exposure to light is conducted. This photomask 120 includes a first halftone section 1201, a second halftone section 1202 and a full exposure section 1203, which are formed such that light transmittance increases in this order.

The positions of the first halftone section 1201 and the second halftone section 1202 correspond to the positions at which the light emitting layer 17(R) and the light emitting layer 17(G) of the sub-pixels 100R and 100G are to be formed. The transmittances of the first halftone section 1201 and the second halftone section 1202 are set in such a manner that those positions of the interlayer insulation layer 12 at which the dug portions 125R and 125G are to be formed can be exposed to the respectively required depths in a predetermined exposure time.

Figure 4D:
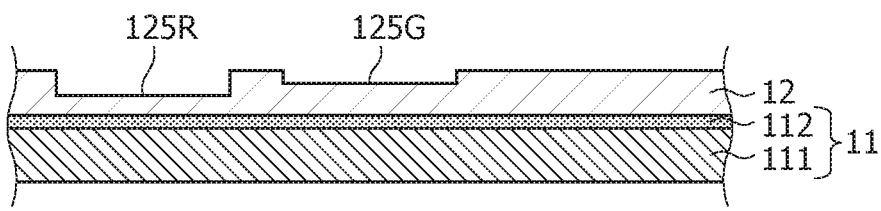

After the exposure, development and cleaning are performed, whereby the dug portions 125R and 125G are formed in the upper surface of the interlayer insulation layer 12, as depicted in FIG. 4D.

In addition, contact holes (not illustrated) are formed in those areas of the interlayer insulation layer 12 which are over, for example, source electrodes of TFT elements, by a dry etching method. The contact holes are formed by patterning or the like such that surfaces of the source electrodes are exposed at bottom portions of the contact holes.

Next, connection electrode layers are formed along inner walls of the contact holes. Part of an upper portion of the connection electrode layer is disposed over the interlayer insulation layer 12. The connection electrode layers can be formed using, for example, a sputtering method; specifically, after a metallic film is formed, patterning may be conducted using a photolithography method and a wet etching method.

(3) Pixel Electrode and Hole Injection Layer Forming Step

Figure 4E:
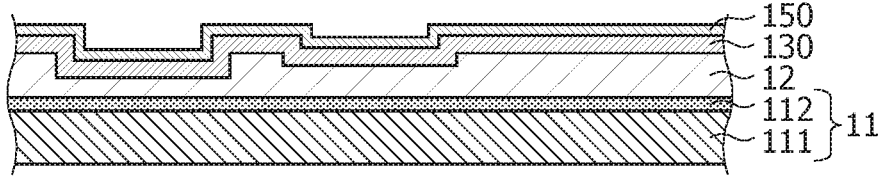

Subsequently, as depicted in FIG. 4E, a pixel electrode material layer 130 is formed over the interlayer insulation layer 12. The pixel electrode material layer 130 can be formed by, for example, a vacuum deposition method, a sputtering method or the like.

Further, a hole injection material layer 150 is formed over the pixel electrode material layer 130. The hole injection material layer 150 can be formed by, for example, a reactive sputtering method or the like.

Figure 4F:
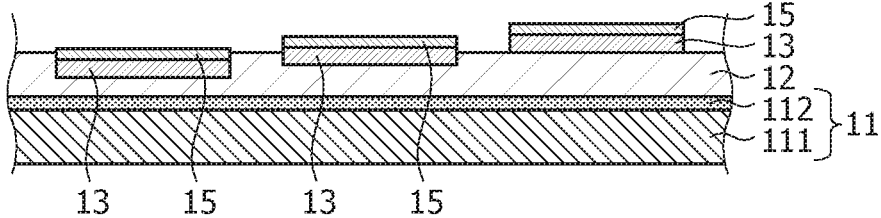

Then, as illustrated in FIG. 4F, the pixel electrode material layer 130 and the hole injection material layer 150 are patterned by etching, to form a plurality of pixel electrodes 13 and a plurality of hole injection layers 15 which are partitioned on a sub-pixel basis (step S3 in FIG. 7).

Note that the method for forming the pixel electrodes 13 and the hole injection layers 15 is not limited to the aforementioned method; for example, the hole injection layers 15 may be formed after the pixel electrodes 13 are formed by patterning the pixel electrode material layer 130.

In addition, the hole injection layers 15 may be formed by a wet process after the partition walls 14 are formed.

(4) Partition Wall and Pixel Restriction Layer Forming Step

Next, the partition walls 14 and the pixel restriction layers 141 are formed (step S4 in FIG. 7). In the present embodiment, the partition walls 14 and the pixel restriction layers 141 are simultaneously formed by using a halftone mask in the following manner.

Figure 5A:
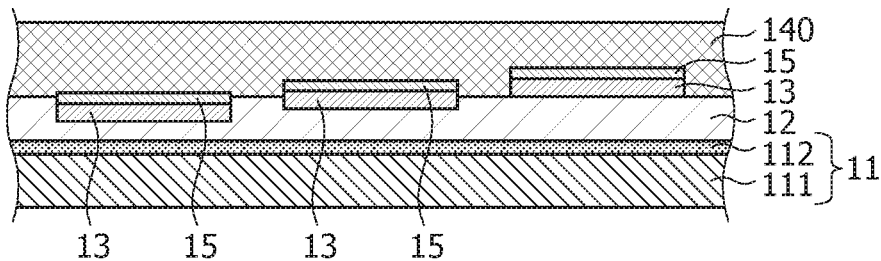
FIGS. 5A, 5B, 5C and 5D are partial sectional views schematically illustrating the manufacturing process of the organic EL element subsequent to FIGS. 4A, 4B, 4C, 4D, 4E and 4F.
Figure 5B:
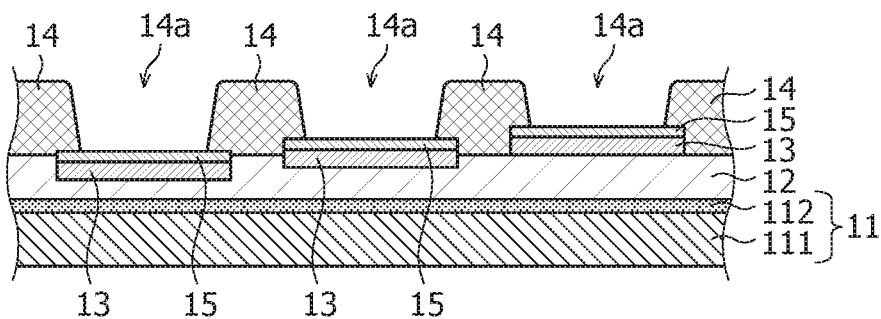

First, as depicted in FIG. 5A, over the interlayer insulation layer 12 formed with the pixel electrodes 13 and the hole injection layers 15, a resin material is applied in an amount corresponding to the film thickness of the partition walls 14, to form a partition wall material layer 140. As a specific coating (application) method, there can be used, for example, a die coating method, a slit coating method, a spin coating method or the like.

After the application, it is desirable to conduct, for example, vacuum drying and low-temperature heating drying (prebaking) at approximately 60° C. to 120° C. or the like, to remove the unrequired solvent and to fix the partition wall material layer 140 onto the interlayer insulation layer 12.

Subsequently, the partition wall material layer 140 is subjected to exposure to light using a photomask (not illustrated).

For example, in the case where the partition wall material layer 140 has a positive-type photosensitive property, the areas where to leave the partition material layer 140 are shielded from light, whereas the areas where to remove the partition material layer 140 are exposed to light.

In the case of the present example, since the pixel restriction layers 141 are smaller in film thickness than the partition walls 14, the partition wall material layer 140 should be half-exposed in the areas of the pixel restriction layers 141.

Therefore, the photomask to be used in this exposure step includes light-shielding sections that are disposed at positions corresponding to the partition walls 14 and shield light perfectly, semi-transparent sections disposed at positions corresponding to the pixel restriction layers 141, and light-transmitting sections disposed at positions corresponding to other exposed areas of the pixel electrodes 13.

The light transmittance of the semi-transparent sections is determined in such a manner that when exposure is conducted for a predetermined time, the partition wall material layer 140 over the pixel electrodes 13 is fully exposed, whereas the pixel restriction layers 141 are left, without being exposed, in an amount corresponding to the height thereof.

Next, development is conducted to remove the exposed regions of the partition wall material layer 140, whereby the partition walls 14 and the pixel restriction layers 141 thinner than them can be formed. A specific developing method may include, for example, immersing the substrate 11 as a whole in a developing liquid such as an organic solvent or an alkali solution for dissolving those parts of the partition wall material layer 140 which have been exposed in the exposure step, and thereafter cleaning the substrate 11 with a rinsing liquid such as pure water.

As a result, the partition walls 14 in a shape extending in the Y direction and the pixel restriction layers 141 extending in the X direction can be formed over the interlayer insulation layer 12.

(5) Hole Transport Layer Forming Step

Figure 5C:
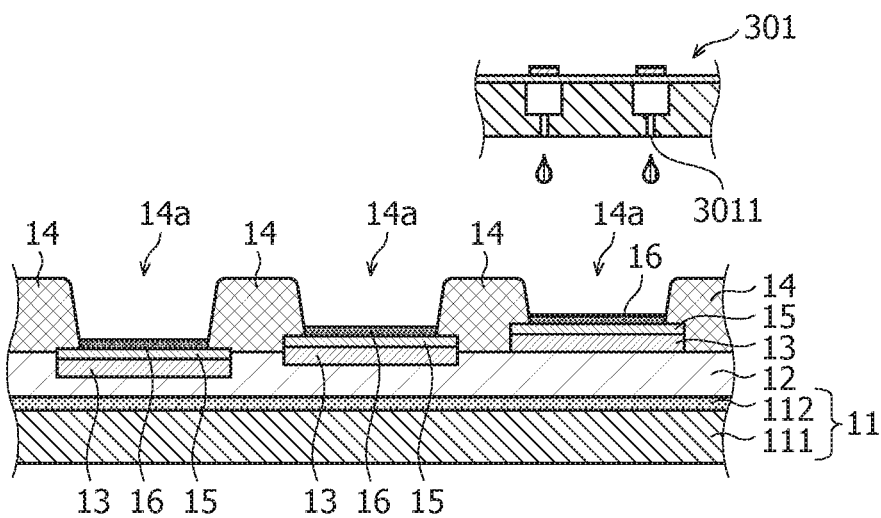

Subsequently, as illustrated in FIG. 5C, an ink containing a constituent material of the hole transport layers 16 is ejected from nozzles 3011 of an application head 301 of a printing device into the openings 14a defined by the partition walls 14, to apply the ink over the hole injection layers 15 in the openings 14a. In this instance, the hole injection layers 15 are applied such as to extend along the Y direction (FIG. 2) on an upper side of the pixel electrode columns. Thereafter, drying is conducted, to form the hole transport layers 16 (step S5 in FIG. 7).

(6) Light Emitting Layer Forming Step

Next, the light emitting layers 17 are formed on an upper side of the hole transport layers 16 (step S6 in FIG. 7).

Figure 5D:
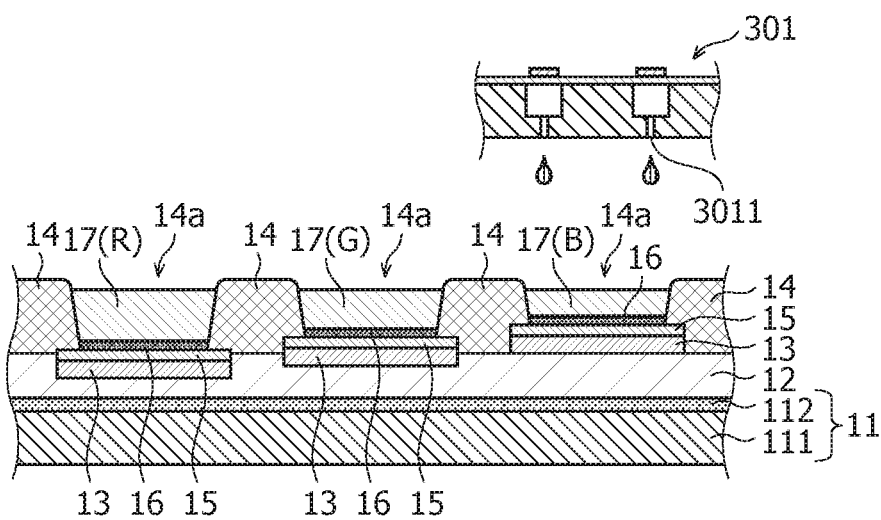

Specifically, as depicted in FIG. 5D, inks containing light emitting materials for the corresponding light emission colors are sequentially ejected from the nozzles 3011 of the application head 301 of the printing device into the openings 14a, to apply the inks over the hole transport layers 16 in the openings 14a. In this instance, the inks are applied in such a manner as to be continuous also on an upper side of the pixel restriction layers 141. As a result, the inks can flow along the Y direction, whereby uneven application of the inks can be restrained, and the film thickness of the light emitting layer 17 in the same sub-pixel column can be made uniform. Note that the dropping amounts of the inks for light emission colors are controlled such that the light emitting layers 17(R), 17(G), and 17(B) sequentially decrease in film thickness in this order.

Then, the substrate 11 after the ink application is carried into a vacuum drying chamber, and is heated under a vacuum environment, to evaporate the organic solvents present in the inks. As a result, the light emitting layers 17 can be formed.

(7) Electron Transport Layer Forming Step

Figure 6A:
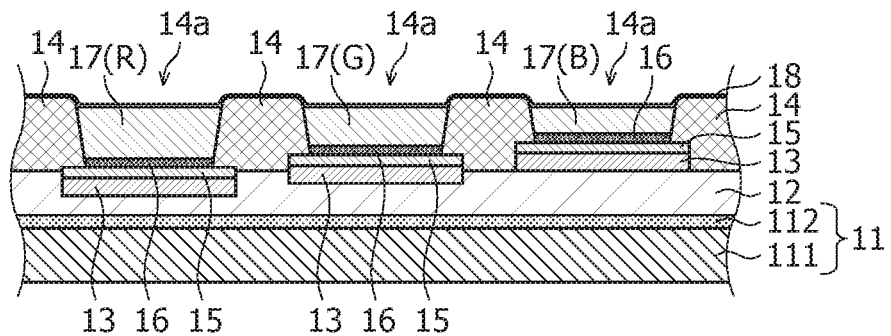
FIGS. 6A, 6B, 6C and 6D are partial sectional views schematically illustrating the manufacturing process of the organic EL element subsequent to FIGS. 5A, 5B, 5C and 5D.

Subsequently, as depicted in FIG. 6A, the electron transport layer 18 is formed over the light emitting layers 17 and the partition walls 14 (step S7 in FIG. 7). The electron transport layer 18 is formed by, for example, forming a film of an organic material having an electron transporting property in common for the sub-pixels by a vapor deposition method.

(8) Electron Injection Layer Forming Step

Figure 6B:
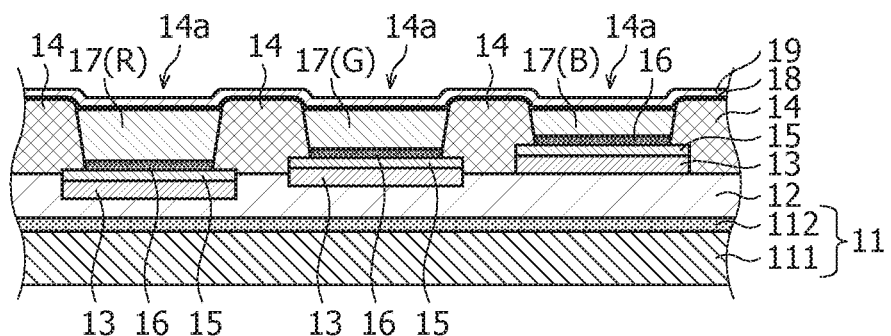

Next, as illustrated in FIG. 6B, the electron injection layer 19 is formed over the electron transport layer 18 (step S8 in FIG. 7). The electron injection layer 19 is formed by, for example, forming a film of an organic material having an electron transporting property and a dopant metal in common for the sub-pixels by a co-deposition method.

(9) Counter Electrode Forming Step

Figure 6C:
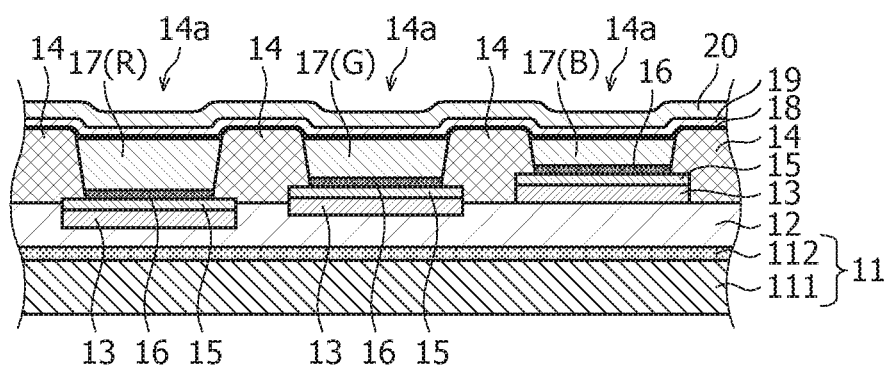

Subsequently, as depicted in FIG. 6C, the counter electrode 20 is formed over the electron injection layer 19 (step S9 in FIG. 7). In the present embodiment, the counter electrode 20 is formed by forming a film of silver, aluminum or the like by a sputtering method or a vacuum deposition method.

(10) Sealing Layer Forming Step

Figure 6D:
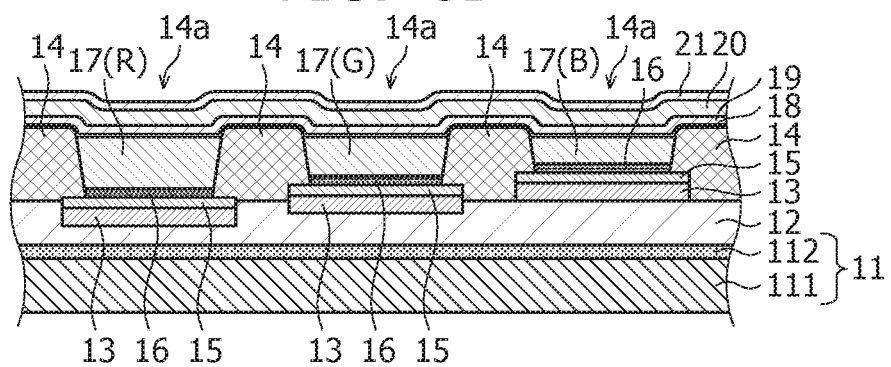

Next, as illustrated in FIG. 6D, the sealing layer 21 is formed over the counter electrode 20 (step S10 in FIG. 7). The sealing layer 21 can be formed by forming a film of SiON, SiN, or the like by a sputtering method, a chemical vapor deposition (CVD) method, or the like.

As a result of these steps, the organic EL display panel 10 is completed.

Note that the above-described manufacturing method is merely an example, and modifications can be made as required.

4. Film Shape of Each Light Emitting Layer

Figure 8:
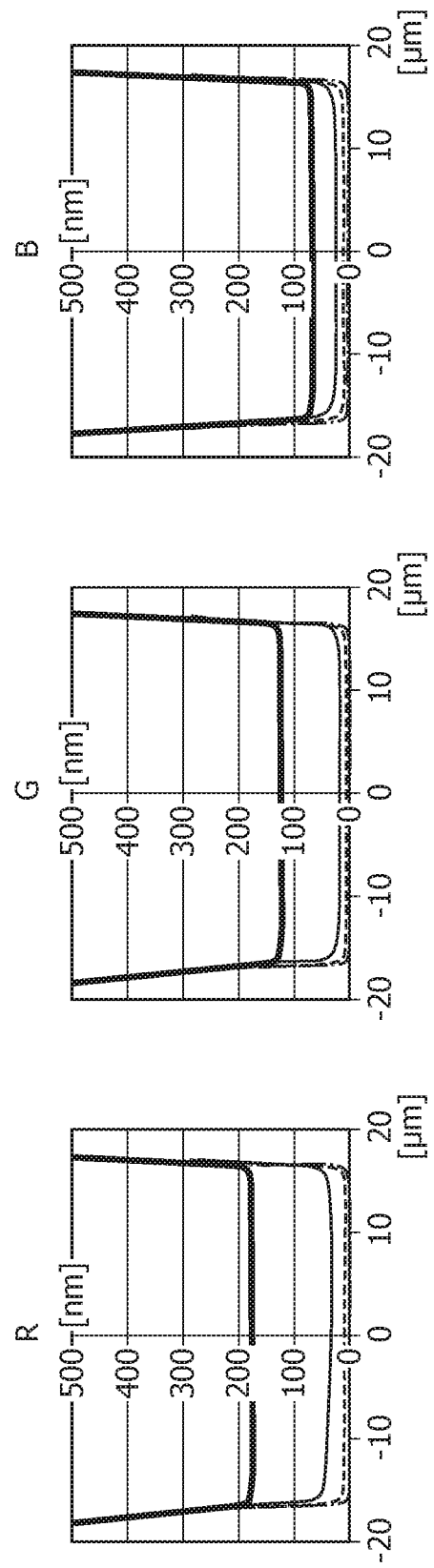
FIG. 8 represents graphs depicting the measurement results of film shape of light emitting layers for colors in a manufacturing method of the organic EL element according to Embodiment 1 as one mode of the preset disclosure.

FIG. 8 represents graphs depicting the measurement results of heights of surfaces of the hole injection layers 15, the hole transport layers 16 and the light emitting layers 17 from the pixel electrodes 13 of RGB organic EL elements in the case where the height of the partition walls 14 is set at 0.8 μm, in the method of manufacturing the organic EL display panel. The R and G organic EL elements are provided with the dug portions 125R and 125G, respectively.

In FIG. 8, the broken line indicates the measured value of the height of the surface of the hole injection layer 15, the solid line (thin line) indicates the measured value of the height of the surface of the hole transport layer 16, and the solid line (thick line) at the uppermost position indicates the measured value of the height of the surface of the light emitting layer 17. Note that each measurement was conducted using an atomic force microscope (AFM).

As depicted in the figure, it is seen that notwithstanding the RGB light emitting layers 17 are differing in film thickness, the film shapes at the upper surfaces of them are even or equivalent for each color, in which a flat portion accounts for substantially the whole of the opening width.

Figure 9:
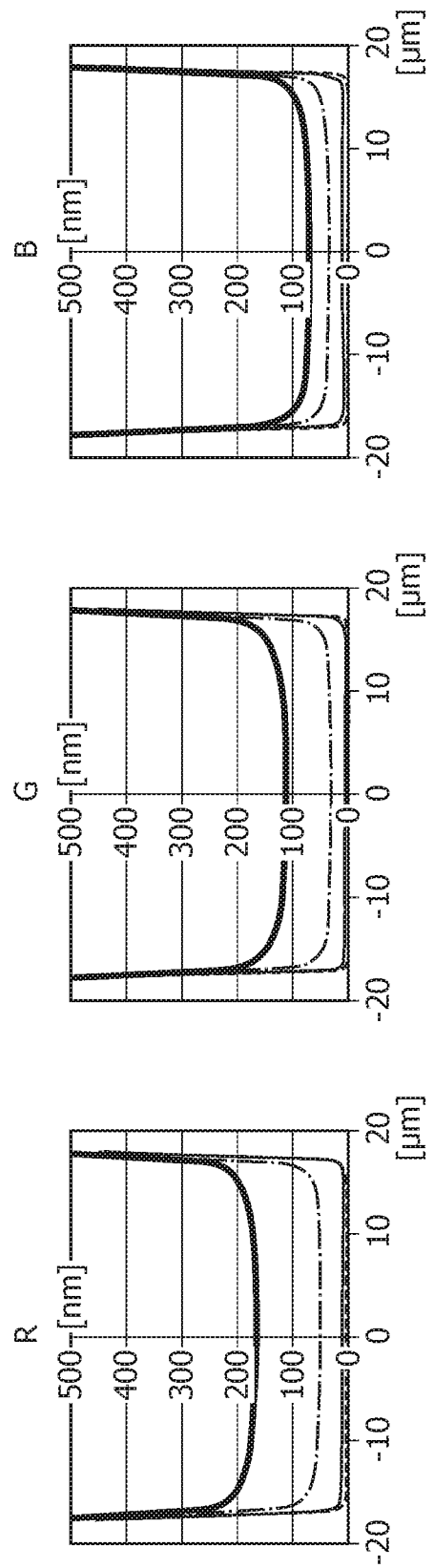
FIG. 9 represents graphs depicting the measurement results of film shape of light emitting layers for colors in the case where the height of partition walls is 1.2 μm.
Figure 10:
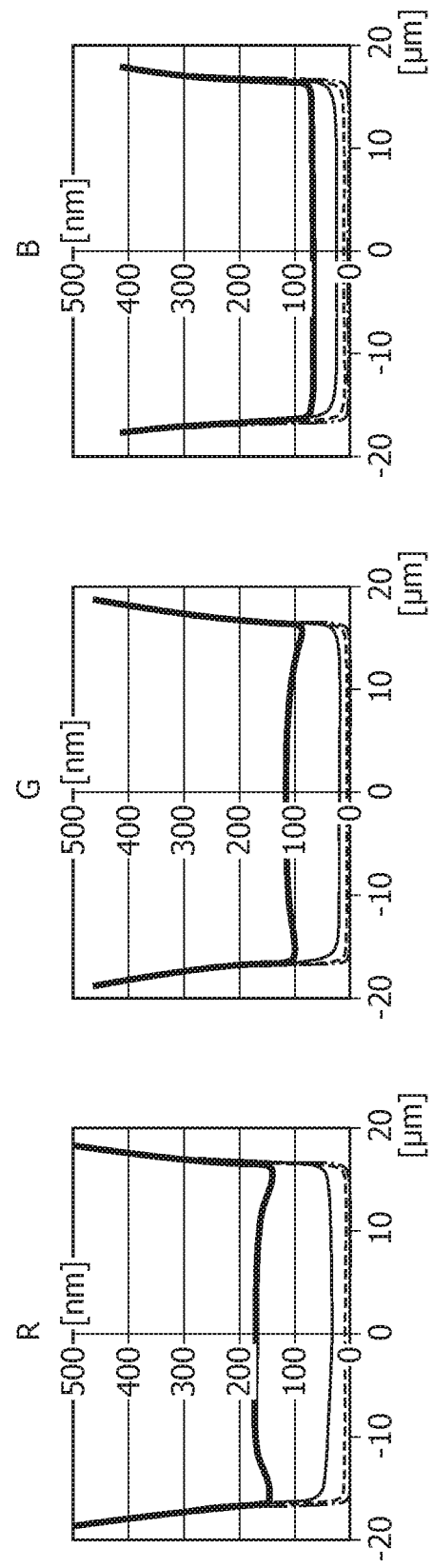
FIG. 10 represents graphs depicting the measurement results of film shape of light emitting layers for colors in the case where the height of the partition walls is 0.5 μm.

In addition, FIG. 9 and FIG. 10 represent similar graphs denoting the measurement results of the film shapes in the case where the height of the partition walls 14 is set at 1.2 μm and 0.5 μm, respectively. In this way, even where the height of the partition walls 14 is changed, the film shapes of the light emitting layers 17 for RGB light emission colors can be substantially made even or equivalent, by adopting the dug structure of the interlayer insulation layer 12 and setting the digging amounts to depths according to the differences between the film thicknesses, like in the present embodiment.

It is to be noted, however, that in the case where the height of the partition walls 14 is 1.2 μm (FIG. 9), the curvature of portions near the partition walls 14 is larger and the area of the flat portion in the center of the opening is slightly smaller, as compared to the case of FIG. 8 (where the height of the partition walls 14 is 0.8 μm).

In addition, in the case of FIG. 10 where the height of the partition walls 14 is 0.5 μm, it is seen that a central portion in the opening is slightly raised to the upper side as compared to both end portions.

FIGS. 11A, 11B, and 11C are schematic diagrams schematically depicting, in an enlarged and slightly exaggerated form, differences in the film shape when the same amount of an ink is dropped to openings different in the height of the partition walls 14.

In a practical manufacturing line, after the ink for the light emitting layer is applied, the substrate is carried into a vacuum drying device to dry the ink; in this case, some waiting time is required after the substrate is carried into the vacuum device until the atmosphere in the device is lowered to a target gas pressure. Since the organic solvent in the ink is generally high in evaporability, the evaporation of the organic solvent progresses even during the waiting time.

The upper part of each of FIGS. 11A, 11B, and 11C schematically depicts a change in the film shape during the waiting time before vacuum drying. The broken line 1701 indicates the surface shape of an ink pool immediately after dropping of the ink, whereas the solid line 1702 indicates the surface shape of the ink pool after the lapse of the waiting time.

As aforementioned, the pinning positions from the top portions of the partition walls 14 are changed little. In addition, the drying speed is not so high at this stage, and the rate of migration of the solute (organic material) in the ink is sufficiently high as compared to the drying speed; therefore, in the case where the partition walls 14 are high as in the upper part of FIG. 11A, a central portion sinks largely. When vacuum drying is conducted thereafter (lower part of FIG. 11A), drying proceeds rapidly with the result of an increase in ink viscosity and slowing-down of the migration rate of the solute; therefore, a film shape indicated by the solid line 1703 is formed, while the shape of the liquid surface in the upper part of the figure is substantially maintained.

In addition, in the case where the height of the partition walls 14 is lower than that in the case of FIG. 11A and it is balanced with the dropping amount of the ink as depicted in FIG. 11B, the surface of the ink pool is substantially flat as indicated by the solid line 1702 in natural drying before vacuum drying, as depicted in the upper part of FIG. 11B, and rapid drying with the film shape kept substantially as it is proceeds during vacuum drying (see the solid line 1703 in the lower part of FIG. 11B).

Further, in the case where the height of the partition walls 14 is further lower than that in the case of FIG. 11B as depicted in FIG. 11C, the film shape is slightly swollen to the upper side (solid line 1702) in natural drying before vacuum drying, as depicted in the upper part of FIG. 11C, and rapid drying with the film shape kept substantially as it is proceeds during vacuum drying (see the solid line 1703 in the lower part of FIG. 11C).

In this way, where the height of the partition walls 14, more specifically, the volume of the opening below the pinning positions determined by the height of the partition walls 14 and its liquid repellency and the surface tension of the ink, the dropping amount of the ink, the kind of the solvent, and the like are controlled suitably, a better film shape of the light emitting layer in which the proportion of a flat portion is not less than a predetermined value can be obtained thereby.

Figure 12:
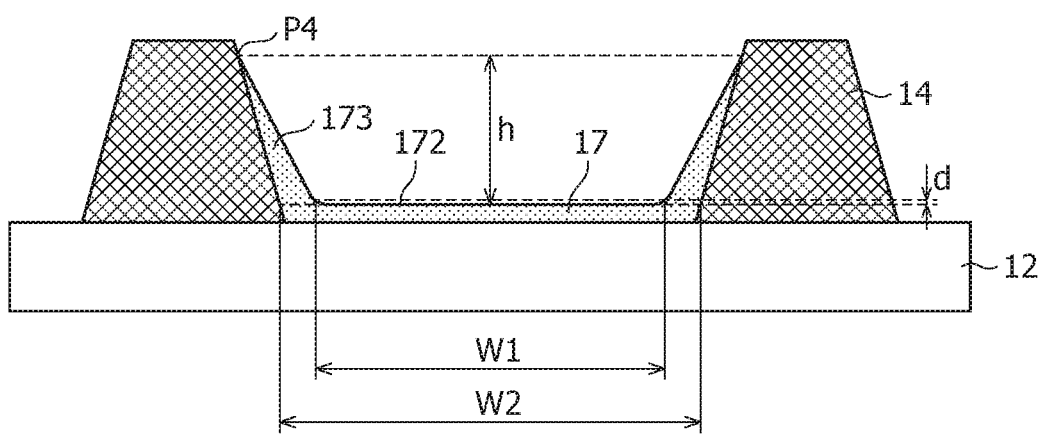
FIG. 12 is a schematic sectional view for defining a flat portion in the film shape of the light emitting layer.

FIG. 12 is a schematic view depicting, in an enlarged form, the film shape of the blue light emitting layer 17 formed in the case of FIG. 11B.

As illustrated in this figure, the light emitting layer 17 includes a central flat portion 172, and ride-up portions 173 riding up to the pinning positions P4 along side surfaces of the partition walls 14.

Note that on a microscopic basis, the "flat portion" may be influenced by the surface shape of the ground or the like factor, and the surface of the flat portion 172 may be formed with minute ruggedness. Here, a continuous region such that the difference between its height and the height of the surface of a thinnest portion of the central portion of the film shape of the light emitting layer 17 is within 400 nm is defined as the "flat portion"; then, it is desirable that the proportion of the width W1 of the flat portion in the direction (FIG. 2: X direction) orthogonal to the extending direction (column direction) of the partition walls 14 to the narrowest width W2 in the X direction of the opening 14a between the adjacent partition walls 14 (the proportion will hereinafter be referred to as "flatness ratio") is not less than 90%. By this configuration, a desirable numerical aperture and a desirable light emission efficiency can be obtained in regard of each of the sub-pixels.

Then, in order to satisfy the conditions concerning the flatness ratio of the film shape mentioned above, experiments similar to those of FIGS. 8 to 10 were conducted while changing the forming conditions (the height of the partition walls, the material for the partition walls, the materials of the solvents in the inks, and the dropping amounts of the inks). As a result of the experiments, it was found desirable to determine the forming conditions such that the difference h (see FIG. 12) between the height of the pinning position P4 and the height of the lowest position of the central portion of the film shape of the light emitting layer is not more than 700 nm.

Note that in order to obtain a further excellent light emission efficiency, it is more desirable that the flatness ratio of a flat portion where the difference between its height and the height of the surface of a thinnest portion of the central portion of the film shape of the light emitting layer 17 is within 100 nm is not less than 90%.

Then, where dug portions with depths corresponding to the difference are provided in the interlayer insulation layer 12 in the openings where the red and green light emitting layers greater in film thickness than the blue light emitting layer are to be formed, the film shapes of the light emitting layers corresponding to the respective light emission colors can be made even or equivalent in an optimum state.

5. Relation Between Amount of Ink Required and Digging Amount

FIG. 13 is a table representing the results of estimation of the amounts of inks required in the case where target film thicknesses of the light emitting layers 17(R), 17(G), and 17(B) are set at 0.12 μm, 0.08 μm, and 0.04 μm, respectively.

Note that in the table, the amount of each ink is described, in the unit of μm, as the height (liquid height) of the ink upper surface (liquid surface) from the ground (in the present embodiment, the ground is the hole transport layer 16, but, here, for convenience of explanation, the surface of the interlayer insulation layer 12 not provided with the dug portion is deemed as the ground), in the case where it is assumed that the sectional area of the ink pool in a plane orthogonal to the normal to the substrate is constant.

In addition, the height of the partition wall required is determined from the ground, assuming that even in the case where the material of the partition wall does not have liquid repellency and the ink in an amount of 3 μm is built up on the height of the partition wall, the ink pool can be maintained (the ink does not overflow) due to the surface tension of the ink. Each of the ink concentrations is expressed in volume percent.

In the table in FIG. 13, for example, in the case where the ink concentration is 0.5%, for obtaining the film thicknesses of the R, G, and B light emitting layers of 0.12 μm, 0.08 μm, and 0.04 μm, respectively, the ink amount in terms of the liquid height should be 24 μm, 16 μm, and 8 μm, respectively.

Since the film thickness of the B light emitting layer is the smallest, it is unnecessary to provide a dug portion in the interlayer insulation layer in this part, and the liquid height of the blue ink becomes a reference in determining the height of the partition wall required. In the case where the ink can be built up to 3 μm above the partition wall as aforementioned, a value of 5 μm obtained by subtracting the just-mentioned 3 μm from the liquid height of 8 μm of the blue ink becomes the height of the partition wall required.

A value of 16.0 μm obtained by subtracting the minimum of the ink liquid height (8 μm for B) from the maximum of the ink liquid height (24 μm for R) becomes the digging amount Δ (Δ=MAX−MIN) in the interlayer insulation layer of the R organic EL element. Besides, the digging amount in the interlayer insulation layer of the green (G) organic EL element is 16 μm−8 μm=8 μm.

For other ink concentrations, the partition wall height and the digging amount have been determined similarly.

Note that in the case where the ink concentration is not less than 1.6%, the liquid height indicative of the blue ink amount is less than 3 μm of the ink build-up height, and, therefore, it is considered allowable on a calculation basis that the height of the partition wall is 0 μm; however, it is practically desirable that the partition wall height is at least 0.1 μm, for the partition wall to serve as a partition in building up the ink.

In the case where the ink concentration is the same for the RGB inks as aforementioned, and where the ink concentration is in the range of 0.5% to 10%, the height of the partition wall required is in the range of 0.1 to 5.0 μm, and the digging amount in the R organic EL element is in the range of 0.8 to 16 μm.

It is to be noted, however, that the foregoing is merely an example of estimation in a model case, and, therefore, suitable correction factors are determined through experiments or the like, and are applied to actual design.

Now, a case where the ink concentrations for light emission colors are changed without forming the dug portions in the interlayer insulation layer 12 will be investigated.

According to the table in FIG. 13, for example, in the case where the partition wall height is 2.0 μm, the ink for forming the light emitting layer for blue light emission requires an ink amount corresponding to a liquid height of 5 μm at an ink concentration of 0.8%. If the liquid height concerning the ink amount is intended to be the same 5 μm using the ink for green light emission, the ink concentration should be set at 1.6%; further, if the liquid height concerning the ink amount is intended to be the same 5 μm using the ink for red light emission, the ink concentration should be raised to 2.4%.

However, in order to smoothly eject the inks from the nozzles of the printing device and to achieve accurate positioning, the ink concentration (viscosity) is an important factor, and it is considered that certain limits exist as to the range within which the ink concentration is variable. Particularly, in the above example, the ink concentration of the ink for red light emission is as high as three times the ink concentration of the ink for blue light emission, and the viscosities of the inks are largely different. Therefore, the pinning positions may be instable between the light emitting layers for the respective light emission colors, or differences may be generated in the degree of wetting and spreading of the ink into the opening, possibly making the film shapes uneven.

In addition, when the ink concentration is raised, it may cause the generation of troubles such as nozzle clogging in the printing device. Further, management of ink concentrations is laborious, and there is a keen demand for lowering the manufacturing cost by using the same printing device and the same inks, as much as possible, in response to design modifications and to models differing in specifications.

In consideration of the above-mentioned points, it is desirable to avoid, as much as possible, changes in the existing ink concentrations, and to control the film thickness by regulating the ink dropping amount which is easier to control. In this case, by regulating the digging amounts of the interlayer insulation layer in the organic EL elements for respective light emission colors as above-mentioned to thereby make the film thicknesses even or equivalent, it is possible to obtain a high-image-quality organic EL display panel with a good light emission efficiency and with little variability in numerical aperture among the light emission colors.

6. Effect (Conclusion)

(1) According to the organic EL display panel 10 of Embodiment 1, it is possible, in the case where the light emitting layers for respective light emission colors are different in film thickness, to uniformize the film shapes of the light emitting layers for the light emission colors by controlling the digging amounts in the interlayer insulation layer in accordance with the layer thicknesses required. In addition, by setting the heights of partition walls to predetermined values, it is possible to improve the flatness ratio of the light emitting layers after drying, and thereby to enhance light emission efficiency.

Here, specific digging amounts in the organic EL elements for respective light emission colors can be determined by the following method.

(a) The film thicknesses of the flat portions of the light emitting layers for respective light emission colors are determined by an optical design for constructing an optical resonant structure.

(b) The amounts of inks to be dropped to respective light emitting layer forming positions are determined from the film thicknesses of the color light emitting layers determined, the concentrations of the inks to be used, and the shapes (volumes) of the openings where to form the light emitting layers.

(c) With the surface shape of the ink pool corresponding to a specific light emission color (blue, in the above-mentioned example) used as a reference, the digging amounts in the organic EL elements for the other light emission colors are determined in such a manner that the surface shapes of the ink pools for the other light emission colors will be the same (namely, in such a manner that the ink amounts of the ink pools above the pinning position (hereinafter referred to as "ink build-up amounts") will be the same).

In addition, the heights of the partition walls are determined in such a manner that the flatness ratios of the light emitting layers after drying will be not less than 90%, while setting the ink build-up amounts in (c) above to within appropriate ranges (see FIG. 11B). Specifically, the heights of the partition walls may be set such that the difference between the height of the central position of the light emitting layer after drying and the height of the pinning position will be not more than 700 nm.

As a result, it is possible to provide an organic EL display panel that is excellent in light emission efficiency and is capable of high-quality image display, while efficiently forming the organic light emitting layers by a wet process.

(2) Besides, by forming the interlayer insulation layer by using a photosensitive resin material and performing exposure and development using a halftone mask varied in light transmittance in the interlayer insulation layer forming step, the dug portions differing in depth can be formed at a stroke; therefore, a great effect can be obtained notwithstanding the number of steps is not so increased.

Modifications of Embodiment 1

While the embodiment of the organic EL display panel and the method of manufacturing an organic EL display panel are described above as a mode of the present disclosure, the disclosure is not limited by the above description, except for its essential characteristic configuration elements. Modifications as other modes of the present disclosure will be described below.

(1) Modifications of Interlayer Insulation Layer Forming Step

While the dug portions differing in depth are formed in the interlayer insulation layer 12 by a single photolithography step utilizing the halftone mask in Embodiment 1 described above, this naturally is not restrictive.

(1-1) Case of Performing Multilayer Exposure

FIGS. 14A, 14B, 14C and 14D are schematic views depicting a first modification for forming dug portions in the interlayer insulation layer 12.

In the present modification, the interlayer insulation layer 12 is formed using a positive-type organic resin material.

Figure 14A:
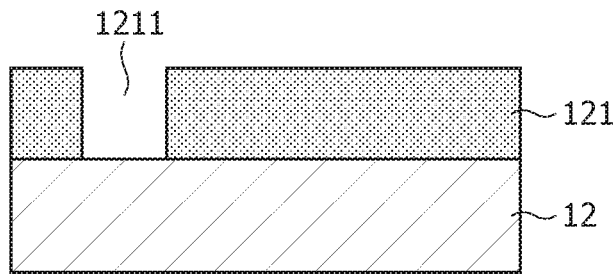
FIGS. 14A, 14B, 14C and 14D are schematic views for explaining another example of steps of forming dug portions in an interlayer insulation layer according to Embodiment 1.
Figure 14B:
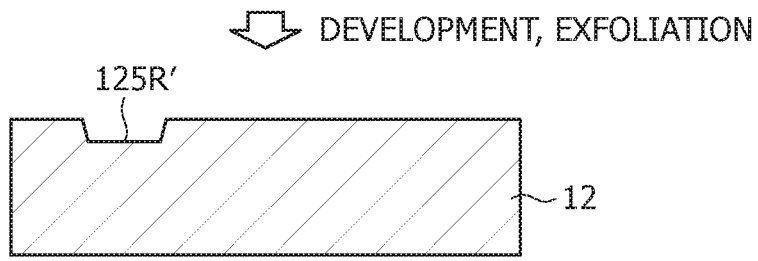

First, the surface of the interlayer insulation layer 12 is subjected to an exposure treatment through a mask 121 for full exposure of only the part corresponding to a dug portion 125R (FIG. 14A), and, after development, unrequired parts are washed away by cleaning, to perform first-time digging at the part where to form the dug portion 125R, thereby forming a dug portion 125R' (FIG. 14B).

Figure 14C:
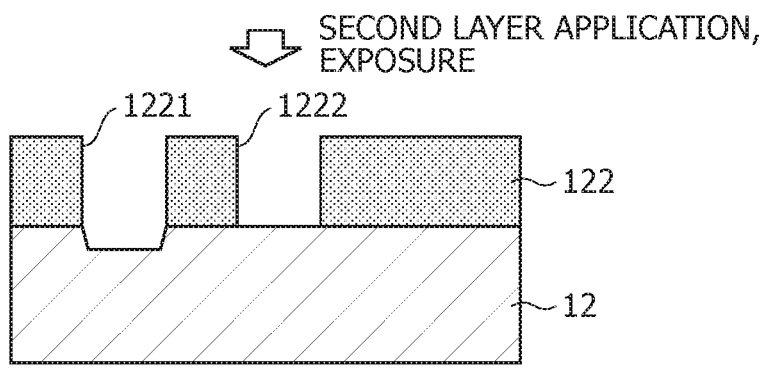
Figure 14D:
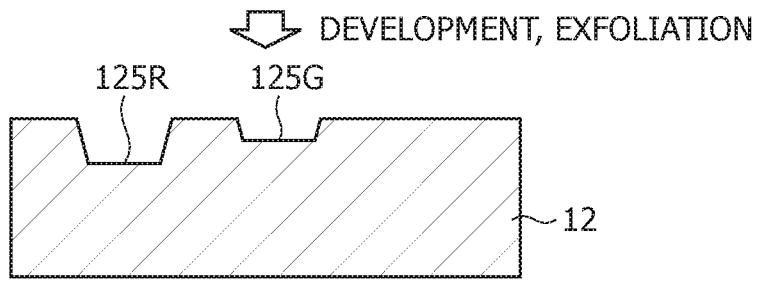

Next, the interlayer insulation layer 12 is subjected to exposure using a mask 122 for full exposure of the parts corresponding to the dug portion 125R and a dug portion 125G (FIG. 14C). Thereafter, development is conducted, after which unrequired parts are washed away by cleaning, whereby the dug portions 125R and 125G are formed (FIG. 14D).

The exposure amounts in first-time exposure and second-time exposure are determined in such a manner that the depths of the dug portions 125R and 125G will be target values.

In Embodiment 1, since the transmittances of the halftone portions of the photomask are specified, there is a merit that the number of steps can be reduced, but, on the other hand, there is the demerit of poor versatility of the mask. In contrast, according to the present modification, various digging amounts can be set by only controlling the exposure amounts in the first-time exposure and the second-time exposure; therefore, the depths of the dug portions can be controlled while flexibly coping with a change of the model and modifications of the kinds of the inks.

(1-2) Case of Performing Etching Treatment

FIGS. 15A, 15B, 15C and 15D and FIGS. 16A, 16B, 16C and 16D are schematic views depicting a modification in the case of forming dug portions 125R and 125G by etching.

Figure 15A:
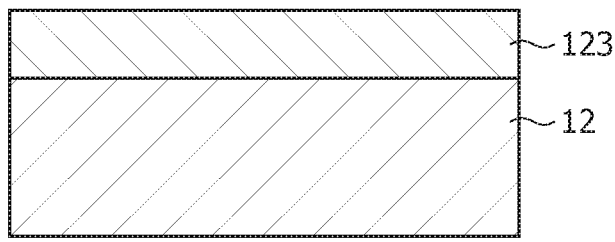
FIGS. 15A, 15B, 15C and 15D are schematic views for explaining another example of the steps of forming dug portions in the interlayer insulation layer according to Embodiment 1.
Figure 15B:
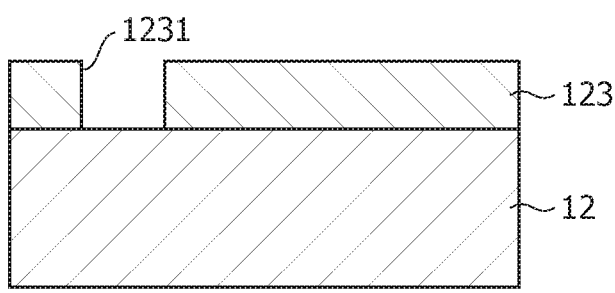
Figure 15C:
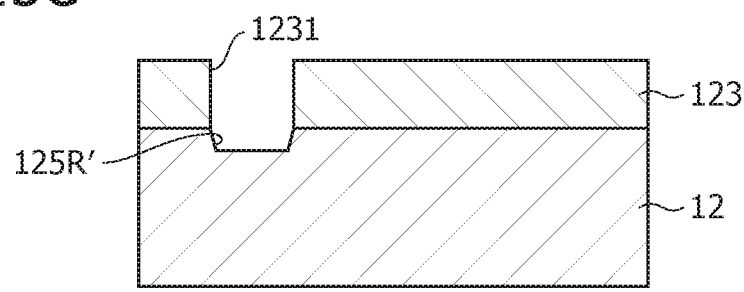
Figure 15D:
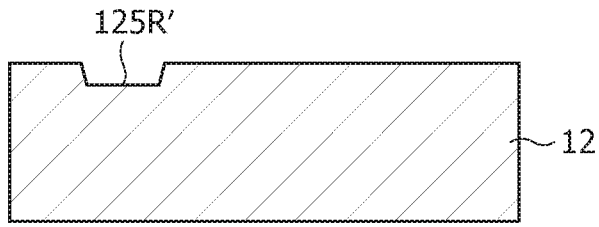

First, a resist 123 is applied to the surface of the interlayer insulation layer 12 (FIG. 15A). Then, using a mask (not illustrated), exposure, development and cleaning are applied to that position of the resist 123 which corresponds to the dug portion 125R, to form an opening 1231 in the resist 123 (FIG. 15B), and a dry etching treatment is conducted using the resist 123 as a mask, to form a dug portion 125R' in the interlayer insulation layer 12 (FIG. 15C). Then, the resist 123 is removed by an organic solvent such as acetone (FIG. 15D).

Figure 16A:
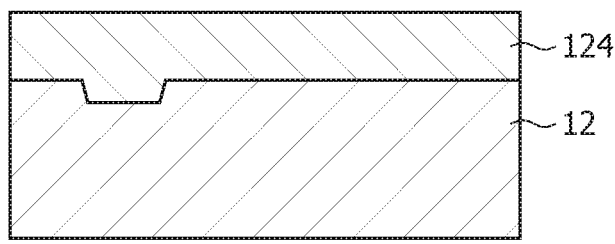
FIGS. 16A, 16B, 16C and 16D are schematic views depicting the steps subsequent to FIGS. 15A, 15B, 15C and 15D.
Figure 16B:
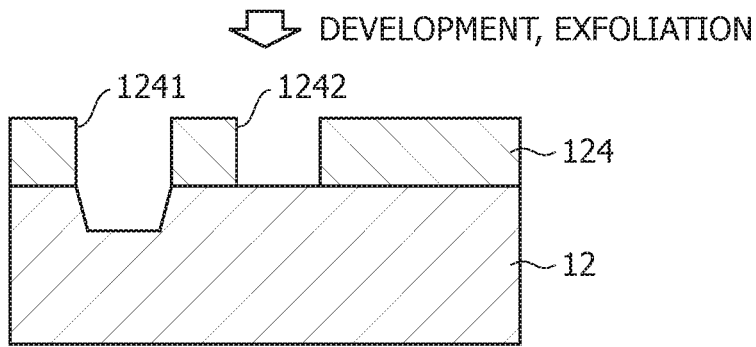
Figure 16C:
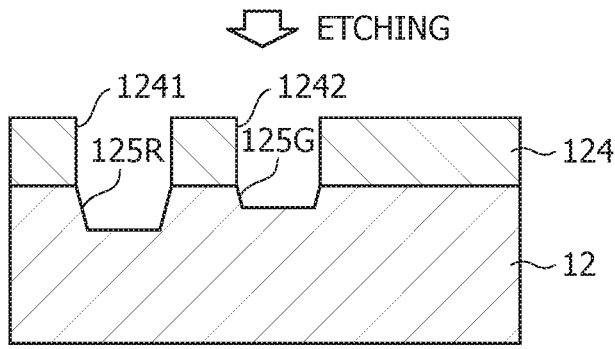
Figure 16D:
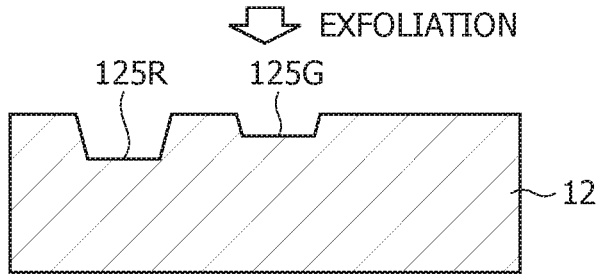

Next, as depicted in FIG. 16A, a resist 124 is applied onto the interlayer insulation layer 12. Then, using a mask (not illustrated), exposure, development and cleaning are applied to those positions of the resist 124 which correspond to the dug portions 125R and 125G, to form openings 1241 and 1242 in the resist 124 (FIG. 16B), and a dry etching treatment is performed using the resist 124 as a mask, to form the dug portions 125R and 125G in the interlayer insulation layer 12 (FIG. 16C). Then, the resist 124 is removed by an organic solvent such as acetone (FIG. 16D).

Note that wet etching may be conducted in place of the dry etching, for forming the dug portions 125R and 125G.

In addition, a pretreatment step of conditioning the surface of the interlayer insulation layer 12 by subjecting the interlayer insulation layer 12 to full exposure may be provided before FIG. 14A and FIG. 15A.

(2) In Embodiment 1, the partition walls 14 and the pixel restriction layers 141 which are different in height are simultaneously formed by a single step by using the halftone mask. However, the partition walls 14 and the pixel restriction layers 141 may be formed in separate steps.

For example, first, the pixel restriction layers 141 for partitioning the pixel electrode columns in the Y direction are formed.

In a specific method of forming the pixel restriction layers 141, a resin material is applied to the upper surface of the substrate 11 formed with the pixel electrodes 13 by, for example, a die-coating method or the like. Then, using a photolithography method, the resin material is patterned such as to form the pixel restriction layers 141 between the pixel electrodes 13 adjacent to each other in the Y direction, and thereafter baking is conducted, whereby the pixel restriction layers 141 can be formed.

Next, a partition wall resin as a material for the partition walls 14 is uniformly applied by, for example, a die coating method or the like to form a partition wall material layer, the partition wall material layer is patterned by a photolithography method, and thereafter baking is conducted, to form the partition walls 14.

(3) Modification of Stacked Structure of Organic EL Element

In Embodiment 1 above, the organic EL element has a stacked configuration which includes the electron transport layer 18, the electron injection layer 19, the hole injection layers 15, and the hole transport layers 16, but this is not limitative. For example, an organic EL element lacking the electron transport layer 18 or an organic EL element lacking the hole transport layers 16 may also be adopted. In addition, for example, an organic EL element may have a single layer of hole injection and transport layer in place of the hole injection layer 15 and the hole transport layer 16. Besides, for example, an intermediate layer including an alkali metal may be provided between the light emitting layer 17 and the electron transport layer 18.

However, a minimum configuration for exhibiting a function as an organic EL element (a basic configuration in which an organic light emitting layer is interposed between a pixel electrode and a counter electrode) should be provided.

(4) In the organic EL display panel 10 according to Embodiment 1 above, the extending direction of the pixel restriction layers 141 is the long axis X direction of the organic EL display panel 10, whereas the extending direction of the partition walls 14 is the short axis Y direction of the organic EL display panel 10 as illustrated in FIG. 2. However, the extending directions of the pixel restriction layers 141 and the partition walls 14 may be reverse to the above-mentioned. In addition, the extending directions of the pixel restriction layers and the partition walls may be directions having no relation with the shape of the organic EL display panel 10.

Besides, in the organic EL display panel 10 according to Embodiment 1 above, the shape of the image display surface is a rectangular shape, as an example. However, the shape of the image display surface is not limited, and can be modified as required.

In addition, in the organic EL display panel 10 according to Embodiment 1 above, the pixel electrodes 13 are rectangular flat plate-shaped members, but this is not limitative.

Further, while an organic EL display panel of the line bank system is described in Embodiment 1 above, an organic EL display panel of a so-called pixel bank system in which each sub-pixel is surrounded by partition walls on four sides thereof may be adopted.

(5) While the sub-pixels 100R, 100G, and 100B that emit light respectively in R, G, and B colors are arranged in the organic EL display panel 10 according to Embodiment 1 above, this is not limitative of the light emission colors of the sub-pixels. For example, four colors including yellow (Y) in addition to R, G, and B may be adopted. In addition, in one pixel P, the number of sub-pixels per one color is not limited to one, and a plurality of sub-pixels may be arranged per one color. Besides, the arrangement of the sub-pixels in the pixel P is not limited to the order of red, green, and blue as depicted in FIG. 2, and an order obtained by rearranging this may be adopted.

In the case where three or more light emission colors are thus provided and when the sub-pixels for emitting light in two different colors of these light emission colors are made to be a first light emitting section and a second light emitting section, film shapes more uniform than in the related-art can be obtained by a method in which the depths of the dug portions in the interlayer insulation layer 12 are made to be different according to the film thicknesses of the light emitting layers for the light emission colors.

(6) In Embodiment 1 above, the organic EL element for emitting light in blue which is the shortest in wavelength of the light emission colors is the smallest in film thickness, and, therefore, a dug portion is not provided in the interlayer insulation layer in this part. However, a dug portion may be provided also in this part, depending on the case. In that case, the digging amounts of the interlayer insulation layer in the areas of the sub-pixels for the red and green light emission colors are also increased accordingly.

(7) In Embodiment 1 above, the dug portion (dug portion 125R) of the organic EL element which is large in thickness of the light emitting layer is formed to be deeper than the dug portion (dug portion 125G) which is smaller in thickness of the light emitting layer. However, the large-small relation of the thickness of the light emitting layer and the large-small relation of the digging amount do not necessarily coincide with each other.

Now, a case where the ink concentration can be modified on the basis of light emission color within a range permitted by the specifications of the printing device to be used is assumed. For example, in the table in FIG. 13, a case where the R ink concentration is 1.6% and the G ink concentration is 1.0% is considered. In this case, the amount of the R ink required in terms of liquid height is 7.5 μm, while that for the G ink is 8.0 μm, so that the amounts of ink required is reversed between R and G, and, as a result, the digging amount of the dug portion 125G is greater than the digging amount of the dug portion 125R.

(8) In Embodiment 1 above, in order to obtain an optical resonant effect by making the pixel electrodes 13 light-reflective, the film thicknesses of the light emitting layers are controlled such that the optical path difference satisfies predetermined conditions. However, the optical resonant effect may be obtained by modifying the film thicknesses of the hole injection layers and/or the hole transport layers located below the light emitting layers, in addition to or in place of the film thickness of the light emitting layers. In short, it is sufficient to control the film thickness of the organic layers as a whole, inclusive of the light emitting layers.

Even in the case where the hole injection layers and the hole transport layers are formed by a wet process to make different their film thicknesses, a problem similar to that at the time of forming the light emitting layers is generated, and, therefore, dug portions should be formed.

(9) It is desirable that the shape of the bottom surface of the dug portion is as flat as possible. If the bottom surface is curved, the shape influences the surface shape of each of the layers stacked thereover, making it difficult to make flat the film shape of the light emitting layer.

It is to be noted, however, that the "flatness" required of the dug portions is primarily for making even or equivalent the film shapes of the light emitting layers for respective colors, and, therefore, an extent of flatness comparable to that of the surface of the interlayer insulation layer 12 of the blue organic EL element not provided with a dug portion is sufficient.

In addition, in the example depicted in FIG. 3, the digging amounts of the dug portions 125R and 125G are not so large, the side surface shapes of the dug portions do not matter much. However, in the case where the dug portion is deep and the light emitting layer or other organic layer makes contact with an inside surface of the dug portion as depicted in FIG. 19B, it is desirable that the inside surface of the dug portion is formed to be continuously linked to the inside surface of the dug portion as depicted in FIG. 19B, and the angle formed between the inside surface of the dug portion and the inside surface of the dug portion is as small as possible.

If a step is formed at a joint part between the inside surface of the dug portion and the inside surface of the dug portion or a gap is formed at a bottom of the partition wall, pinning might be formed at that part, and it might be difficult to form the light emitting layer in the film shape as designed.

(10) While the pixel electrodes 13 are anodes and the counter electrode 20 is a cathode in the organic EL display panel 10 according to Embodiment 1 above, this is not limitative, and there may be adopted a reverse structure in which the pixel electrodes 13 are cathodes and the counter electrode 20 is an anode. In the case of providing the hole injection layers, the hole transport layers, the electron transport layer, the electron injection layer and the like, the order of stacking of the layers is corrected, as required, according to the positions of the cathode and the anode.

(11) In addition, while the active matrix system is adopted in the organic EL display panel 10 according to Embodiment 1 above, this is not restrictive, and a passive matrix system may also be adopted.

Figure 17:
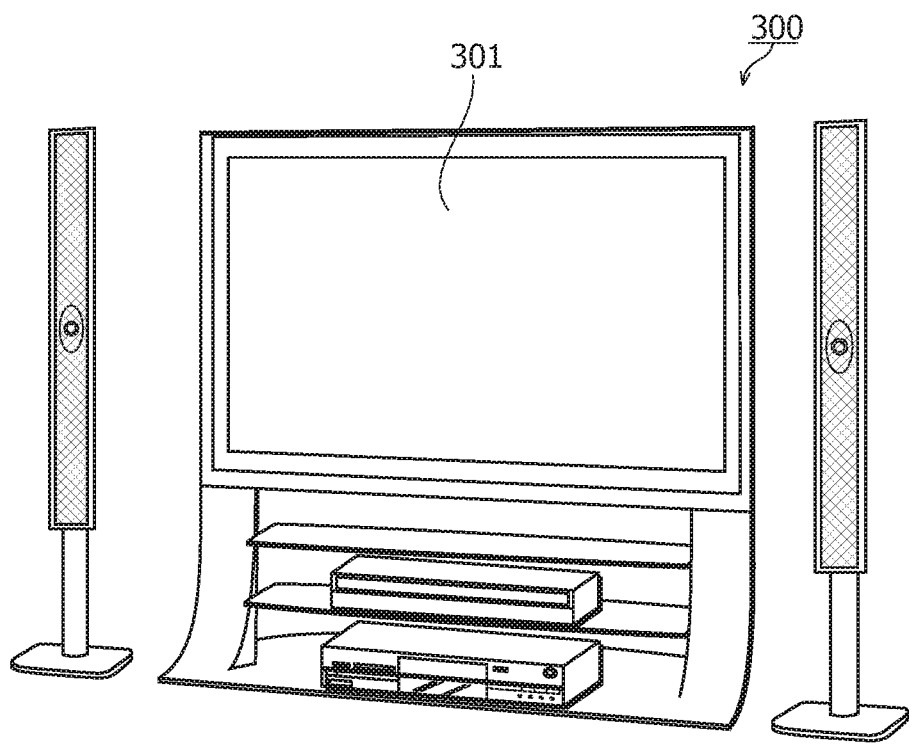
FIG. 17 depicts an example of a television device using the organic EL display panel according to Embodiment 1 as one mode of the present disclosure.

(12) The organic EL display panel illustrated in Embodiment 1 above can be used not only as a display section 301 of a television set 300 as depicted in FIG. 17, but also as a display panel of any of various electronic apparatuses such as personal computers, portable terminals, and displays for business.

Embodiment 2

How Embodiment 2 of the Present Disclosure has been Reached

In the case of forming a functional layer by a coating system (application system), an ink in which a material is dissolved is applied to gaps between partition walls. Hereinafter, the functional layer formed by the coating (application) system will be referred to also as a coating film. Since upper parts of top portions and side wall portions of the partition walls are given liquid repellency for preventing the inks from overflowing, the inks applied do not adhere to the liquid-repellent parts of the side wall portions. On the other hand, the ink adhered to lyophilic parts of the side wall portions that are not given liquid repellency remains there without falling even after drying, and, therefore, a contact point between the coating film and the side wall portion is fixed (pinned) to the interface between the liquid repellent part and the lyophilic part. Specifically, as illustrated in FIGS. 30A, 30B and 30C, an ink 2701 applied is dried to be an ink 2702 reduced in volume, and is then dried as a coating film 2703, during which the contact parts (pinning positions) of contact with the partition walls 54 do not change. Note that the height of the interface between the liquid repellent part and the lyophilic part usually depends on the height of the partition walls, if the material of the partition walls and the manufacturing method are the same.

On one hand, the film thickness of the functional layer is determined by various requirements such as exhibition of a light emitting function, a carrier injecting function, a carrier transporting function, a carrier blocking function or the like function of the functional layer, light transmittance, and film thickness for realizing the optical resonant structure. Therefore, the organic EL elements different in the light emission color of the light emitting layer are often different also in optimum film thickness. On the other hand, if there is a step between the height of the pinning positions and the height of the upper surfaces of the light emitting layer and the functional layer as described above, variability is generated in the film thicknesses of the light emitting layer and the functional layer. Therefore, in this case, it is necessary to vary the pinning position for each light emission color. For example, as depicted in a schematic sectional view in FIG. 22A, when partition walls 814 of the same height are formed using the same material, pinning positions are the same, and, therefore, variability is generated in the film thicknesses of the light emitting layers. Specifically, there may arise a situation in which since the pinning positions are high in relation to the film thickness of a light emitting layer 917a, an upper surface of the light emitting layer 917a becomes concave in shape, whereas since the pinning positions are low in relation to the film thickness of a light emitting layer 917b, an upper surface of the light emitting layer 917b becomes convex in shape. In other words, the light emitting layer 917a is in a state where the pinning positions are too high as depicted in FIG. 30A, whereas the light emitting layer 917b is in a state where the pinning positions are too low as depicted in FIG. 30C.

As a method for solving this problem, there may be considered, for example, a method in which control of the heights of the partition walls is conducted to obtain a state of optimum pinning positions as depicted in FIG. 30B. However, in the case where the heights of the partition walls are changed on a partition wall basis, the heights of the two partition walls partitioning a partition wall gap between them become different from each other, as depicted in a schematic sectional view in FIG. 22B. Specifically, at a light emitting layer 927a, a partition wall 824a is higher than a partition wall 824b; therefore, of the light emitting layer 927a, the pinning position with the partition wall 824a is higher than the pinning position with the partition wall 824b. Accordingly, of the light emitting layer 927a, the film thickness on the partition wall 824a side becomes larger, generating unevenness in film thickness. Similarly, of the light emitting layer 927b, also, the film thickness on the partition wall 824a side becomes larger, generating unevenness in film thickness. This unevenness in film thickness is caused by the structure in which the two partition walls adjacent to the partition wall gap are different in height. Specifically, the control of the heights of the partition walls should be conducted not on the partition wall basis but on the basis of the partition wall gap faced by the partition walls.

The present inventors made investigations on an organic EL display panel in which the pinning positions and the heights of the partition walls could be suitably designed while integrally forming a lyophilic part and a liquid-repellent part of each partition wall, and, as a result of the investigations, the present disclosure has been reached.

Outline of Embodiment 2 of the Present Disclosure

An organic EL display panel according to one mode of the present disclosure includes a substrate, an interlayer insulation layer disposed on an upper side of the substrate, a plurality of pixel electrodes arranged in a matrix pattern over the interlayer insulation layer, a plurality of partition walls disposed over the interlayer insulation layer and extending in a column direction over gaps between the pixel electrodes in a row direction, a first light emitting layer disposed on an upper side of the pixel electrode in a first gap selected from among a plurality of gaps between the partition walls adjacent to each other in the row direction, a second light emitting layer disposed on an upper side of the pixel electrode in a second gap adjacent to the first gap in the row direction, and a counter electrode disposed on an upper side of the first light emitting layer and on an upper side of the second light emitting layer. The film thickness of the first light emitting layer is greater than the film thickness of the second light emitting layer. The partition wall present between the first gap and the second gap is configured such that, with the substrate as a reference, the height of a lower surface of a first partition wall portion present on the first gap side is higher than the height of a lower surface of a second partition wall portion present on the second gap side, the height of an upper surface of the first partition wall portion is higher than the height of an upper surface of the second partition wall portion, and the height of an upper surface of the pixel electrode in the first gap and the height of an upper surface of the pixel electrode in the second gap are equal.

In addition, a method of manufacturing an organic EL display panel according to one mode of the present disclosure includes a step of forming an interlayer insulation layer on an upper side of a substrate, a step of forming a plurality of pixel electrodes in a matrix pattern over the interlayer insulation layer, a step of forming a plurality of partition walls over the interlayer insulation layer along a column direction such as to partition the pixel electrodes in a row direction, a step of applying an ink containing a light emitting material to a first gap selected from a plurality of gaps between the partition walls adjacent to each other in the row direction, to form a first light emitting layer, a step of applying an ink containing a light emitting material to a second gap adjacent to the first gap in the row direction, to form a second light emitting layer having a film thickness smaller than the film thickness of the first light emitting layer, and a step of forming a counter electrode on an upper side of the first light emitting layer and the second light emitting layer. A raising part adjacent to the first gap in the row direction and extending in the column direction is formed before forming the plurality of partition walls. In the step of forming the plurality of partition walls, the height of an upper surface of a first partition wall portion adjacent to the first gap is set higher than the height of an upper surface of a second partition wall portion adjacent to the second gap.

According to the organic EL display panel of the above-mentioned mode or the manufacturing method of the above-mentioned mode, both the first light emitting layer and the second light emitting layer have pinning positions according to the film thickness, and, therefore, it is possible to realize an organic EL display panel in which preferable film thickness control is made. In addition, since the pixel electrodes are uniform in height, a pixel electrode producing step can be simplified.

Besides, the organic EL display panel according to the above-mentioned mode or the manufacturing method according to the above-mentioned mode may be configured as follows.

An upper surface of the interlayer insulation layer may have a raising projection projecting upward at its part making contact with a lower surface of the first partition wall portion.

In addition, the raising part may be formed by forming an upper surface of the interlayer insulation layer with a projection, in the step of forming the interlayer insulation layer.

As a result, the height of an upper surface of the first partition wall portion can be made higher than the height of an upper surface of the second partition wall portion by the raising projection, and, therefore, the partition wall forming step can be simplified.

Besides, a raising layer may further be provided between the substrate and the first partition wall portion.

In addition, the raising part may be formed by a step of forming a raising layer adjacent to the first gap in the row direction and extending in the column direction, over the interlayer insulation layer.

As a result, also, the height of the upper surface of the first partition wall portion can be made higher than the height of the upper surface of the second partition wall portion by the raising layer, and, therefore, the partition wall forming step can be simplified.

Besides, the raising layer may be integrally molded together with a second partition wall partitioning the pixel electrodes in the column direction.

In addition, a step of forming over the interlayer insulation layer a plurality of second partition walls along the row direction such as to partition the pixel electrodes in the column direction may be included before forming the partition walls, and the raising part may be formed simultaneously with the second partition walls in the step of forming the second partition walls.

As a result, the second partition walls and the raising layer can be formed by a single step, and the number of manufacturing steps for the organic EL display panel can be reduced and the manufacturing steps can be simplified.

Besides, the difference between the heights of an upper surface and a lower surface of the first partition wall portion and the difference between the heights of an upper surface and a lower surface of the second partition wall portion may be substantially equal.

As a result, the partition walls can be formed by a single forming step, and, therefore, the number of manufacturing steps for the organic EL display panel can be reduced and the manufacturing steps can be simplified.

In addition, the height of the lower surface of the second partition wall portion may be higher than the height of lower surfaces of the pixel electrodes.

As a result, the degree of freedom in controlling the heights of the partition walls and the pinning positions can be enhanced.

Besides, the upper surface of the interlayer insulation layer may have a height adjusting projection projecting upward at its part making contact with the lower surface of the second partition wall portion.

Here, the height adjusting projection has the same function as that of the raising projection, but is different from the raising projection in that the raising projection is provided at a part making contact with the lower surface of the first partition wall portion whereas the height adjusting projection is provided at a part making contact with the lower surface of the second partition wall portion. As a result, the height of the upper surface of the second partition wall portion can be adjusted by the height adjusting projection. In addition, in the case where the upper surface of the interlayer insulation layer has the raising projection, the raising projection and the height adjusting projection can be simultaneously formed by a single step, and, therefore, the number of steps can be reduced.

Besides, a height adjusting layer may further be provided between the substrate and the second partition wall portion.

Here, the height adjusting layer has the same function as that of the raising layer, but is different from the raising layer in that the raising layer raises the lower surface of the first partition wall portion whereas the height adjusting layer raises the lower surface of the second partition wall portion. As a result, the height of the upper surface of the second partition wall portion can be adjusted by the height adjusting layer. Besides, in the case of providing the raising layer, the raising layer and the height adjusting layer can be simultaneously formed by a single step, and, therefore, the number of steps can be reduced.

In addition, the height adjusting layer may be integrally formed together with a second partition wall partitioning the pixel electrodes in the column direction.

As a result, the second partition wall and the height adjusting layer can be formed by a single step, so that the number of the manufacturing steps for the organic EL display panel can be reduced and the manufacturing steps can be simplified. Further, in the case of providing the raising layer, it is possible to form the second partition wall, the raising layer, and the height adjusting layer by a single step, so that the number of manufacturing steps for the organic EL display panel can be further reduced.

Besides, the first light emitting layer and the second light emitting layer may both be coating films.

As a result, film thicknesses of the light emitting layers can be controlled more suitably.

In addition, an organic EL display device according to one mode of the present disclosure includes the organic EL display panel according to any one of the modes of the present disclosure.

First Mode of Embodiment 2

1. General Configuration of Organic EL Display Panel

An organic EL display panel as one mode of the present disclosure will be described.

Figure 20:
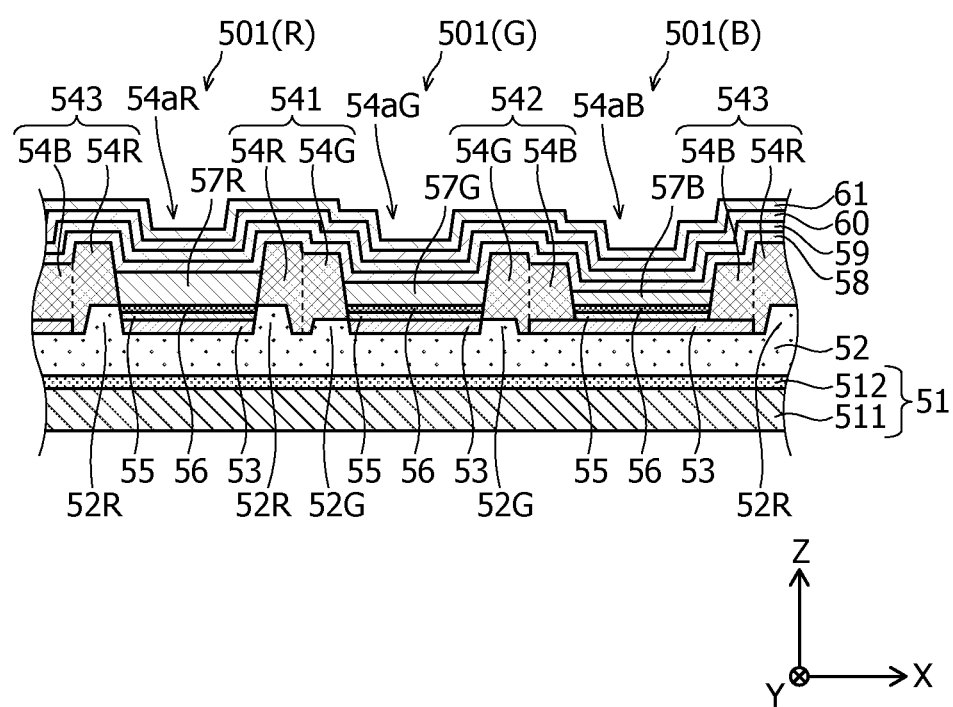
FIG. 20 is a sectional view schematically depicting the configuration of an organic EL display panel according to a first mode of Embodiment 2 as one mode of the present disclosure.

FIG. 20 is a partial sectional view of an organic EL display panel 500 according to a first mode of Embodiment 2. The organic EL display panel 500 includes a plurality of pixels including organic EL elements 501(R), 501(G), and 501(B) that emit light in three colors (red, green, and blue), respectively.

The organic EL display panel 500 is of a so-called top emission type in which each of the organic EL elements 501 emits light toward the front side (the upper side of the paper surface in FIG. 20).

The organic EL element 501(R), the organic EL element 501(G), and the organic EL element 501(B) have substantially the same configuration, and, therefore, they are described as the organic EL elements 501 when not discriminated from one another.

As depicted in FIG. 20, the organic EL element 501 includes a substrate 51, an interlayer insulation layer 52, a pixel electrode 53, partition walls 541, 542, and 543, a hole injection layer 55, a hole transport layer 56, a light emitting layer 57, an electron transport layer 58, an electron injection layer 59, a counter electrode 60, and a sealing layer 61. Note that the substrate 51, the interlayer insulation layer 52, the electron transport layer 58, the electron injection layer 59, the counter electrode 60, and the sealing layer 61 are not formed on a pixel basis, but are formed in common for the plurality of organic EL elements 501 possessed by the organic EL display panel 500.

FIG. 21 is a schematic plan view of the organic EL display panel 500. As depicted in FIG. 21, the organic EL display panel 500 according to the present mode adopts a so-called line bank structure. Specifically, the organic EL display panel 500 includes the plurality of partition walls 541, 542, and 543 which are each elongate in a Y direction and are arranged at intervals in an X direction, and a plurality of sub-walls 54b which are each elongate in the X direction and are arranged at intervals in the Y direction. Note that FIG. 20 corresponds to a sectional view taken along line A-A of FIG. 21.

In a region defined by a pair of adjacent partition walls 541, 542, and 543 and a pair of adjacent sub-walls 54b, one of the organic EL elements 501(R), 501(G), and 501(B) is formed, and each thereof serves as a sub-pixel. The length of each sub-pixel in the Y direction is, for example, 300 µm.

The configuration of each part of the organic EL display panel 500 will be described below.

<Substrate>

The substrate 51 includes a base material 511 which is an insulating material, and a TFT layer 512. The TFT layer 512 is formed with driving circuits on a pixel basis. As the base material 511, there can be adopted, for example, a glass substrate, a quartz substrate, a plastic substrate, and the like. As the plastic material, either of a thermoplastic resin and a thermosetting resin may be used. Applicable examples of the plastic material include polyimides (PI), polyether-imides (PEI), polysulfone (PSu), polycarbonate (PC), polyethylene terephthalate (PET), polyethylene naphthalate (PEN), polybutylene terephthalate, various thermoplastic elastomers based on styrene, polyolefin, polyurethane or the like, epoxy resins, unsaturated polyesters, silicone resins, polyurethane, and the like, and copolymers, blends, polymer alloys and the like containing these as a main constituent. Selection may be made from these so as to have process temperature durability, and laminates of one or more of these materials may be used.

<Interlayer Insulation Layer>

The interlayer insulation layer 52 is formed over the substrate 51. The interlayer insulation layer 52 is formed using a resin material, and is for flattening steps present in an upper surface of the TFT layer 512. Examples of the resin material include positive-type photosensitive materials. In addition, examples of such photosensitive materials include acrylic resins, polyimide resins, siloxane resins, and phenolic resins. In addition, though not illustrated in the sectional view of FIG. 20, the interlayer insulation layer 52 is formed with contact holes on a pixel basis.

Besides, an upper surface of the interlayer insulation layer 52 is formed with raising projections 52R and 52G. The raising projections 52R are formed such as to extend in the Y direction and be adjacent respectively to openings 54aR (which will be described later) in a row direction (X direction). The raising projections 52G are formed such as to extend in the Y direction and be adjacent respectively to openings 54aG (which will be described later) in the row direction (X direction). The details will be described later. Note that the raising projections 52R correspond to the raising projections of the present disclosure, whereas the raising projections 52G correspond to the height adjusting projections of the present disclosure. The raising projections and the height adjusting projections are different from each other in only whether the partition wall portion of the partition wall formed thereover corresponds to the first partition wall portion or the second partition wall portion; therefore, they will be both referred to as the raising projections, without distinction, in the following description.

<Pixel Electrode>

The pixel electrode 53 includes a metallic layer formed using a light reflective metallic material, and is formed over the interlayer insulation layer 52. The pixel electrodes 53 are provided on a pixel basis, and are electrically connected to the TFT layer 512 through the contact holes provided in the interlayer insulation layer 52.

In the present embodiment, the pixel electrode 53 functions as an anode.

Specific examples of the light reflective metallic material include Ag (silver), Al (aluminum), aluminum alloys, Mo (molybdenum), APC (an alloy of silver, palladium, and copper), ARA (an alloy of silver, rubidium, and gold), MoCr (an alloy of molybdenum and chromium), MoW (an alloy of molybdenum and tungsten), and NiCr (an alloy of nickel and chromium).

While the pixel electrode 53 may be configured by a metallic layer alone, it may have a stacked structure in which a layer formed using a metallic oxide such as ITO (indium tin oxide) or IZO (indium zinc oxide) is stacked on the metallic layer.

<Partition Wall>

The partition walls 541, 542, and 543 are formed over the pixel electrodes 53 in a state of exposing partial regions of upper surfaces of the pixel electrodes 53 and covering the surrounding regions. Those regions of the upper surfaces of the pixel electrodes 53 which are not covered by the partition walls 541, 542, and 543 (the regions will hereinafter be referred to as "openings") correspond to sub-pixels. In other words, the partition walls 541, 542, and 543 have the openings 54a provided on the sub-pixel basis. Hereinafter, when discrimination is needed, the opening of the organic EL element 501(R) will be referred to as the opening 54aR, the opening of the organic EL element 501(G) will be referred to as the opening 54aG, and the opening of the organic EL element 501(B) will be referred to as the opening 54aB.

The partition wall 141 includes a partition wall portion 54R fronting on the opening 54aR, and a partition wall portion 54G fronting on the opening 54aG. Similarly, the partition wall 542 includes the partition wall portion 54G fronting on the opening 54aG, and a partition wall portion 54B fronting on the opening 54aB. Similarly, the partition wall 543 includes the partition wall portion 54B fronting on the opening 54aB, and the partition wall portion 54R fronting on the opening 54aR.

The partition wall portions 54R, 54G, and 54B are formed over the interlayer insulation layer 52 in areas where the pixel electrodes 53 are not formed. In other words, in the areas where the pixel electrodes 53 are not formed, bottom surfaces of the partition wall portions 54R, 54G, and 54B are in contact with the upper surface of the interlayer insulation layer 52. Note that the partition wall portion 54R is present over the raising projection 52R at least at a part on the side of fronting on the opening 54aR. Similarly, the partition wall portion 54G is present over the raising projection 52G at least at a part on the side of fronting on the opening 54aG. Note that the partition wall portion 54R may as a whole be present over the raising projection 52R, and, similarly, the partition wall portion 54G may as a whole be present over the raising projection 52G.

The partition walls 541, 542, and 543 function as structures for preventing an ink, applied at the time of forming the hole injection layers 55 and the hole transport layers 56 and the light emitting layers 57 by a coating (application) method, from making contact with an ink for the adjacent sub-pixel. Of each of the partition walls 541, 542, and 543, a top portion and an upper portion of a side wall portion continuous with the top portion are a liquid-repellent portion, whereas that portion of the side wall portion exclusive of the liquid-repellent portion is a lyophilic portion. The partition walls 541, 542, and 543 are formed using a material obtained by adding a liquid-repellent surfactant such as a fluorine-containing compound or a silicone compound to a base material composed of an insulating resin material. As the base material which is an insulating resin material, there can be used, for example, a positive-type photosensitive material. Specific examples of the positive-type photosensitive material include acrylic resins, polyimide resins, siloxane resins, and phenolic resins. Note that the base material is not limited to the positive-type photosensitive material; for example, a negative-type photosensitive material may be used, and a non-photosensitive material may also be used, as the base material.

Each of the partition wall portions 54R, 54G, and 54B is in a truncated tetragonal pyramidal shape or the like shape, and its section is upwardly tapered trapezoidal in shape or upwardly protuberant bowl-like in shape. The partition wall portions 54R, 54G, and 54B may be the same in width in the X direction and in thickness (the difference between the height of a top portion and the height of a bottom portion, with the substrate 51 as a reference).

<Sub-Wall>

The sub-walls 54b are formed over the pixel electrodes 53 in a state of exposing partial regions of upper surfaces of the pixel electrodes 53 and covering the surrounding regions. The direction in which the sub-walls 54b extend is orthogonal to the direction in which the partition walls 541, 542, and 543 extend. Each of the sub-walls 54b is formed ranging over a plurality of openings 54a, and partitions the adjacent pixel electrodes 53 in the opening 54a.

In the present mode, the sub-walls 54b are formed over the interlayer insulation layer 52, in areas where the pixel electrodes 53 are not formed. In other words, in the areas where the pixel electrodes 53 are not formed, bottom surfaces of the sub-walls 54b are in contact with the upper surface of the interlayer insulation layer 52.

The sub-walls 54b are for electrically insulating the pixel electrodes 53 adjacent to each other in the Y direction and for controlling the flow, in the column direction (Y direction), of inks applied at the time of forming the hole injection layers 55, the hole transport layers 56, and the light emitting layers 57 by a coating (application) method. Each of the sub-walls 54b is in a truncated tetragonal pyramidal shape or the like shape, and its section is upwardly tapered trapezoidal in shape or upwardly protuberant bowl-like in shape. In addition, the height of the sub-walls 54b from the interlayer insulation layer 52 is lower than the heights of the partition walls 541, 542, and 543 from the interlayer insulation layer 12. The sub-walls 54b are formed using a resin material; for example, a positive-type photosensitive material can be used. Specific examples of such a photosensitive material include acrylic resins, polyimide resins, siloxane resins, and phenolic resins. Note that the resin material is not limited to the positive-type photosensitive material; for example, a negative-type photosensitive material may be used, and a non-photosensitive material may also be used, as the resin material.

<Hole Injection Layer>

The hole injection layers 55 are formed over the pixel electrodes 53 for the purpose of accelerating injection of holes from the pixel electrodes 53 into the light emitting layers 57. Specific examples of the material for the hole injection layers 55 include conductive polymer materials such as PEDOT/PSS (a mixture of polythiophene and polystyrenesulfonic acid).

Note that the hole injection layers 55 may be formed using an oxide of a transition metal. Specific examples of the transition metal include Ag (silver), Mo (molybdenum), Cr (chromium), V (vanadium), W (tungsten), Ni (nickel), and Ir (iridium). Since a transition metal takes a plurality of oxidation numbers, its oxide can take a plurality of levels, and, as a result, hole injection is facilitated, which contributes to a reduction in driving voltage. In this case, the hole injection layer 55 preferably has a great work function.

<Hole Transport Layer>

The hole transport layer 56 has a function of transporting holes, injected from the hole injection layer 55, into the light emitting layer 57, and, for efficiently transporting the holes from the hole injection layer 55 into the light emitting layer 57, it is formed using an organic material having a high hole mobility. The formation of the hole transport layers 56 is conducted by application of an organic material solution and drying thereof. As the organic material for forming the hole transport layers 56, there can be used polymer compounds such as polyfluorene and its derivatives or polyarylamine and their derivatives.

In addition, the hole transport layers 56 may be formed using any of triazole derivatives, oxadiazole derivatives, imidazole derivatives, polyarylalkane derivatives, pyrazoline derivatives and pyrazolone derivatives, phenylenediamine derivatives, arylamine derivatives, amino-substituted chalcone derivatives, oxazole derivatives, styrylanthracene derivatives, fluorenone derivatives, hydrozone derivatives, stilbene derivatives, porphyrin compounds, aromatic tertiary amine compounds and styrylamine compounds, budadiene compounds, polystyrene derivatives, triphenylmethane derivatives, and tetraphenylbenzene derivatives. Particularly preferably, porphyrin compounds, aromatic tertiary amine compounds, styrylamine compounds and the like may be used. In this case, the hole transport layers 56 are formed by a vacuum deposition method. Note that the material and production method for the hole transport layers 56 are not limited to the aforementioned ones; an arbitrary material having a hole transporting function may be used, and an arbitrary production method usable for production of the hole transport layers 56 may be used.

<Light Emitting Layer>

The light emitting layers 57 are formed in the openings 54a. The light emitting layers 57 each have a function of emitting light in each of R, G, and B colors through recombination of holes and electrons. As the materials for the light emitting layers 57, known materials can be utilized.

As organic light emitting materials contained in the light emitting layers 57, there can be used, for example, fluorescent substances such as oxinoid compounds, perylene compounds, coumarin compounds, azacoumarin compounds, oxazole compounds, oxadiazole compounds, perinone compounds, pyrrolopyrrole compounds, naphthalene compounds, anthracene compounds, fluorene compounds, fluoranthene compounds, tetracene compounds, pyrene compounds, coronene compounds, quinolone compounds and azaquinolone compounds, pyrazoline derivatives and pyrazolone derivatives, rhodamine compounds, chrysene compounds, phenanthrene compounds, cyclopentadiene compounds, stilbene compounds, diphenylquinone compounds, styryl compounds, butadiene compounds, dicyanomethylenepyran compounds, dicyanomethylenethiopyran compounds, fluorescein compounds, pyrylium compound, thiapyrylium compounds, selenapyrylium compounds, telluropyrylium compounds, aromatic aldadiene compounds, oligophenylene compounds, thioxanthene compounds, cyanine compounds, acridine compounds, metal complexes of 8-hydroxyquinoline compounds, metal complexes of 2-bipyridine compounds, complexes of Schiff base and Group III metals, oxine metal complexes, and rare earth complexes. In addition, there can be used known phosphorescent substances such as metal complexes that emit phosphorescence, such as tris(2-phenylpyridine)iridium. Besides, the light emitting layers 57 may be formed by using a polymer compound such as polyfluorene and its derivatives, polyphenylene and its derivatives, or polyarylamine and their derivatives, or a mixture of the above-mentioned low molecular weight compound and the above-mentioned polymer compound.

<Electron Transport Layer>

The electron transport layer 58 is formed over the light emitting layers 57 and the partition walls 541, 542, and 543 in common for a plurality of pixels, and has a function of transporting electrons, injected from the counter electrode 60, into the light emitting layers 57. The electron transport layer 58 is formed using, for example, an oxadiazole derivative (OXD), a triazole derivative (TAZ), a phenanthroline derivative (BCP, Bphen) or the like.

<Electron Injection Layer>

The electron injection layer 59 is formed over the electron transport layer 58 in common for a plurality of pixels, and has a function of accelerating injection of electrons from the counter electrode 60 into the light emitting layer 57.

The electron injection layer 59 is formed using, for example, a material in which an organic material having an electron transporting property is doped with a metallic material for enhancing electron injection property. Here, doping means dispersing metal atoms or metal ions of the metallic material into the organic material substantially uniformly, and, specifically, refers to formation of a single phase containing the organic material and a trace amount of the metallic material. Note that it is preferable that there is no other phase, particularly, a phase including only the metallic material, such as a metal piece or a metal film, or a phase containing the metallic material as a main constituent. In addition, in the single phase containing the organic material and a trace amount of the metallic material, it is preferable that the concentration of the metal atoms or the metal ions is uniform and that the metal atoms or the metal ions are not aggregated. The metallic material is preferably selected from among alkali metals and alkaline earth metals, and is more preferably Ba or Li. In the present mode, Ba is selected. Besides, the doping amount in doping the electron injection layer 59 with the metallic material is preferably 5 to 40 wt %. In the present mode, the doping amount is 20 wt %. Examples of the organic material having an electron transporting property include 7-electron low molecular weight organic materials such as oxadiazole derivatives (OXD), triazole derivatives (TAZ), and phenanthroline derivatives (BCP, Bphen).

Note that the electron injection layer 59 may have a layer of a fluoride of a metal selected from among alkali metals or alkaline earth metals on the light emitting layer 57 side.

<Counter Electrode>

The counter electrode 60 is formed over the electron injection layer 59 in common for a plurality of pixels, and functions as a cathode.

The counter electrode 60 has both a light transmitting property and a conductive property, and includes at least one of a metallic layer formed using a metallic material and a metallic oxide layer formed using a metallic oxide. To secure the light transmitting property, the film thickness of the metallic layer is approximately 1 to 50 nm. Examples of the material of the metallic layer include Ag, silver alloys containing Ag as a main constituent, Al, and Al alloys containing Al as a main constituent. Examples of the Ag alloys include magnesium-silver alloy (MgAg) and indium-silver alloy. Ag is preferable because it basically has a low resistivity, and the Ag alloys are preferable because they are excellent in heat resistance and corrosion resistance and can maintain a good electrical conductivity for a long time. Examples of the Al alloys include magnesium-aluminum alloy (MgAl) and lithium-aluminum alloy (LiAl). Examples of other alloys applicable include lithium-magnesium alloy and lithium-indium alloy. Examples of the material of the metallic oxide layer include ITO (indium tin oxide) and IZO (indium zinc oxide).

The cathode may be composed of a metallic layer alone or a metallic oxide layer alone, but it may have a stacked structure in which a metallic oxide layer is stacked on a metallic layer or a stacked structure in which a metallic layer is stacked on a metallic oxide layer.

<Sealing Layer>

The sealing layer 61 is formed over the counter electrode 60. The sealing layer 61 has a function to prevent impurities (water, air) from penetrating from the opposite side of the substrate 51 into the counter electrode 60, the electron injection layer 59, the electron transport layer 58, the light emitting layers 57 or the like, and to restrain these layers from being deteriorated by the impurities. The sealing layer 61 is formed using a light transmitting material such as silicon nitride (SiN) or silicon oxynitride (SiON). In addition, a sealing resin layer formed using a resin material such as acrylic resins and epoxy resins may be formed over the layer formed using such a material as silicon nitride (SiN) or silicon oxynitride (SiON).

In the present mode, the organic EL display panel 500 is of the top emission type, and, therefore, the sealing layer 61 should be formed using a light transmitting material.

<Others>

Note that though not illustrated in FIG. 20, color filters and/or an upper substrate may be laminated over the sealing layer 61, with a sealing resin therebetween. With the upper substrate laminated, it is possible to protect the hole injection layers 55, the hole transport layers 56, the light emitting layers 57, the electron transport layer 58, the electron injection layer 59 and the counter electrode 60 from moisture, air and the like.

<Effect of Partition Wall According to the Present Mode>

Figure 22A:
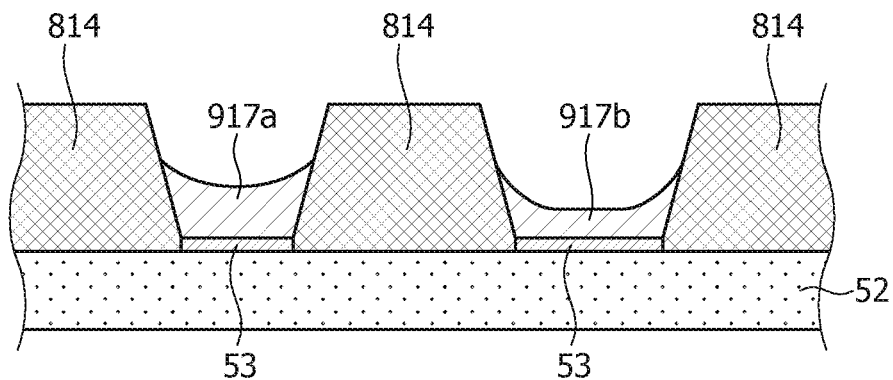
FIGS. 22A, 22B and 22C are partial sectional views depicting a state in which a light emitting layer is formed in the first mode and Comparative Example.
Figure 22B:
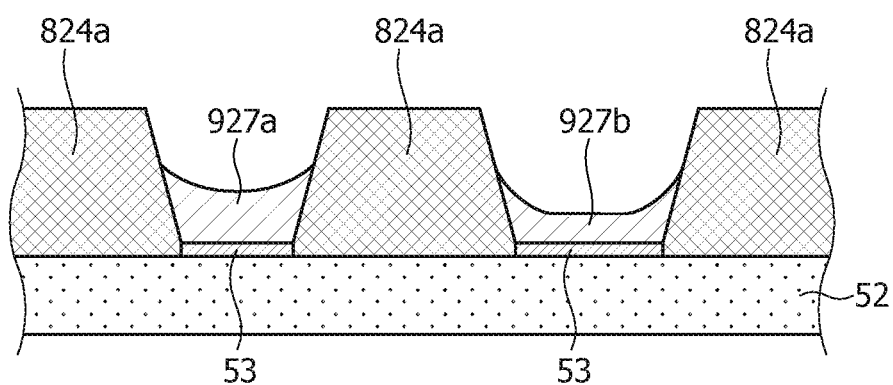
Figure 22C:
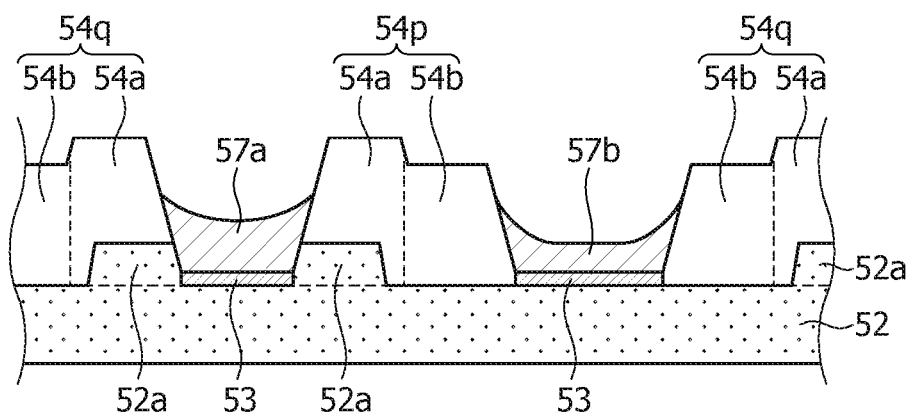

The differences between the partition walls 541 and 542 according to the present mode and partition walls having other structure will be described below, using schematic views. FIGS. 22A, 22B and 22C are schematic sectional views depicting a process of applying a light emitting layer material in an example and in a comparative example. Note that the left-right direction in the figures corresponds to the X direction, and the vertical direction corresponds to the Z direction.

FIG. 22A is a schematic sectional view in the case where all partition walls 814 are the same in height. When all the partition walls 814 are formed by using the same material and by the same step, such a configuration of the partition walls is obtained. In this instance, pinning positions are the same, irrespectively of film thicknesses of the light emitting layers. Therefore, when the pinning position is high in relation to the film thickness of the light emitting layer 917a, the upper surface of the light emitting layer 917a becomes in a concave shape, as depicted in FIG. 22A, and the film thickness increases in going closer to the partition wall. On the other hand, when the pinning position is low in relation to the film thickness of the light emitting layer 917a, the upper surface of the light emitting layer 917b becomes in a convex shape, as depicted in FIG. 22A, and the film thickness decreases in going closer to the partition wall. Therefore, in order to make uniform the film thickness of the light emitting layer, the pinning position and the film thickness of the light emitting layer should conform to each other; thus, it is difficult to adjust the film thicknesses in accordance with light emission colors.

FIG. 22B is a schematic sectional view in the case where the heights of the partition walls 824a and 824b are made different. In this instance, the pinning position on the partition wall 824a and the pinning position on the partition wall 824b are different in height. Therefore, if the height of the partition wall 824a is higher than the height of the partition wall 824b, the pinning position on the partition wall 824a becomes higher than the pinning position on the partition wall 824b. Accordingly, in the light emitting layer 927a, the pinning position on the partition wall 824a side becomes higher, resulting in a phenomenon in which the film thickness increases in going closer to the partition wall 824a, and, thus, unevenness in film thickness is generated. Similarly, in the light emitting layer 927b, the pinning position on the partition wall 824a side becomes higher, resulting in a phenomenon in which the film thickness increases in going closer to the partition wall 824a, and, thus, unevenness in film thickness is generated. In short, according to the method of varying the heights of the partition walls on a partition wall basis, it is difficult to adjust the film thicknesses in accordance with light emission colors.

In contrast, in the partition walls according to the first mode of Embodiment 2, as depicted in the schematic sectional view of FIG. 22C, partition walls 54p and 54q are configured such that a partition wall portion 54a fronting on an opening where to form a light emitting layer 57a and a partition wall portion 54b fronting on an opening where to form a light emitting layer 57b are different in the height of their top portions. Therefore, in regard of the opening where to form the light emitting layer 57a, the two partition wall portions 54a fronting on the opening are the same in height, and, therefore, unevenness in film thickness is not generated. Similarly, in regard of the opening where to form the light emitting layer 57b, the two partition wall portions 54b fronting on the opening are the same in height, and, therefore, unevenness in film thickness is not generated. Further, in the partition walls according to the present mode, the partition wall portion 54a is formed over a raising projection 52a with which the interlayer insulation layer 52 is formed. Therefore, by adjusting the height of the raising projection 52a, the height of a top portion of the partition wall portion 54a and the height of a top portion of the partition wall portion 54b can be designed arbitrarily, without changing the thicknesses of the partition wall portion 54a and the partition wall portion 54b in the Z direction. Specifically, it is sufficient to optimize the height of the raising projection 52a such that the height of the top portion of the partition wall portion 54a will be optimum for the light emitting layer 57a, after optimizing the thicknesses of the partition wall portion 54a and the partition wall portion 54b for the light emitting layer 57b. As a result, where the raising projection 52a is preliminarily formed, the partition wall portion 54a and the partition wall portion 54b can be formed at once by photolithography, for example, and, therefore, the partition walls 54p and 54q can be formed by a reduced number of steps.

Note that as a method for making different the heights of the partition wall portion 54a and the partition wall portion 54b, there may be (a) a method of simultaneously forming the partition wall portion 54a and the partition wall portion 54b by use of a halftone mask, and (b) a method of producing the partition wall portion 54a and the partition wall portion 54b by separate steps. However, in the case of the method of (a), there may arise a problem that it is difficult to sufficiently secure the liquid repellency of an upper surface of the partition wall portion 54b. For securing the liquid repellency of the upper surface of the partition wall, there is adopted, for example, a measure of adding a liquid-repellent surfactant such as a fluorine-containing compound or a silicone compound to the material and localizing the surfactant at the partition wall upper portion. Therefore, in the case where the partition wall portions different in height are simultaneously formed by use of a halftone mask, there may arise a case where an upper portion, given liquid repellency, of the lower partition wall portion (partition wall portion 54b) is removed by development, resulting in that it is difficult to sufficiently secure the liquid repellency of the upper surface of the partition wall portion. Besides, in the case of the method of (b), the patterning by photolithography should be conducted a number of times corresponding to the number of kinds of the partition wall portions, resulting in a problem that the number of steps is increased.

As has been described above, the partition walls according to the present mode are preferable as structures for preventing inks from overflowing at the time of forming the light emitting layers and/or the functional layers by a coating (application) method, and are also preferable for making uniform the film thicknesses and thereby enhancing the characteristics of the organic EL elements.

2. Method of Manufacturing Organic EL Display Panel 500

A method of manufacturing the organic EL display panel 500 will be described below, referring to the drawings.

FIGS. 23A, 23B, 23C, 24A, 24B, 24C, 24D, 25A, 25B, 25C, 26A, 26B, 26C, 27A and 27B are schematic sectional views depicting states in respective steps in manufacturing the organic EL display panel 500. In addition, FIG. 28 is a flow chart depicting the method of manufacturing the organic EL display panel 500.

Note that in the present mode it is assumed that the film thickness of the light emitting layer decreases in the order of a red light emitting layer, a green light emitting layer, and a blue light emitting layer.

(1) Formation of Substrate 51

First, the substrate 51 (TFT substrate) having the TFT layer 512 formed over the base material 511 is prepared (step S11). The TFT layer 512 can be formed by a known TFT manufacturing method.

(2) Formation of Interlayer Insulation Layer 52

Next, the interlayer insulation layer 52 is formed over the substrate 51.

Figure 23A:
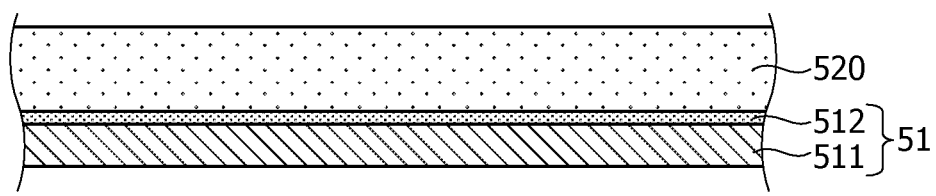

First, as depicted in FIG. 23A, an interlayer insulation material layer 520 is applied (step S21). The interlayer insulation material layer 520 is formed by, for example, uniformly applying a solution containing an acrylic resin, a polyimide resin, a siloxane resin, or a phenolic resin as a positive-type photosensitive material dissolved in a solvent by use of a spin coating method or the like.

Figure 23B:
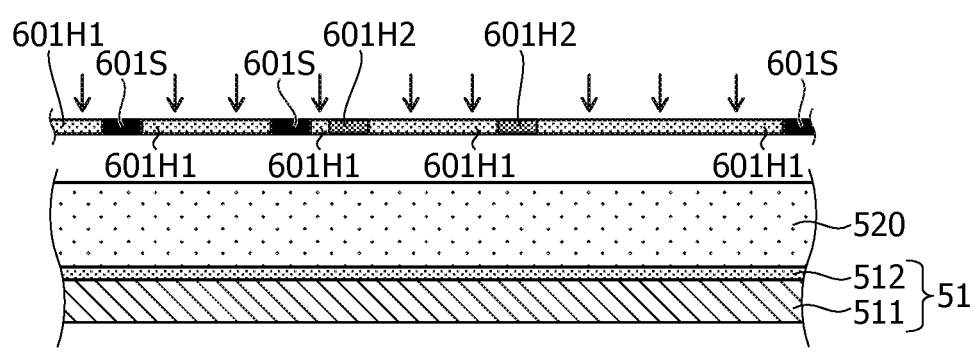

Next, as depicted in FIG. 23B, the interlayer insulation material layer 520 is subjected to pattern exposure using a photomask 601 (step S22). The photomask 601 used in this instance has a structure in which a part corresponding to the raising projection 52R is a light shielding section 601S, a part corresponding to the raising projection 52G is a halftone section 601H2, and other region is a halftone section 601H1. Note that the halftone section 601H1 is higher than the halftone section 601H2 in light transmittance.

Figure 23C:
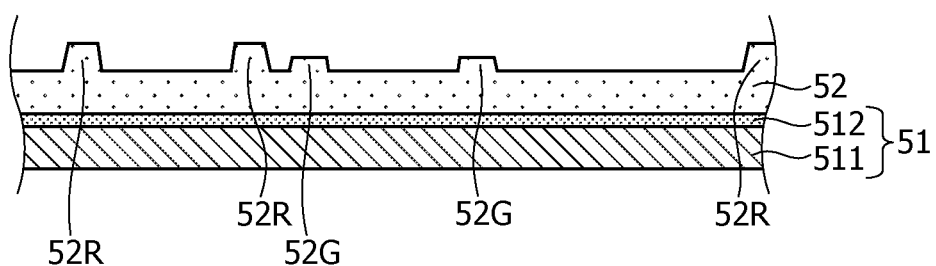

Subsequently, as depicted in FIG. 23C, the exposed portions are removed by development, followed by baking (step S23). Since the halftone section 601H1 is higher in light transmittance than the halftone section 601H2, an upper surface of the interlayer insulation layer 52 is the highest at a part corresponding to the light shielding section 601S, is the second highest at a part corresponding to the halftone section 601H2, and the lowest at a part corresponding to the halftone section 601H1. Specifically, when the part corresponding to the halftone section 601H1 is taken as a reference, the part corresponding to the halftone section 601H2 becomes the raising projection 52G projecting upward, and the part corresponding to the light shielding section 601S becomes the raising projection 52R projecting more upward. As a result, the interlayer insulation layer 52 having the raising projection 52R and the raising projection 52G is formed.

Note that through not illustrated in FIGS. 23B and 23C, contact holes are also simultaneously opened by the photolithography using the photomask in steps S22 and S23, after which connection electrodes are formed in the contact holes.

(3) Formation of Pixel Electrode 53

Figure 24A:
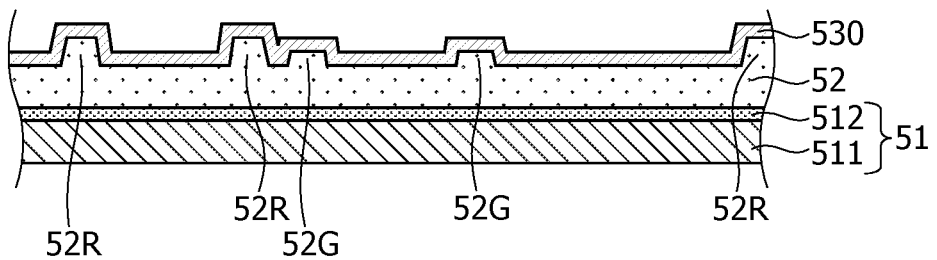

Next, as illustrated in FIG. 24A, a pixel electrode material layer 530 is formed over the interlayer insulation layer 52 (step S31). The pixel electrode material layer 530 can be formed by using, for example, a vacuum deposition method, a sputtering method or the like.

Figure 24B:
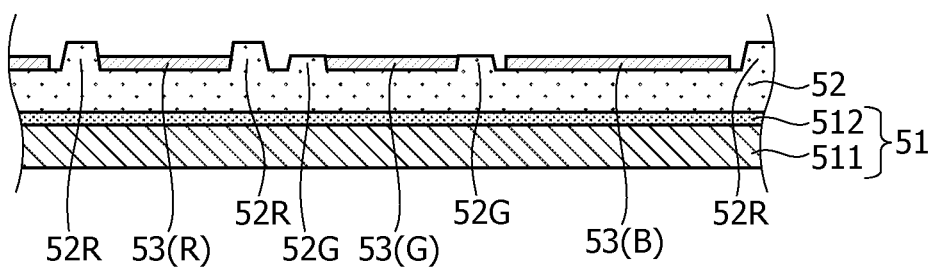

Then, as depicted in FIG. 24B, the pixel electrode material layer 530 is patterned by etching, to form the plurality of pixel electrodes 53 partitioned on a sub-pixel basis (step S32).

(4) Formation of Sub-Wall 54*b*

Subsequently, a sub-wall resin as a material for sub-walls 54*b* is applied onto the pixel electrodes 53 and the interlayer insulation layer 52, to form a sub-wall material layer (step S40). As the sub-wall resin, there is used, for example, a positive-type photosensitive material such as phenolic resins, acrylic resins, polyimide resins, and siloxane resins. The sub-wall material layer is formed by, for example, uniformly applying a solution containing a sub-wall resin such as a phenolic resin dissolved in a solvent onto the pixel electrodes 53 and the interlayer insulation layer 52 by a spin coating method. Then, the sub-wall material layer is subjected to pattern exposure, development, and baking, to form the sub-walls 54*b*.

(5) Formation of Partition Walls 541, 542, and 543

Figure 24C:
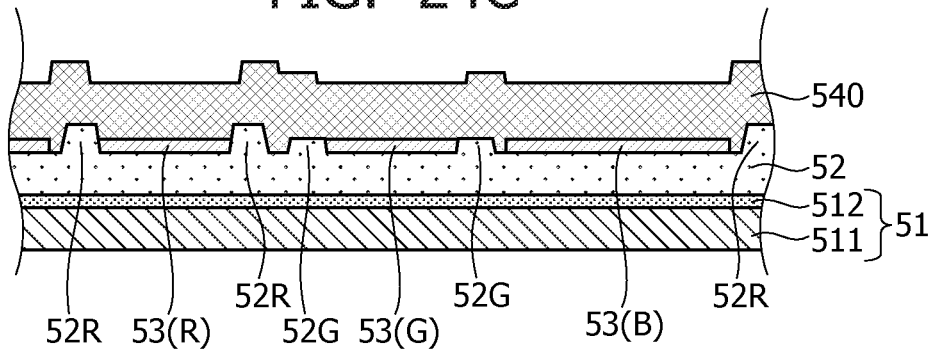

Next, as illustrated in FIG. 24C, a partition wall resin as a material for the partition walls 541, 542, and 543 is applied onto the pixel electrodes 53, the interlayer insulation layer 52 and the sub-walls 54*b*, to form a partition wall material layer 540 (step S50). As the partition wall resin, there is used, for example, a material obtained by adding a fluorine-containing compound as a liquid-repellent surfactant to a positive-type photosensitive material such as acrylic resins, polyimide resins, siloxane resins, and phenolic resins. Specifically, the partition wall material layer 540 is formed by, for example, uniformly applying a solution containing a phenolic resin as a partition wall resin and a fluorine compound dissolved in a solvent (e.g., propylene glycol monomethyl ether acetate (PGMEA) or a mixed solvent of ethyl lactate and γ-Butyrolactone (GBL)) onto the pixel electrodes 53, the interlayer insulation layer 52 and the sub-walls 54*b* by a spin coating method or the like.

Figure 24D:
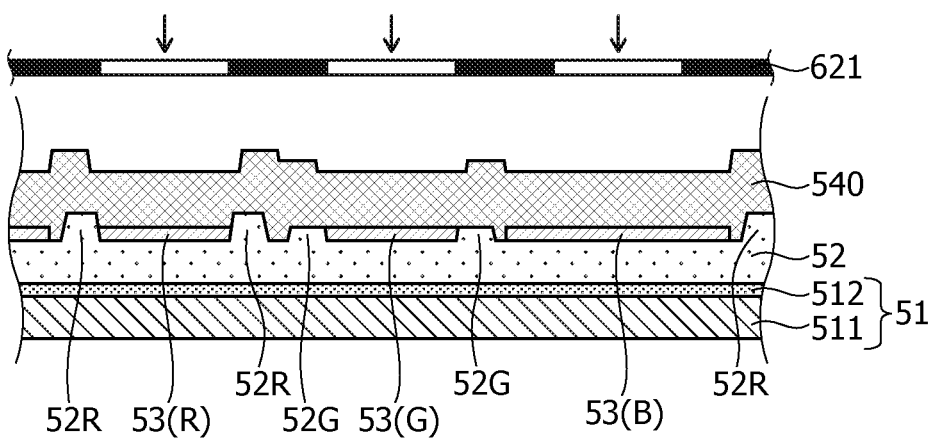
Figure 25A:
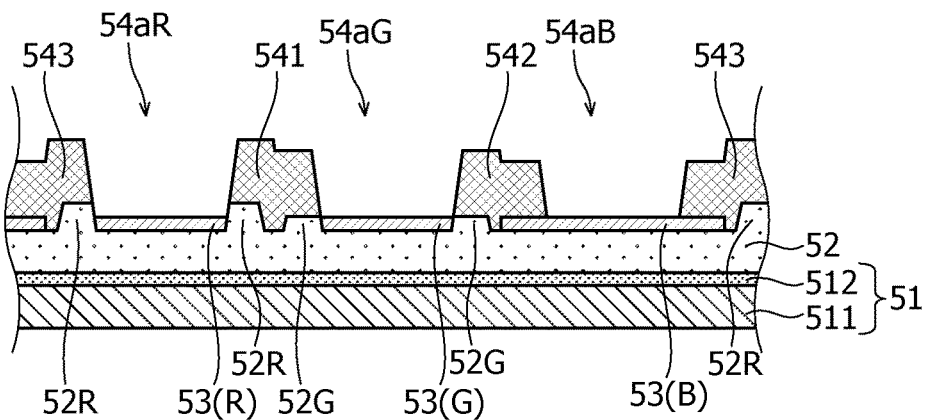

Next, as depicted in FIG. 24D, the partition wall material layer 540 is subjected to pattern exposure using a photomask 621. Subsequently, as depicted in FIG. 25A, the exposed parts are removed by development, followed by baking, to form the partition walls 541, 542, and 543. In the present step, the partition wall portions 54R, 54G, and 54B are formed at once instead of being formed individually, and, in this case, the partition wall portion 54R on the opening 54*a*R side of the partition wall 541 and the partition wall portion 54R on the opening 54*a*R side of the partition wall 543 are each formed over the raising projection 52R, and, therefore, their partition wall top portions are higher by the height of the raising projection 52R. Similarly, the partition wall portion 54G on the opening 54*a*G side of the partition wall 541 and the partition wall portion 54G on the opening 54*a*G side of the partition wall 542 are each formed on the raising projection 52G, and, therefore, their partition wall top portions are higher by the height of the raising projection 52G. Therefore, even if the partition wall portions 54R, 54G, and 54B are formed at once, the heights of their upper surfaces can be made different. In addition, since the upper surfaces of the partition wall portions are not removed by development, a lowering in liquid repellency is avoided.

Further, the opening 54*a*R is defined by the two partition wall portions 54R which are the same in height, the opening 54*a*G is defined by the two partition wall portions 54G which are the same in height, and the opening 54*a*B is defined by the two partition wall portions 54B which are the same in height. Therefore, unevenness in film thickness of the light emitting layers 57 to be formed later can be restrained.

(6) Formation of Hole Injection Layer

Figure 25B:
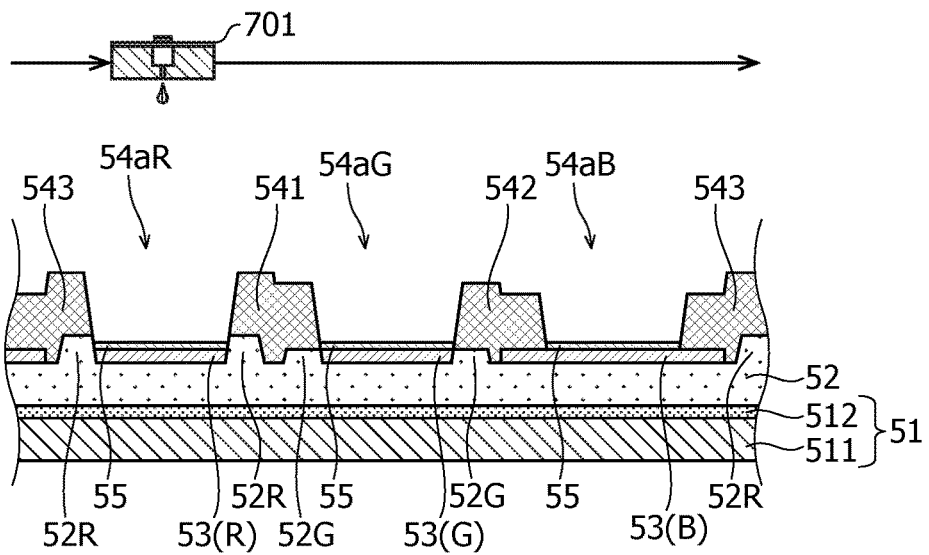

Next, as depicted in FIG. 25B, an ink containing a constituent material for the hole injection layers 55 is ejected from nozzles of an ink jet head 701 respectively toward the openings 54*a*R, 54*a*G, and 54*a*B defined by the partition walls 541, 542, and 543 and the sub-walls 54*b*, to apply the ink onto the pixel electrodes 53 in the openings 54*a*R, 54*a*G, and 54*a*B, followed by baking (drying), to form the hole injection layers 55 (step S60).

(7) Formation of Hole Transport Layer

Figure 25C:
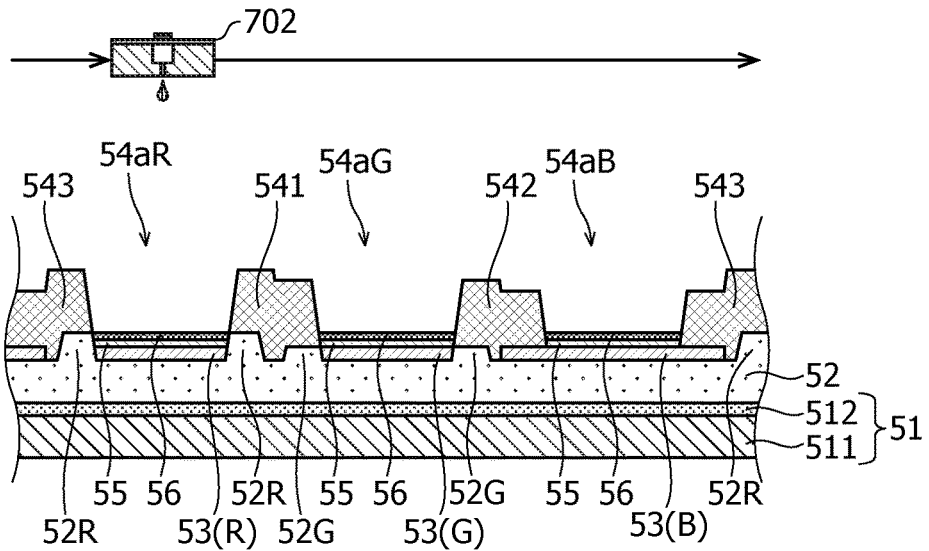

Subsequently, as illustrated in FIG. 25C, an ink containing a constituent material for the hole transport layers 16 is ejected from nozzles of an ink jet head 702, to apply the ink onto the hole injection layers 55 in the openings 54*a*R, 54*a*G, and 54*a*B, followed by baking (drying), to form the hole transport layers 56 (step S70).

(8) Formation of Light Emitting Layer

Figure 26A:
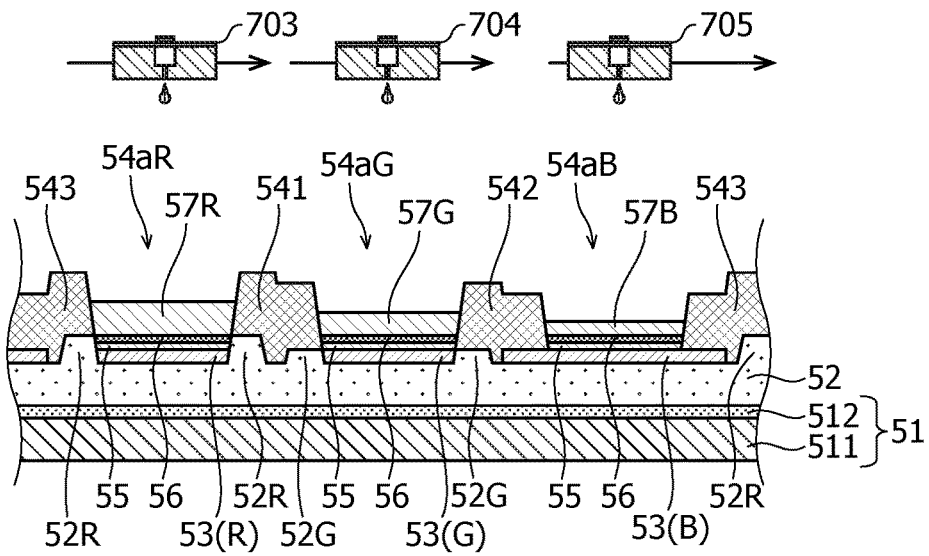

Next, as depicted in FIG. 26A, inks containing constituent materials for the light emitting layers 57 are ejected from respective nozzles of ink jet heads 703, 704, and 705, to apply the inks onto the respective hole transport layers 56 in the openings 54*a*R, 54*a*G, and 54*a*B, followed by baking (drying), to form the light emitting layers 57R, 57G, and 57B (step S80).

(9) Formation of Electron Transport Layer

Figure 26B:
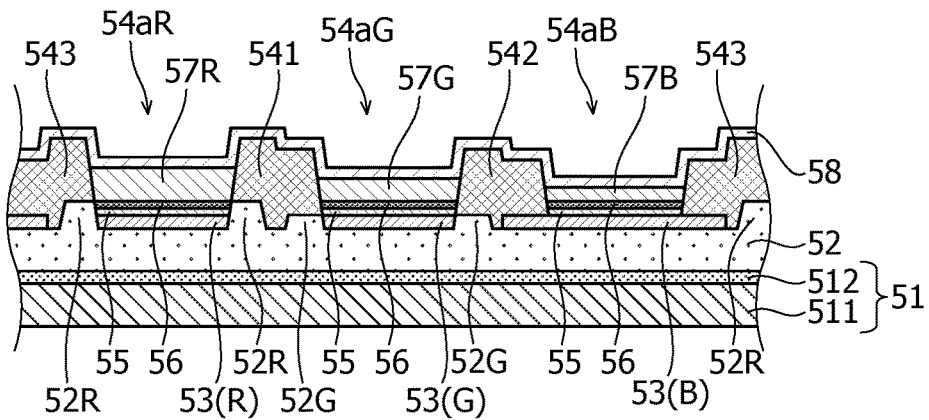

Subsequently, as illustrated in FIG. 26B, a film of a material for constituting the electron transport layer 58 is formed over the light emitting layers 57R, 57G, and 57B and the partition walls 541, 542, and 543 in common for the sub-pixels by a vacuum deposition method or a sputtering method, to form the electron transport layer 58 (step S90).

(10) Formation of Electron Injection Layer

Figure 26C:
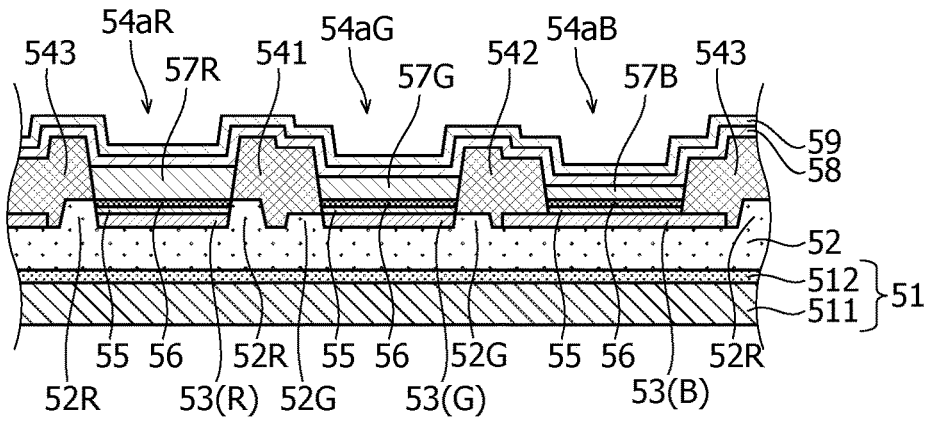

Next, as depicted in FIG. 26C, a film of a material for constituting the electron injection layer 59 is formed over the electron transport layer 58 in common for the sub-pixels by a vacuum deposition method or a sputtering method, to form the electron injection layer 59 (step S100).

(11) Formation of Counter Electrode

Figure 27A:
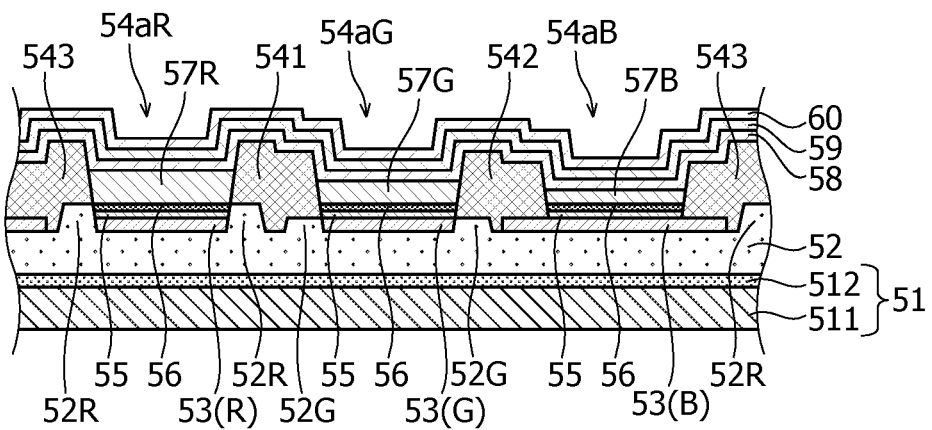
Figure 28:
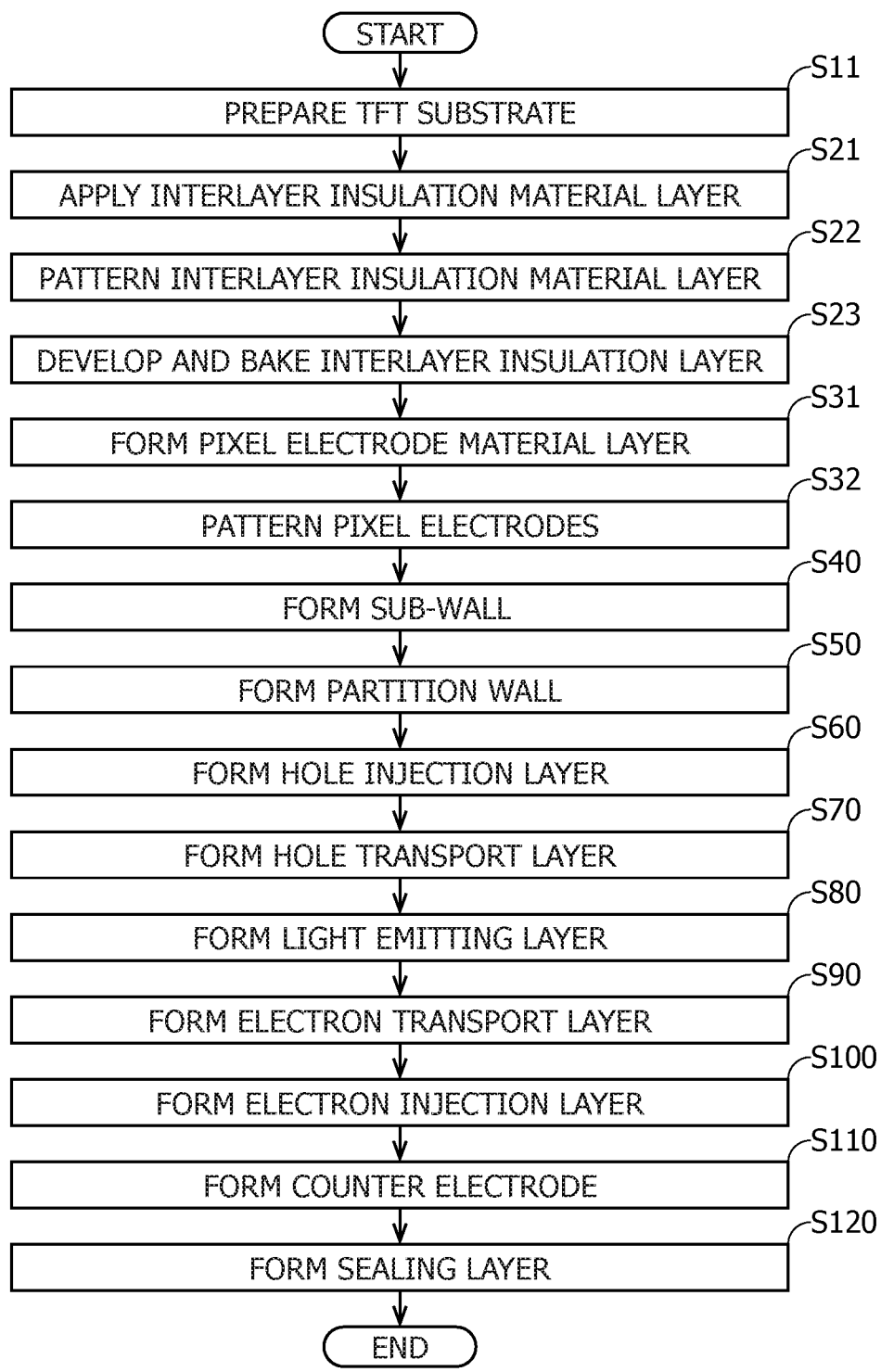
FIG. 28 is a flow chart depicting the manufacturing process of the organic EL display panel according to the first mode of Embodiment 2.

Subsequently, as illustrated in FIG. 27A, a film of a material for constituting the counter electrode 60 is formed over the electron injection layer 59 in common for the sub-pixels by a vacuum deposition method or a sputtering method, to form the counter electrode 60 (step S110).

(12) Formation of Sealing Layer

Figure 27B:
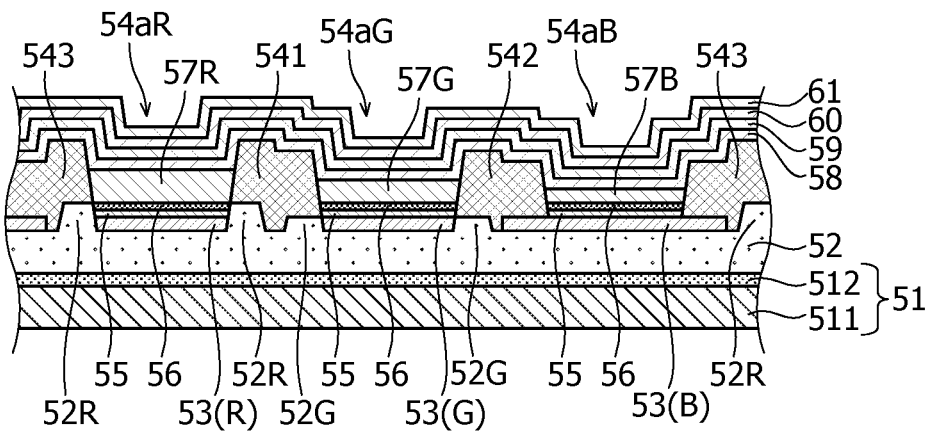

Finally, as depicted in FIG. 27B, a film of a material for forming the sealing layer is formed over the counter electrode 60 in common for the sub-pixels by a CVD method or a sputtering method, to form the sealing layer 61 (step S120).

Through the above-described steps, the organic EL display panel 500 is completed.

Note that color filters and/or an upper substrate may be placed over and joined to the sealing layer 61.

3. Film Shape of Each Light Emitting Layer

FIGS. 29A, 29B, 29C, 29D, 29E and 29F are graphs depicting the results of measurement of the heights of upper surfaces and lower surfaces of the light emitting layers 57 of RGB organic EL elements in the cases where the height of the upper surfaces of the partition walls 541 to 543 is set to 0.55 μm or 0.7 μm, with the pixel electrodes 53 taken as a reference, in the method of manufacturing the organic EL display panel described above.

Figure 29A:
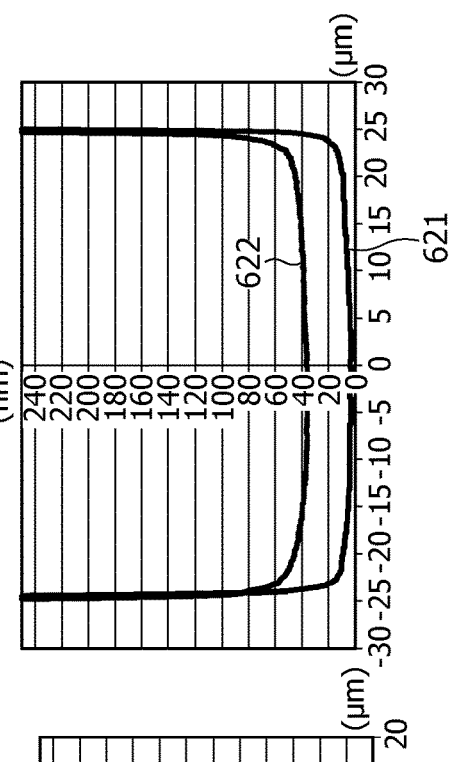
FIGS. 29A, 29B and 29C are graphs depicting the measurement results of film shape of light emitting layers for colors in the case where the height of partition walls is 0.55 μm.
Figure 29B:
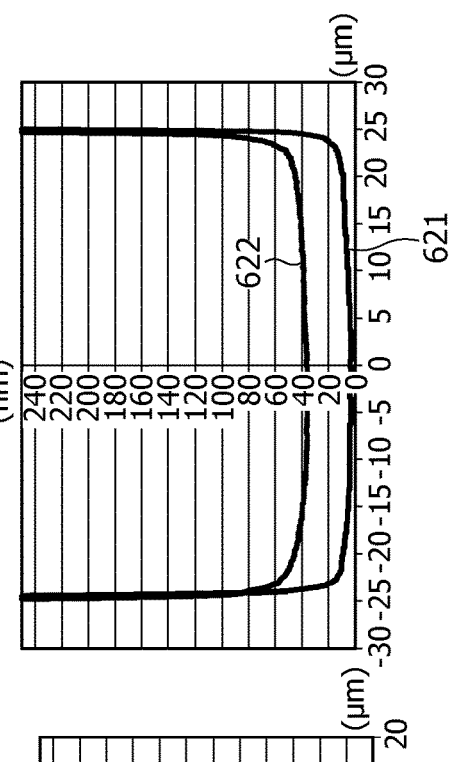
Figure 29C:
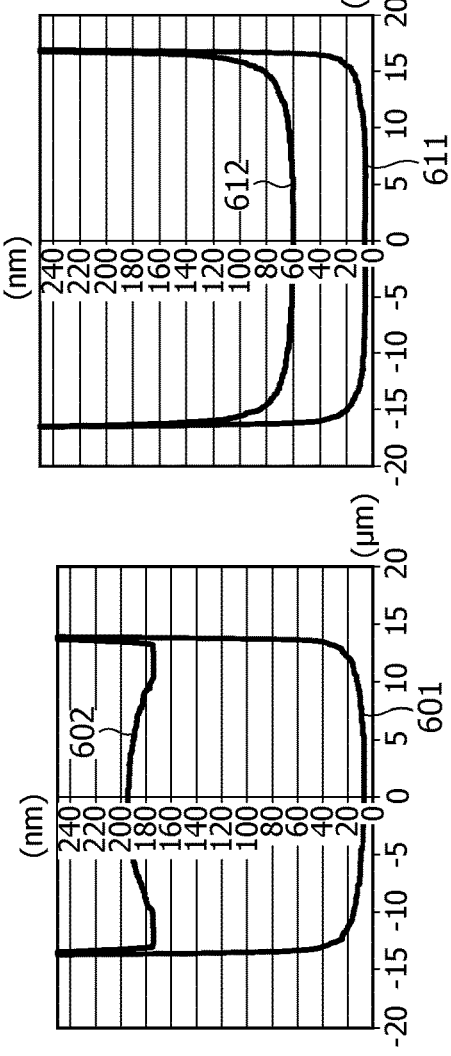
Figure 29D:
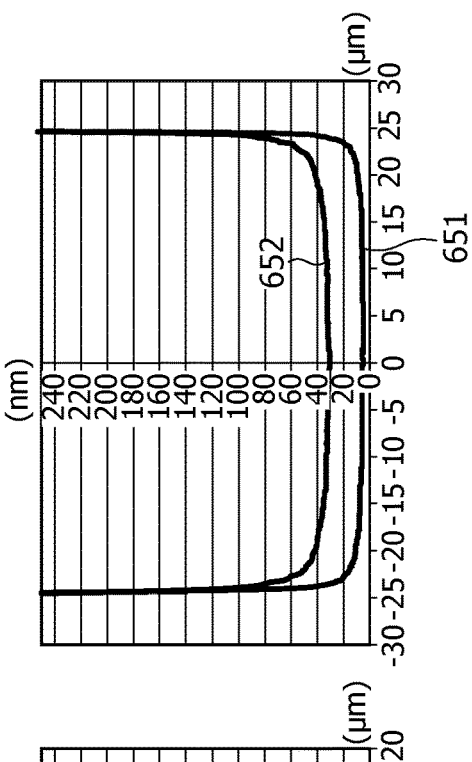
FIGS. 29D, 29E and 29F are graphs depicting the measurement results of film shape of light emitting layers for colors in the case where the height of the partition walls is 0.7 μm.
Figure 29E:
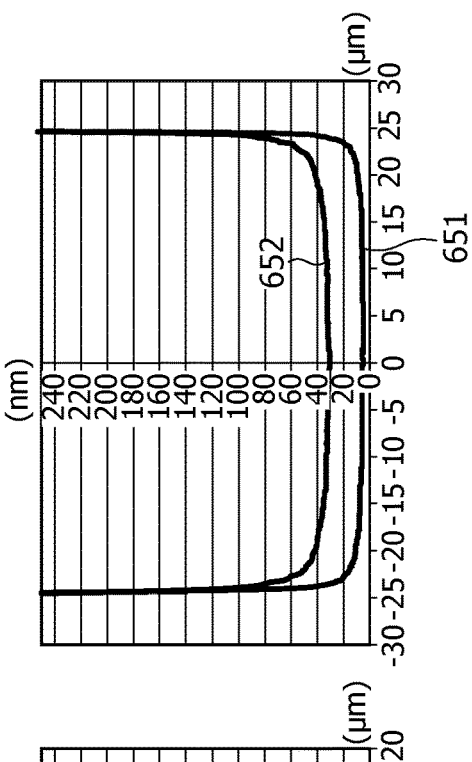
Figure 29F:
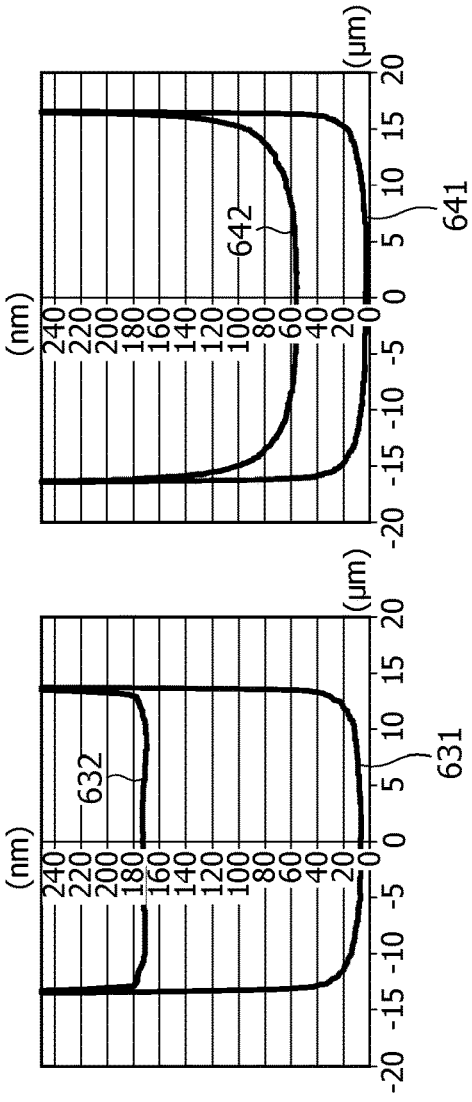

FIGS. 29A, 29B and 29C are graphs depicting the lower surfaces 601, 611, and 621 and the upper surfaces 602, 612, and 622 of the light emitting layers 57 when the height of the upper surfaces of the partition walls is set to 0.55 μm. In addition, FIGS. 29D, 29E and 29F are graphs depicting the lower surfaces 631, 641, and 651 and the upper surfaces 632, 642, and 652 of the light emitting layers 57 when the height of the upper surfaces of the partition walls is set to 0.7 μm.

In the case where the heights of the upper surfaces of the partition walls are evenly set to 0.55 μm, on one hand, in the light emitting layers with film thicknesses of 40 nm and 60 nm, the range where film thickness is uniform is wide, as depicted in FIGS. 29B and 29C. On the other hand, in the light emitting layer with a film thickness of 180 nm, a central portion of the upper surface 602 swells upward, as depicted in FIG. 29A, so that the central portion is greater in film thickness than the surrounding portion, resulting in unevenness of film thickness. However, in the case where the heights of the upper surfaces of the partition walls are evenly set to 0.7 μm, on one hand, in the light emitting layer with a film thickness of 180 nm, the range where film thickness is uniform is wide, as depicted in FIG. 29D. On the other hand, in the light emitting layer with a film thickness of 60 nm, a central portion of the upper surface 642 is hollowed, as depicted in FIG. 29E, so that the central portion is smaller in film thickness than the surrounding portion, resulting in unevenness of film thickness.

Therefore, it is recommendable, for example, in the case where the red light emitting layer, the green light emitting layer, and the blue light emitting layer have respective film thicknesses of 180 nm, 60 nm, and 40 nm, to design such that the difference between the heights of the upper surfaces and the lower surfaces of the partition wall portions 54R, 54G, and 54B is 0.55 μm and that the height of the raising projection 52R adjacent to the opening 54aR is 0.15 μm. According to such a design, on one hand, the red light emitting layer can be made to have a shape as depicted in FIG. 29D, and on the other hand, the green light emitting layer and the blue light emitting layer can be made to have shapes as depicted in FIGS. 29B and 29C, respectively.

4. General Configuration of Organic EL Display Device

Figure 36:
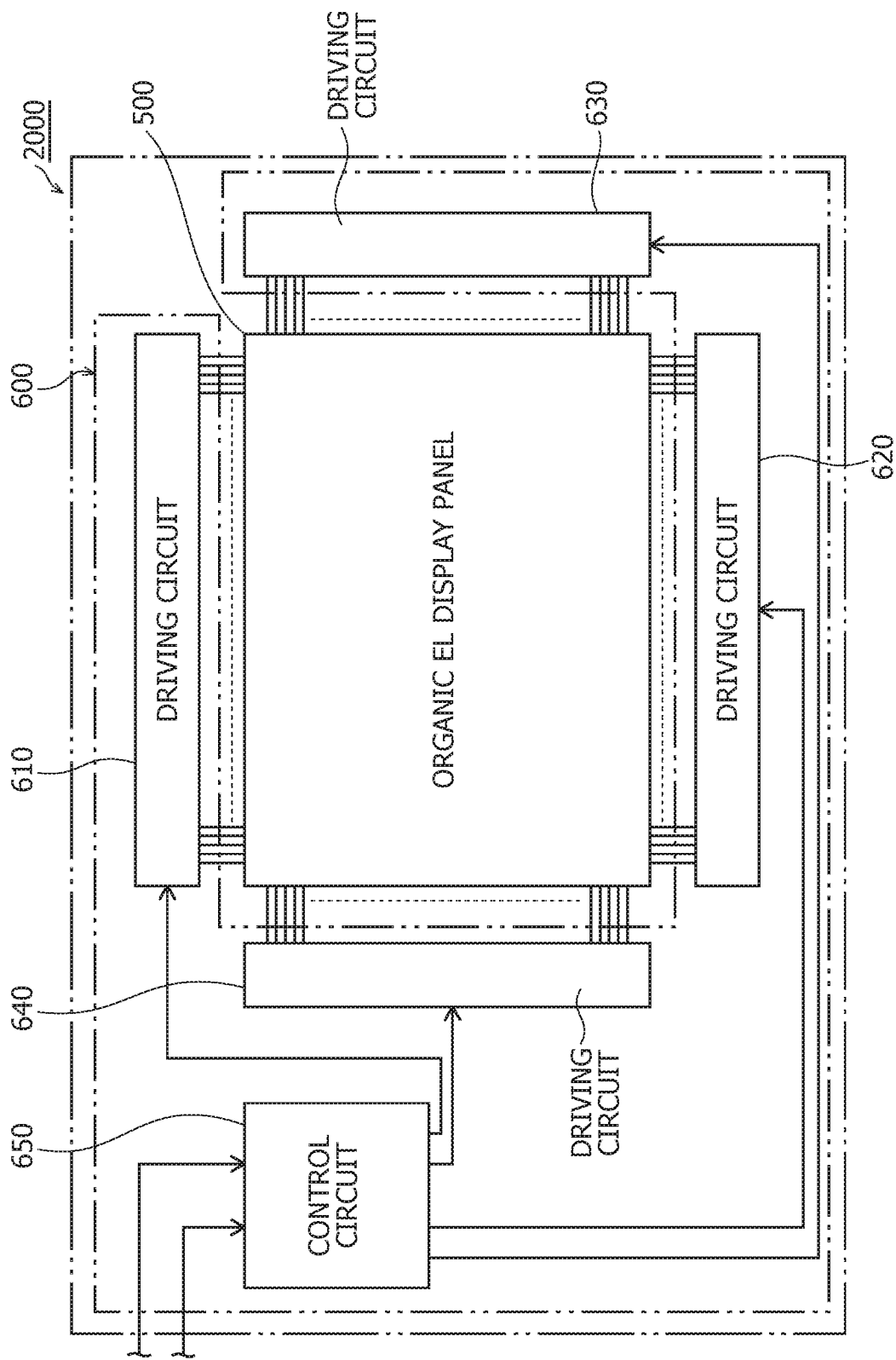
FIG. 36 is a block diagram depicting a general configuration of an organic EL display device according to Embodiment 2.

FIG. 36 is a schematic block diagram depicting the configuration of an organic EL display device 2000 including the organic EL display panel 500. As illustrated in FIG. 36, the organic EL display device 2000 includes the organic EL display panel 500, and a driving control section 600 connected thereto. The driving control section 600 includes four driving circuits 610 to 640, and a control circuit 650.

Note that in the practical organic EL display device 2000, the layout of the driving control section 600 in relation to the organic EL display panel 500 is not limited to the depicted one.

Second Mode of Embodiment 2

1. General Configuration of Organic EL Display Panel

In the organic EL display panel 500 according to the first mode of Embodiment 2 above, a case is described where the interlayer insulation layer 52 is provided with the raising projections 52R and 52G such that the upper surfaces of the partition wall portions 54R and 54G are higher than the upper surface of the partition wall portion 54B. On the other hand, as a second mode of Embodiment 2, a case will be described below where the upper surfaces of the partition wall portions 54R and 54G are made to be higher than the upper surface of the partition wall portion 54B by other method.

Figure 31:
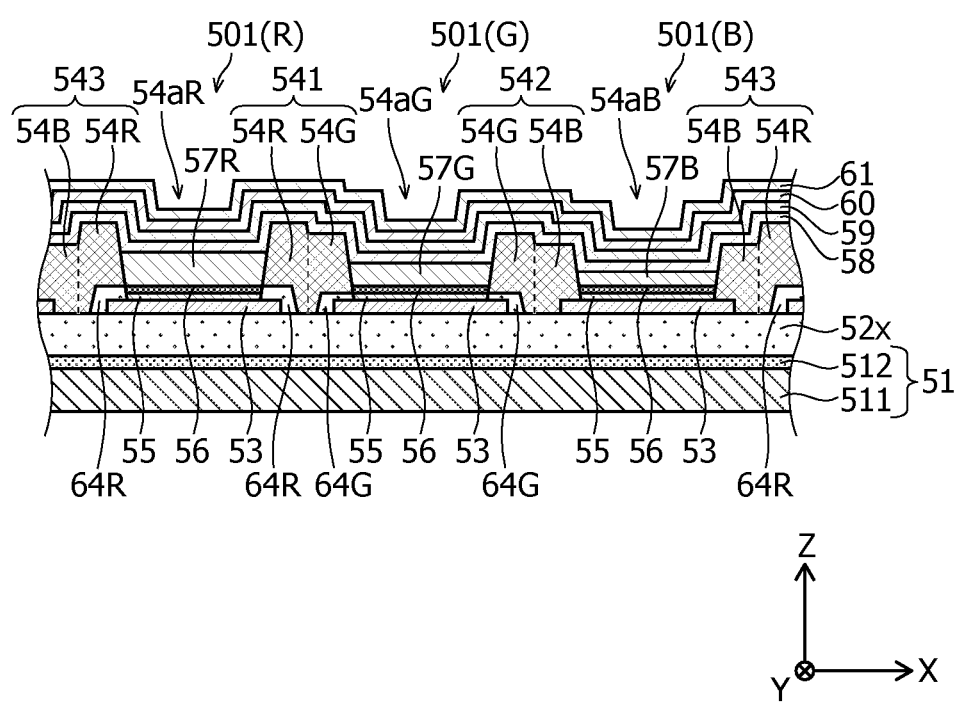
FIG. 31 is a sectional view schematically depicting the configuration of an organic EL display panel according to a second mode of Embodiment 2.

An organic EL display panel as the second mode of Embodiment 2 will be described below. FIG. 31 is a partial sectional view of an organic EL display panel 500x according to the present mode. The components in common with the organic EL display panel 500 according to the first mode above will be denoted by the same reference symbols as used above, and detailed descriptions of them will be omitted.

<Interlayer Insulation Layer>

An interlayer insulation layer 52x is formed over a substrate 51. The interlayer insulation layer 52x is formed using a resin material, in which steps present at an upper surface of a TFT layer 512 have been flattened. Examples of the resin material include positive-type photosensitive materials. Examples of such photosensitive materials include acrylic resins, polyimide resins, siloxane resins, and phenolic resins. In addition, though not illustrated in the sectional view of FIG. 31, the interlayer insulation layer 52x is formed with contact holes on a pixel basis.

Unlike the interlayer insulation layer 52 according to the first mode, the interlayer insulation layer 52x according to the present mode has a flat upper surface.

<Raising Layer>

Along both ends in regard of the X direction of a pixel electrode 53 in an opening 54aR, two raising layers 64R extending in the Y direction are formed over the pixel electrode 53 and the interlayer insulation layer 52x. Similarly, along both ends in regard of the X direction of a pixel electrode 53 in an opening 54aG, two raising layers 64G extending in the Y direction are formed over the pixel electrode 53 and the interlayer insulation layer 52x. The raising layer 64R is formed in such a manner that the height of an upper surface of a partition wall portion 54R of partition walls 541 and 543 which are partly formed over the raising layer 64R will be a suitable height for film thickness of a functional layer to be formed in the opening 54aR. Similarly, the raising layer 64G is formed in such a manner that the height of an upper surface of a partition wall portion 54G of partition walls 541 and 542 which are partly formed over the raising layer 64G will be a suitable height for film thickness of a functional layer to be formed in the opening 54aG. The functions of the raising layer 64R and the raising layer 64G are the same as those of the raising projections 52R and 52G according to the first mode.

Note that the raising layer 64R corresponds to the raising layer of the present disclosure, and the raising layer 64G corresponds to the height adjusting layer of the present disclosure. The raising layer and the height adjusting layer are different from each other in only whether the partition wall portion of the partition wall formed thereover corresponds to the first partition wall portion or the second partition wall portion; therefore, they will be both referred to as the raising layer, without distinction, in the following description.

Each of the raising layers 64R and 64G is in a truncated tetragonal pyramidal shape or the like shape, and its section is upwardly tapered trapezoidal in shape or upwardly protuberant bowl-like in shape. The raising layers 64R and 64G are formed using a resin material; for example, a positive-type photosensitive material can be used. Specific examples of such a photosensitive material include acrylic resins, polyimide resins, siloxane resins, and phenolic resins. Note that the resin material is not limited to the positive-type photosensitive material; for example, a negative-type photosensitive material may also be used.

Note that the raising layers 64R and 64G may be formed using a material the same or similar to the material of sub-walls 54b.

<Effect of Partition Wall According to Second Mode>

In the above-mentioned configuration, also, at the partition wall portion 54R adjacent to the opening 54aR, of the partition walls 541 and 543, the partition wall portion 54R is formed over the raising layer 64R. Therefore, in the functional layer formed in the opening 54aR, the heights of the upper surfaces of the two partition wall portions 54R fronting on the opening are the same, and, hence, unevenness in film thickness is not generated. Further, by adjusting the height of the raising layer 64R, the height of the upper surface of the partition wall portion 54R can be arbitrarily designed, irrespectively of the thicknesses of the partition wall portions 54R and 54G in the Z direction. Similarly, in the opening 54aG and the opening 54aB, unevenness in film thickness can be restrained, and, by adjusting the height of the raising layer 64G, the height of the upper surface of the partition wall portion 54G and the height of the upper surface of the partition wall portion 54B can be arbitrarily designed.

As has been described above, the partition walls according to the present mode are preferable as structures for preventing inks from overflowing at the time of forming the light emitting layers and/or the functional layers by a coating (application) method, and are also preferable for making uniform the film thicknesses and thereby enhancing the characteristics of the organic EL elements.

2. Method of Manufacturing Organic EL Display Panel 500x

A method of manufacturing the organic EL display panel 500x will be described below, referring to the drawings.

FIGS. 32A, 32B, 32C, 32D, 33A, 33B, 33C, 34A, 34B and 34C are schematic sectional views depicting states in respective steps in manufacture of the organic EL display panel 500x according to the present mode. In addition, FIG. 35 is a flow chart depicting the method of manufacturing the organic EL display panel 500x. Note that the same or similar steps to those in the first mode above will be denoted by the same step numbers as used above, and schematic sectional views and detailed descriptions of them will be omitted.

(1) Formation of Substrate 51

Figure 32A:
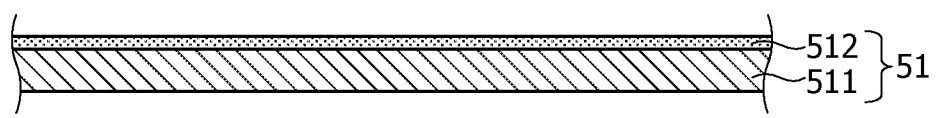

First, a substrate 51 (TFT substrate) in which a TFT layer 512 is formed over a base material 511 is prepared (step S11, FIG. 32A). The TFT layer 512 can be formed by a known TFT manufacturing method.

(2) Formation of Interlayer Insulation Layer 52x

Next, an interlayer insulation layer 52x is formed over the substrate 51 (step S20). The interlayer insulation layer 52 is formed by, for example, uniformly applying a solution containing a positive-type photosensitive material such as acrylic resins, polyimide resins, siloxane resins, and phenolic resins dissolved in a solvent by a spin coating method or the like, followed by exposure and development (FIG. 32B).

Figure 32B:
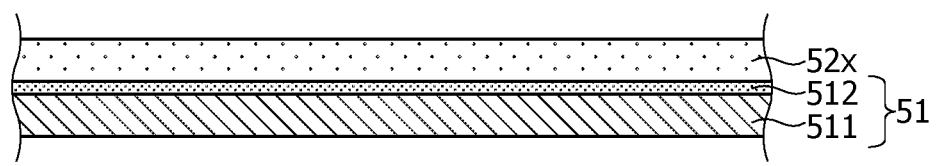

Note that though not illustrated in FIG. 32B, contact holes are opened at the time of exposure, and thereafter connection electrodes are formed in the contact holes.

(3) Formation of Pixel Electrode 53

Figure 32C:
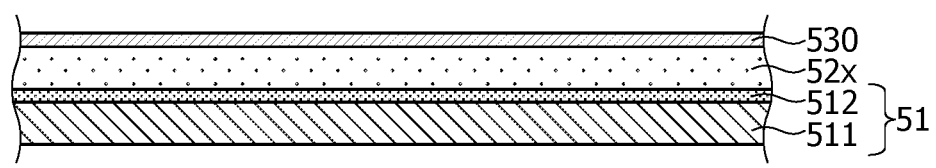

Subsequently, as depicted in FIG. 32C, a pixel electrode material layer 530 is formed over the interlayer insulation layer 52x (step S31). The pixel electrode material layer 530 can be formed by, for example, a vacuum deposition method, a sputtering method or the like.

Figure 32D:
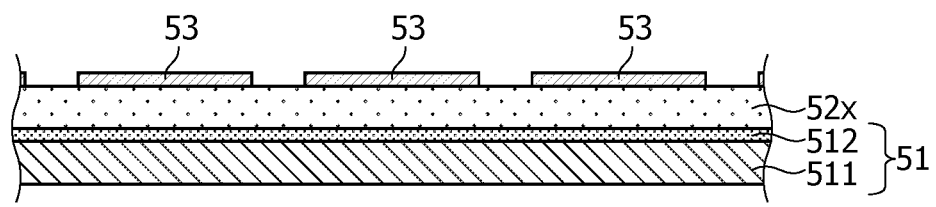

Then, as illustrated in FIG. 32D, the pixel electrode material layer 530 is patterned by etching, to form a plurality of pixel electrodes 53 partitioned on a sub-pixel basis (step S32).

(4) Formation of Sub-Wall 54b

Next, a sub-wall resin as a material for sub-walls 54b is applied onto the pixel electrodes 53 and the interlayer insulation layer 52x, to form a sub-wall material layer (step S40). As the sub-wall resin, there is used, for example, a positive-type photosensitive material such as phenolic resins, acrylic resins, polyimide resins, and siloxane resins. The sub-wall material layer is formed by, for example, uniformly applying a solution containing the sub-wall resin such as a phenolic resin dissolved in a solvent onto the pixel electrodes 53 and the interlayer insulation layer 52x by a spin coating method or the like. Then, the sub-wall material layer is subjected to pattern exposure, development, and baking, to form the sub-walls 54b.

(5) Formation of Raising Layers 64R and 64G

Figure 33A:
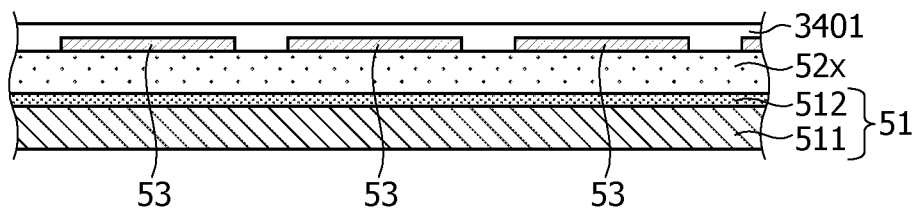

Subsequently, a raising layer resin as a material for raising layers 64R and 64G is applied onto the pixel electrodes 53 and the interlayer insulation layer 52x, to form a raising material layer 3401 (step S151, FIG. 33A). As the raising layer resin, there is used, for example, a positive-type photosensitive material such as phenolic resins, acrylic resins, polyimide resins, and siloxane resins. The raising material layer 3401 is formed by, for example, uniformly applying a solution containing the raising layer resin such as a phenolic resin dissolved in a solvent onto the pixel electrodes 53 and the interlayer insulation layer 52x by a spin coating method or the like.

Figure 33B:
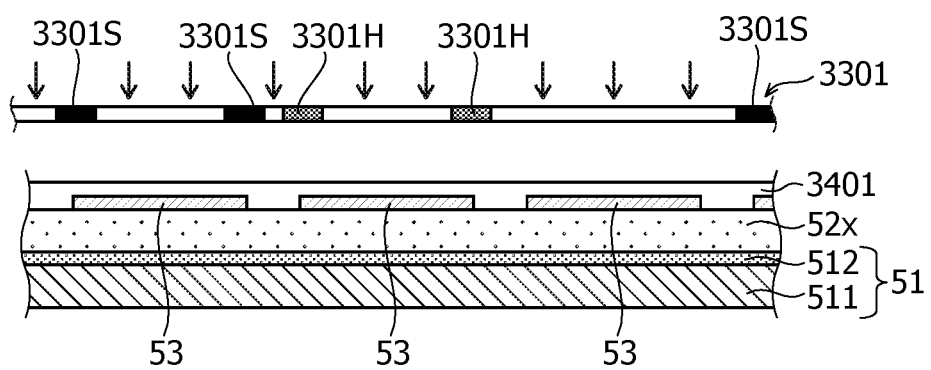

Next, as depicted in FIG. 33B, the raising material layer 3401 is subjected to pattern exposure using a photomask 3301 (step S152). The photomask 3301 used in this instance has a structure in which a part corresponding to the raising layer 64R is a light shielding section 3301S, a part corresponding to the raising layer 64G is a halftone section 3301H, and the other region is a light transmitting section.

Figure 33C:
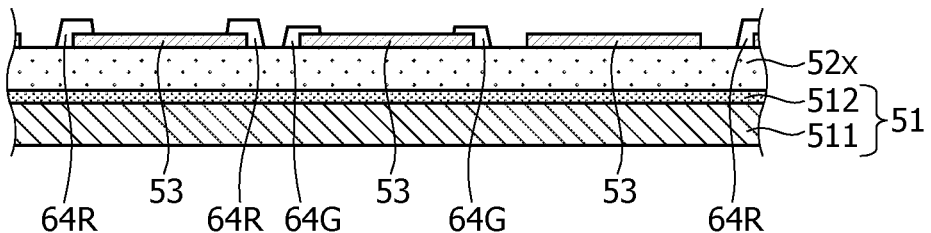

Subsequently, as illustrated in FIG. 33C, the exposed parts are removed by development, followed by baking (step S153). As a result, the raising layers 64R having a large height and the raising layers 64G smaller than the raising layers 64R in height are formed.

Note that while the sub-walls 54b and the raising layers 64R and 64G are formed separately here, the sub-walls 54b and the raising layers 64R and 64G may be formed by one-time photolithography using a single resin material and a single photomask.

(6) Formation of Partition Walls 541, 542, and 543

Figure 34A:
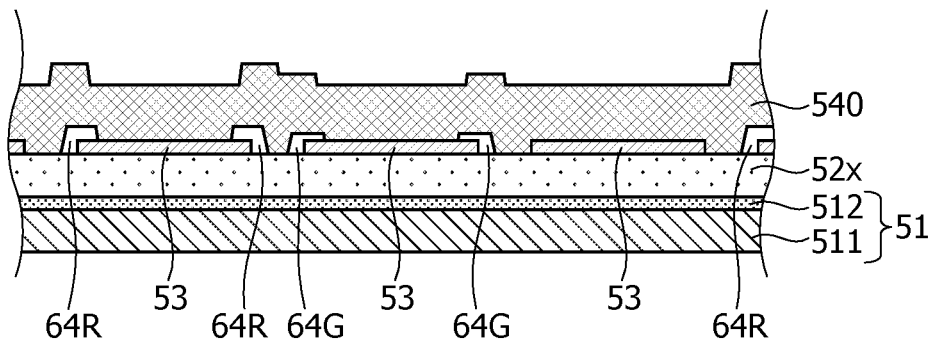
Figure 35:
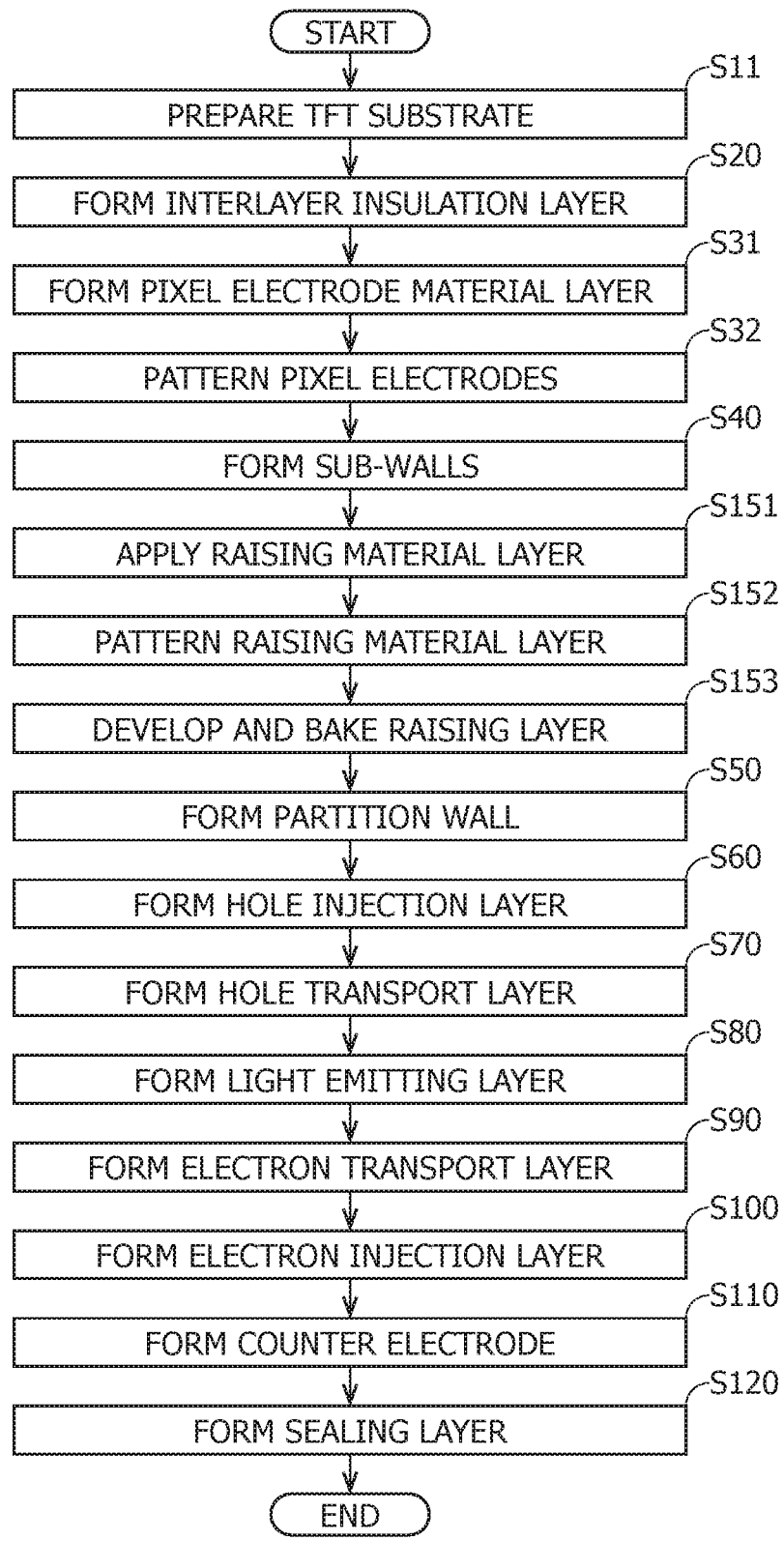
FIG. 35 is a flow chart depicting the manufacturing process of the organic EL display panel according to the second mode of Embodiment 2.

Next, as depicted in FIG. 34A, a partition wall resin as a material for partition walls 541, 542, and 543 is applied onto the pixel electrodes 53, the interlayer insulation layer 52x, the sub-walls 54b, and the raising layers 64R and 64G, to form a partition wall material layer 540 (step S50). As the partition wall resin, there is used, for example, a material obtained by adding a fluorine compound as a liquid-repellent surfactant to a positive-type photosensitive material such as acrylic resins, polyimide resins, siloxane resins, and phenolic resins.

Figure 34B:
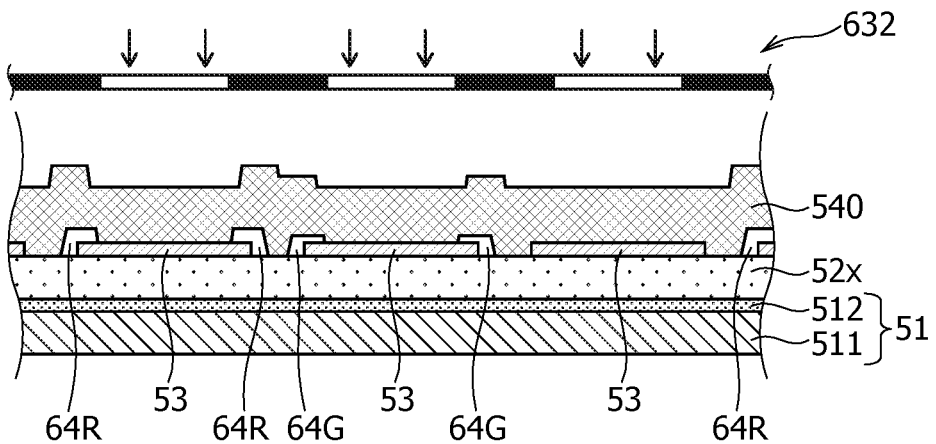
Figure 34C:
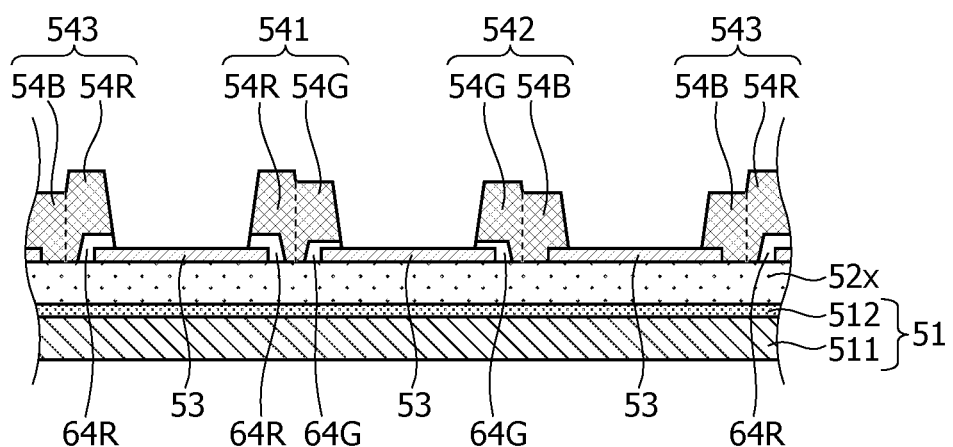

Next, as illustrated in FIG. 34B, the partition wall material layer 540 is subjected to pattern exposure using a photomask 632. Subsequently, as depicted in FIG. 34C, the exposed parts are removed by development, followed by baking, to form the partition walls 541, 542, and 543. In this instance, a partition wall portion 54R on the opening 54aR side of the partition wall 541 and a partition wall portion 54R on the opening 54aR side of the partition wall 543 are each formed over the raising layer 64R, and, therefore, their partition wall top portions are higher by the height of the raising layer 64R. Similarly, a partition wall portion 54G on the opening 54aG side of the partition wall 541 and a partition wall portion 54G on the opening 54aG side of the partition wall 542 are each formed over the raising layer 64G, and, therefore, their partition wall top portions are higher by the height of the raising layer 64G. Accordingly, the opening 54aR is defined by the two partition wall portions 54R which are the same in height, the opening 54aG is defined by the two partition wall portions 54G which are the same in height, and the opening 54aB is defined by the two partition wall portions 54B which are the same in height.

(7) Formation of Hole Injection Layer

Next, an ink containing a constituent material for hole injection layers 55 is ejected from nozzles of an ink jet head toward the openings 54aR, 54aG, and 54aB defined by the partition walls 541, 542, and 543 and the sub-walls 54b, to apply the ink onto the pixel electrodes 53 in the openings 54aR, 54aG, and 54aB, followed by baking (drying), to form the hole injection layers 55 (step S60).

(8) Formation of Hole Transport Layer

Subsequently, an ink containing a constituent material for hole transport layers 56 is ejected from nozzles of an ink jet head, to apply the ink onto the hole injection layers 55 in the openings 54aR, 54aG, and 54aB, followed by baking (drying), to form the hole transport layers 56 (step S70).

(9) Formation of Light Emitting Layer

Next, inks containing constituent materials for light emitting layers 57 are ejected from nozzles of ink jet heads, to apply the inks onto the respective hole transport layers 56 in the openings 54aR, 54aG, and 54aB, followed by baking (drying), to form light emitting layers 57R, 57G, and 57B (step S80).

(10) Formation of Electron Transport Layer

Subsequently, a film of a material for constituting an electron transport layer 58 is formed over the light emitting layers 57R, 57G, and 57B and the partition walls 541, 542, and 543 in common for the sub-pixels by a vacuum deposition method or a sputtering method, to form the electron transport layer 58 (step S90).

(11) Formation of Electron Injection Layer

Next, a film of a material for constituting an electron injection layer 59 is formed over the electron transport layer 58 in common for the sub-pixels by a vacuum deposition method or a sputtering method, to form the electron injection layer 59 (step S100).

(12) Formation of Counter Electrode

Subsequently, a film of a material for constituting a counter electrode 60 is formed over the electron injection layer 59 in common for the sub-pixels by a vacuum deposition method or a sputtering method, to form the counter electrode 60 (step S110).

(13) Formation of Sealing Layer

Finally, a film of a material for forming a sealing layer is formed over the counter electrode 60 in common for the sub-pixels by a CVD method or a sputtering method, to form the sealing layer 61 (step S120).

Through the above-mentioned steps, the organic EL display panel 500x is completed. According to the above-described method, it is unnecessary to form the raising projections 52R and 52G on the interlayer insulation layer 52x, and, therefore, manufacturing steps can be simplified. In addition, particularly in the case of forming the raising layers 64R and 64G and the sub-walls 54b at once, the number of steps can be reduced, and the organic EL display panel can be formed more efficiently.

Modifications of Embodiment 2

(1) In Embodiment 2 above, the organic EL display panel provided with the three kinds of light emitting layers for emitting light in R, G, and B, respectively, is described in the case where the film thicknesses of the light emitting layers decrease in the order of R, G, and B. However, the order of the film thicknesses of the light emitting layer is not limited to the above-mentioned but is arbitrary, insofar as (i) the difference between the heights of the upper surface and the lower surface of the partition walls is a suitable value with respect to the light emitting layer which is the smallest in film thickness, and (ii) the other two kinds of light emitting layers are provided with the raising projection or the raising layer such that the height of the upper surface of the partition wall will be a suitable value. Specifically, in the case where the film thicknesses of the light emitting layers decrease in the order of R, B, and G, it is sufficient to provide a raising projection or raising layer on both adjacent sides of the opening where to form the blue light emitting layer, and to provide a higher raising projection or raising layer at both ends of the opening where to form the red light emitting layer.

In addition, while neither a raising projection nor a raising layer is formed on both adjacent sides of the light emitting layer (B) which is the smallest in film thickness in the above embodiment, the raising projection or raising layer may be provided adjacent to all the openings. Besides, naturally, raising projections and raising layers may both be provided in one organic EL display panel.

(2) While the organic EL display panel provided with the three kinds of light emitting layers for emitting light in R, G, and B, respectively, is described in the first mode of Embodiment 2 above, the number of kinds of the light emitting layers may be two, or may be four or more. Here, the kind of the light emitting layer means a variation in film thickness of the light emitting layer or the functional layer, and in the case where the light emitting layers or functional layers are different in film thickness even if they are the same in light emission color, they may be deemed as different kinds of light emitting layers. In addition, the layout of the light emitting layers is not limited to the layout of RGBRGB . . . , but may be the layout of RGBBG-RRGB . . . , and, further, an auxiliary electrode layer or other non-light-emitting region may be provided between pixels.

(3) In the organic EL element 501 in the first mode of Embodiment 2 above, all of the hole injection layers 55, the hole transport layers 56, and the light emitting layers 57 are formed by a coating (application) method. However, it is sufficient that at least one of these layers is formed by the coating (application) method, and the other layers may be formed by other method such as, for example, a vapor deposition method or a sputtering method. Note that in the case where the hole injection layers 55 is formed by a vapor deposition method or a sputtering method, the formation of the hole injection layers 55 may be conducted before formation of the partition walls 541 to 543 and/or the raising layers 64.

In addition, the hole injection layers 55, the hole transport layers 56, the electron transport layer 58, and the electron injection layer 59 may not necessarily be configured as described in the above embodiment. One or more of them may be omitted, or other functional layer or layers may further be provided. Besides, for example, a single electron injection and transport layer may be provided in place of the electron transport layer 58 and the electron injection layer 59.

(4) In the first mode of Embodiment 2 above, the organic EL display panel is of the top emission type, and a case where the pixel electrodes are light reflective whereas the counter electrode is light transmitting is described. However, the organic EL display panel according to the present disclosure may be of a so-called bottom emission type.

SUPPLEMENT

While the organic EL display panel and the organic EL display device according to one mode of the present disclosure are described above based on embodiments and modifications, the present disclosure is not to be limited to the above embodiments and modifications. Modes obtained by applying various modifications conceived by those skilled in the art to the above embodiments and modifications, and modes realized by arbitrary combinations of the components and functions in the embodiments and modifications within the scope of the gist of the present disclosure, are also embraced by the present disclosure.

What is claimed is:

1. An organic electroluminescent display panel, comprising:
    a substrate;
    an interlayer insulation layer formed over the substrate; and
    an organic electroluminescent light emitting section formed over the interlayer insulation layer, wherein the organic electroluminescent light emitting section includes:
        a plurality of pixel electrodes arranged in a matrix pattern over the interlayer insulation layer,
        a plurality of partition walls, wherein
            each partition wall of the plurality of partition walls is disposed between corresponding pixel electrodes of the plurality of pixel electrodes,
            the corresponding pixel electrodes are adjacent to each other in a row direction, and
            each partition wall of the plurality of partition walls extends in a column direction,
        an organic layer including a light emitting layer formed in a region partitioned by the plurality of partition walls,
        a counter electrode formed on an upper side of the organic layer,
        a first light emitting section having a light emitting layer that emits light in a first color, and
        a second light emitting section having a light emitting layer that emits light in a second color different from the first color, wherein
            the first light emitting section and the second light emitting section are different in thickness of the organic layer,
            the first light emitting section and the second light emitting section are different in digging amount of the interlayer insulation layer in the region partitioned by the plurality of partition walls, and
            one of the first light emitting section or the second light emitting section which is longer in a wavelength of light emission color is greater than the other light emitting section in the digging amount of the interlayer insulation layer.

2. The organic electroluminescent display panel according to claim 1,
    wherein a height of the plurality of partition walls and the digging amount of the interlayer insulation layer are set in such a manner that a difference between a height of a pinning position where an upper surface of the organic layer and a partition wall of the plurality of partition walls make contact with each other in the first light emitting section and the second light emitting section and a height of a central position of the upper surface of the organic layer is not more than a predetermined value.

3. The organic electroluminescent display panel according to claim 2,
    wherein the difference between the height of the pinning position where the upper surface of the organic layer and the partition wall make contact with each other and the height of the central position of the upper surface of the organic layer is not more than 700 nm.

4. The organic electroluminescent display panel according to claim 1, wherein a bottom surface of a dug portion of the interlayer insulation layer is flat.

5. The organic electroluminescent display panel according to claim 1,
    wherein each pixel electrode of the plurality of pixel electrodes includes a light reflective metal thin film.

6. An organic electroluminescent display device, comprising:
    an organic electroluminescent display panel including:
        a substrate,
        an interlayer insulation layer formed over the substrate, and
        an organic electroluminescent light emitting section formed over the interlayer insulation layer, wherein the organic electroluminescent light emitting section includes:
            a plurality of pixel electrodes arranged in a matrix pattern over the interlayer insulation layer,
            a plurality of partition walls, wherein
                each partition wall of the plurality of partition walls is disposed between corresponding pixel electrodes of the plurality of pixel electrodes,
                the corresponding pixel electrodes are adjacent to each other in a row direction, and
                each partition wall of the plurality of partition walls extends in a column direction,
            an organic layer including a light emitting layer formed in a region partitioned by the plurality of partition walls,
            a counter electrode formed on an upper side of the organic layer,
            a first light emitting section having a light emitting layer that emits light in a first color, and
            a second light emitting section having a light emitting layer that emits light in a second color different from the first color, wherein the first light emitting section and the second light emitting section are different in thickness of the organic layer, the first light emitting section and the second light emitting section are different in digging amount of the interlayer insulation layer in the region partitioned by the plurality of partition walls, and one of the first light emitting section or the second light emitting section which is longer in a wavelength of light emission color is greater than the other light emitting section in the digging amount of the interlayer insulation layer; and a driving section configured to drive the organic electroluminescent display panel to display an image.

7. An electronic apparatus comprising, as an image display section:

an organic electroluminescent display device including:

an organic electroluminescent display panel that includes:

a substrate, an interlayer insulation layer formed over the substrate, and an organic electroluminescent light emitting section formed over the interlayer insulation layer, wherein the organic electroluminescent light emitting section includes:

a plurality of pixel electrodes arranged in a matrix pattern over the interlayer insulation layer, a plurality of partition walls, wherein each partition wall of the plurality of partition walls is disposed between corresponding pixel electrodes of the plurality of pixel electrodes, the corresponding pixel electrodes are adjacent to each other in a row direction, and each partition wall of the plurality of partition walls extends in a column direction, an organic layer including a light emitting layer formed in a region partitioned by the plurality of partition walls, a counter electrode formed on an upper side of the organic layer, a first light emitting section having a light emitting layer that emits light in a first color, and a second light emitting section having a light emitting layer that emits light in a second color different from the first color, wherein the first light emitting section and the second light emitting section are different in thickness of the organic layer, the first light emitting section and the second light emitting section are different in digging amount of the interlayer insulation layer in the region partitioned by the plurality of partition walls, and one of the first light emitting section or the second light emitting section which is longer in a wavelength of light emission color is greater than the other light emitting section in the digging amount of the interlayer insulation layer; and a driving section configured to drive the organic electroluminescent display panel to display an image.

* * * * *